US012243920B2

(12) United States Patent
Gardner et al.

(10) Patent No.: US 12,243,920 B2
(45) Date of Patent: Mar. 4, 2025

(54) METHOD TO FORM SELECTIVE HIGH-K DEPOSITION ON 2D MATERIALS

(71) Applicant: Tokyo Electron Limited, Tokyo (JP)

(72) Inventors: Mark I. Gardner, Albany, NY (US); H. Jim Fulford, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 400 days.

(21) Appl. No.: 17/574,533

(22) Filed: Jan. 12, 2022

(65) Prior Publication Data

US 2023/0223449 A1 Jul. 13, 2023

(51) Int. Cl.
*H01L 29/40* (2006.01)
*H01L 29/06* (2006.01)
*H01L 29/786* (2006.01)

(52) U.S. Cl.
CPC ........ *H01L 29/408* (2013.01); *H01L 29/0649* (2013.01); *H01L 29/78618* (2013.01)

(58) Field of Classification Search
CPC ............... H01L 29/408; H01L 29/0649; H01L 29/78618; H01L 29/42356; H01L 29/66439; H01L 29/775; H01L 29/1606; H01L 29/24; H01L 29/778; H01L 29/42392; H01L 27/1203; H01L 29/78681; H01L 29/0673; H01L 29/66045; H01L 29/66969; H01L 29/42346; H01L 29/1033; H01L 29/42364; H01L 29/66469; B82Y 10/00
See application file for complete search history.

(56) References Cited

U.S. PATENT DOCUMENTS

| | | | |
|---|---|---|---|
| 7,732,859 B2 * | 6/2010 | Anderson | H01L 29/1606 257/E29.264 |
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 2010/0051897 A1 * | 3/2010 | Chen | H01L 29/78684 438/105 |
| 2013/0146847 A1 * | 6/2013 | Adkisson | B82Y 30/00 257/29 |
| 2021/0305372 A1 * | 9/2021 | Khaderbad | H01L 29/66795 |

OTHER PUBLICATIONS

Nano Letters vol. 14, Issue 12 Dec. 10, 2014 pp. 6749-7220: Metal Seed Layer Thickness-Induced Transition From Vertical to Horizontal Growth of MoS2 and WS2. Jung et al (Year: 2014).*

* cited by examiner

*Primary Examiner* — Britt D Hanley
*Assistant Examiner* — William C. Trice, III
(74) *Attorney, Agent, or Firm* — Foley & Lardner LLP

(57) ABSTRACT

The disclosed technology generally relates to a process of forming transistors with high-k dielectric layers, such as selectively high-k dielectric layers. The high-k dielectric layers, which may be used as the gate dielectric, may be selectively grown from two-dimensional semiconductor materials. The process may be adapted for various transistor structures such as planar transistors, three-dimensional transistors, and gate-all-around transistors. Further, the process may also be used to create stacked transistors. In one aspect, a method for manufacturing a semiconductor device includes forming a seed structure over a base layer, forming a two-dimensional (2D) semiconductor layer disposed on the seed structure, and selectively growing a high-k dielectric layer over the 2D semiconductor layer.

17 Claims, 61 Drawing Sheets

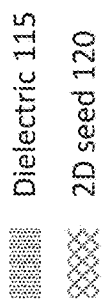
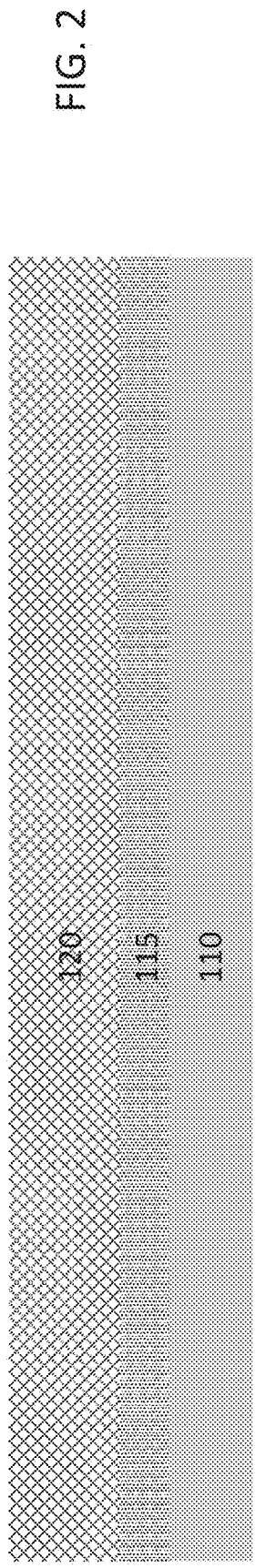
FIG. 2

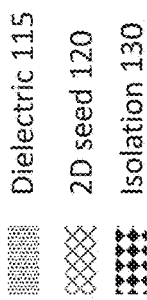
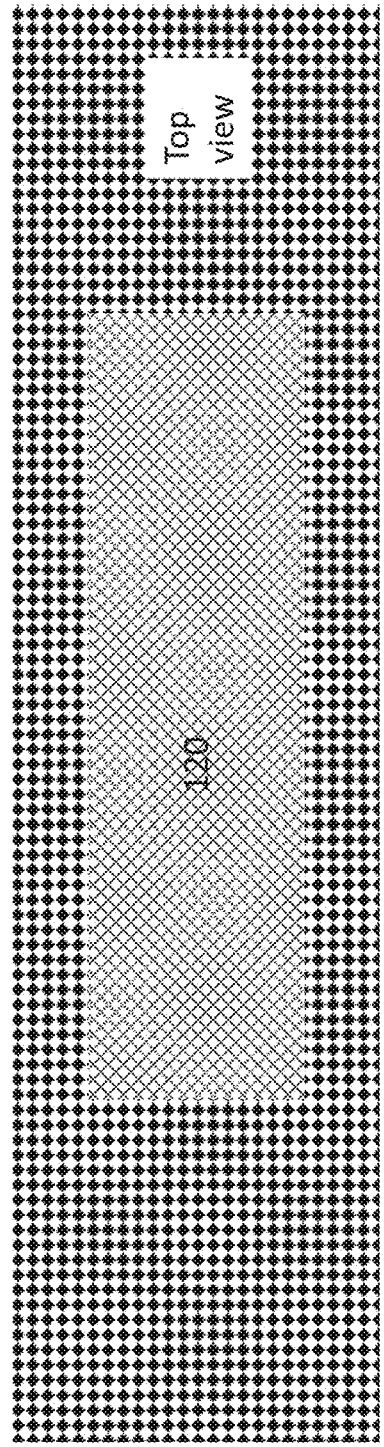
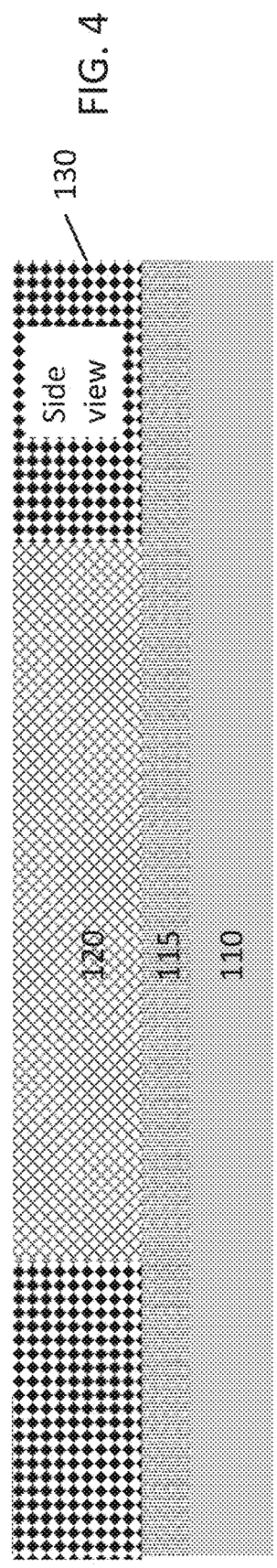
FIG. 4

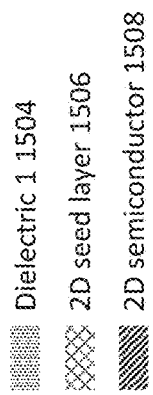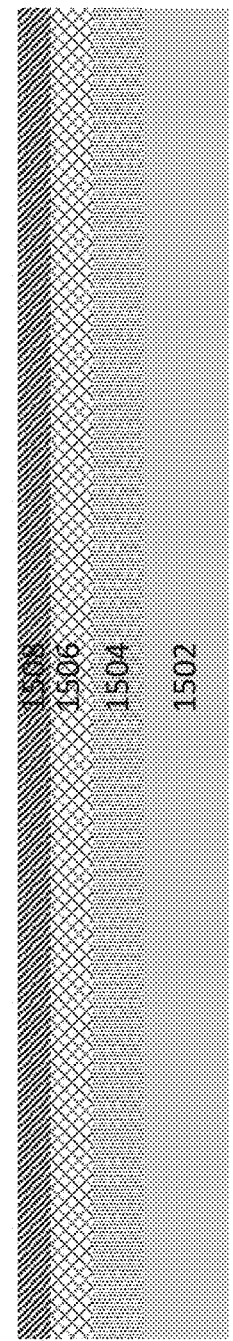
FIG. 15

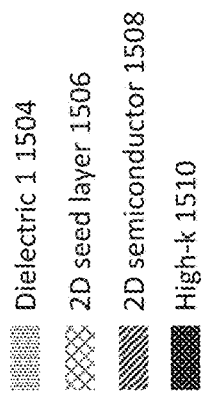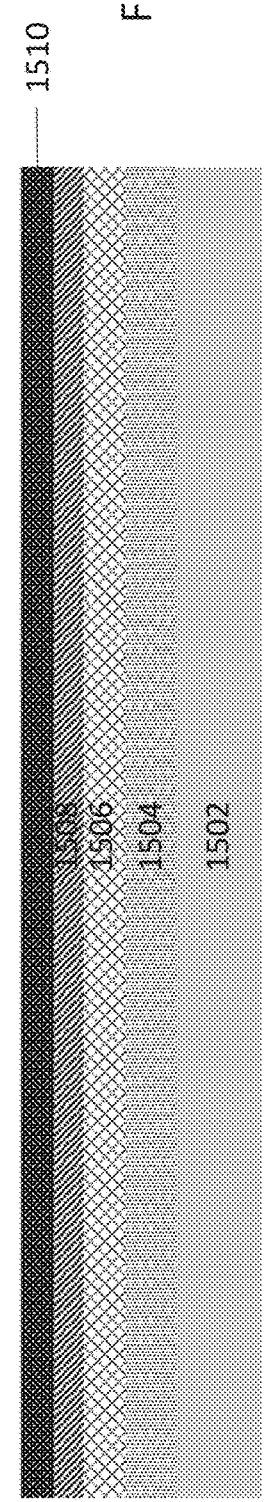
FIG. 16

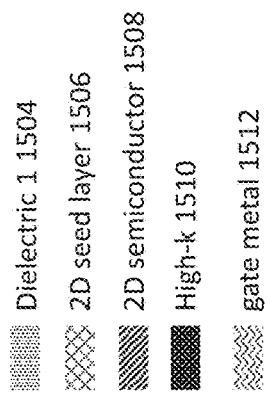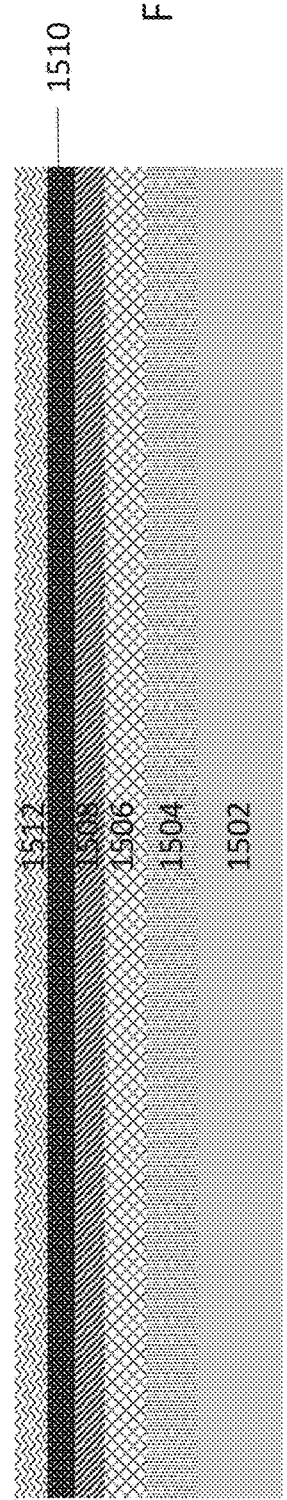
FIG. 17

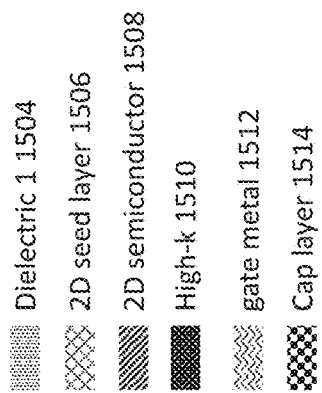
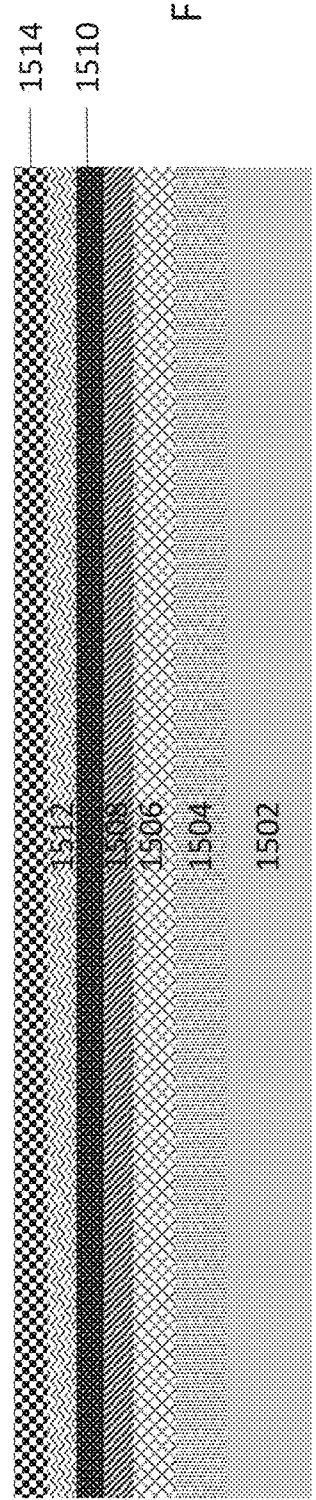
FIG. 18

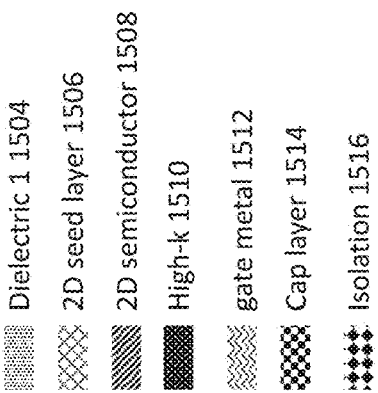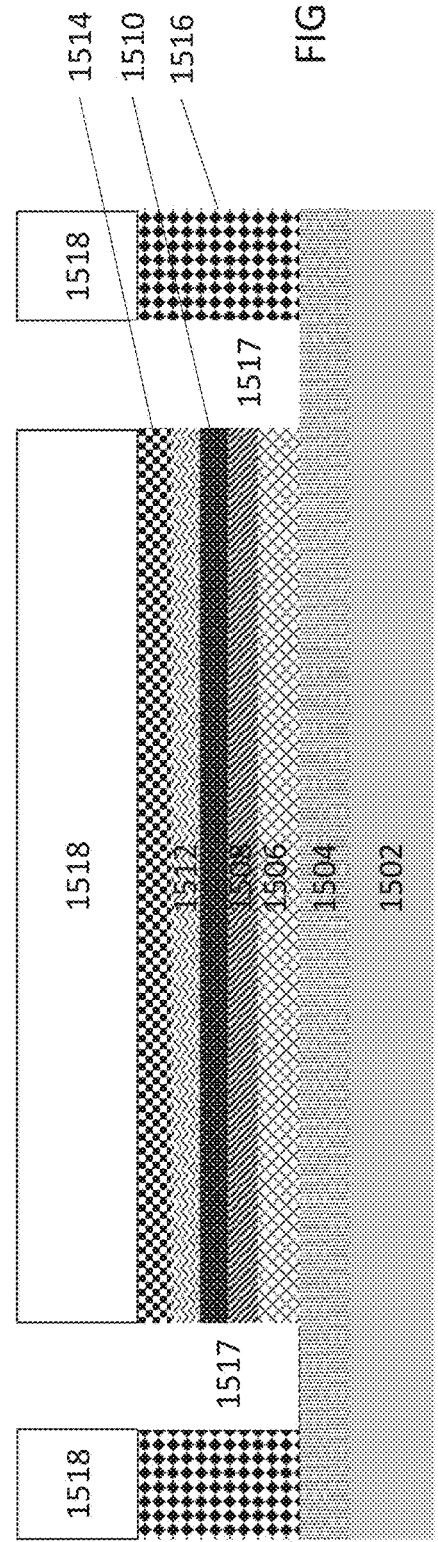
FIG. 20

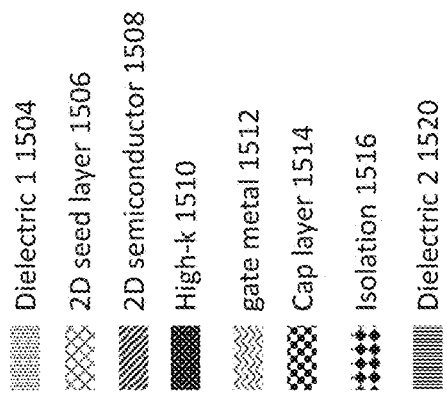
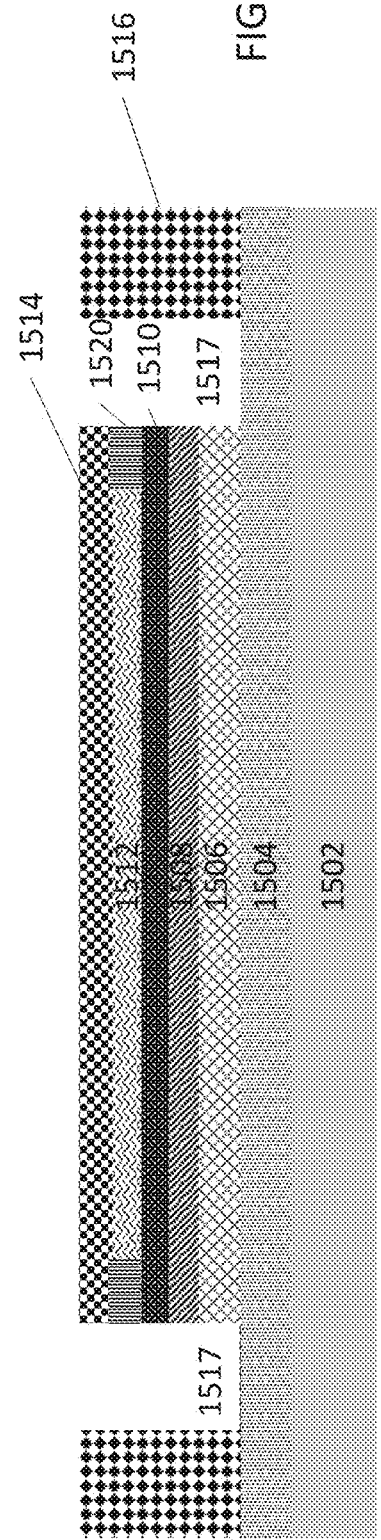
FIG. 21

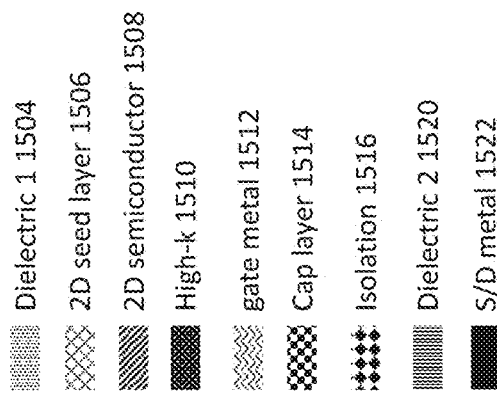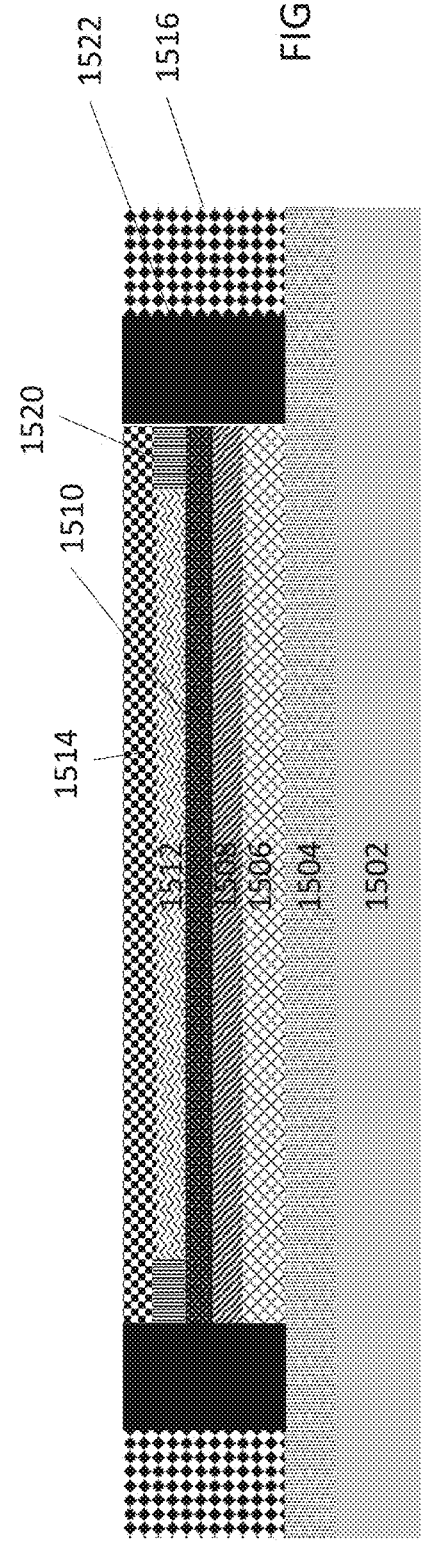
FIG. 22

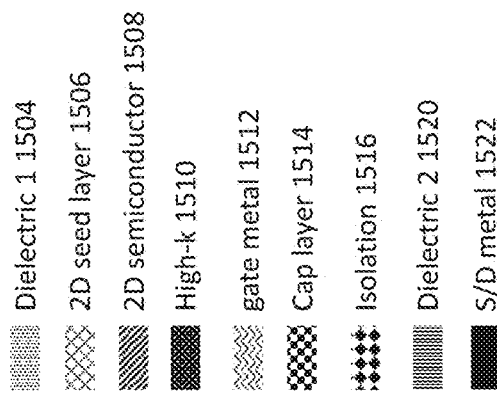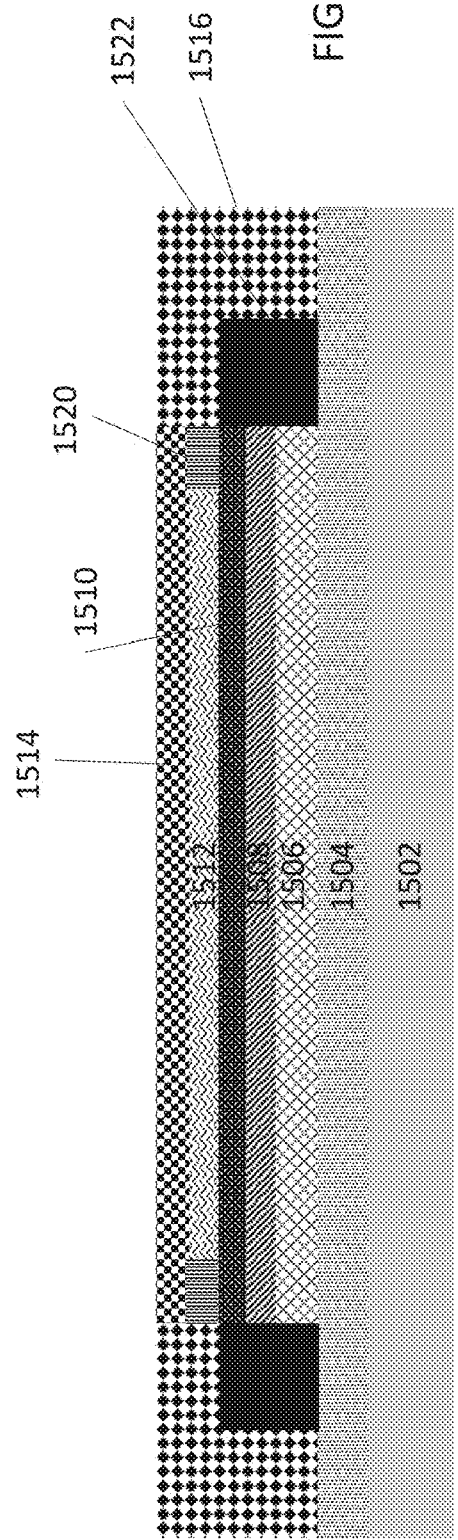
FIG. 23

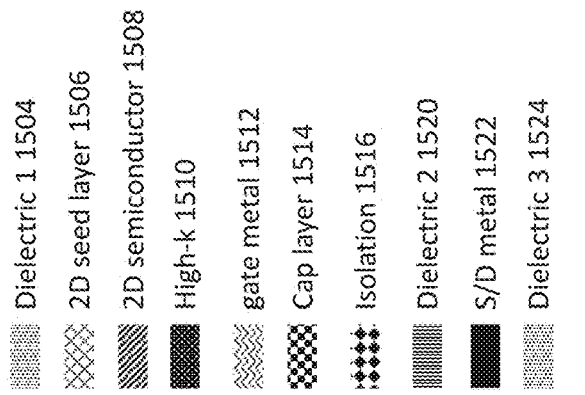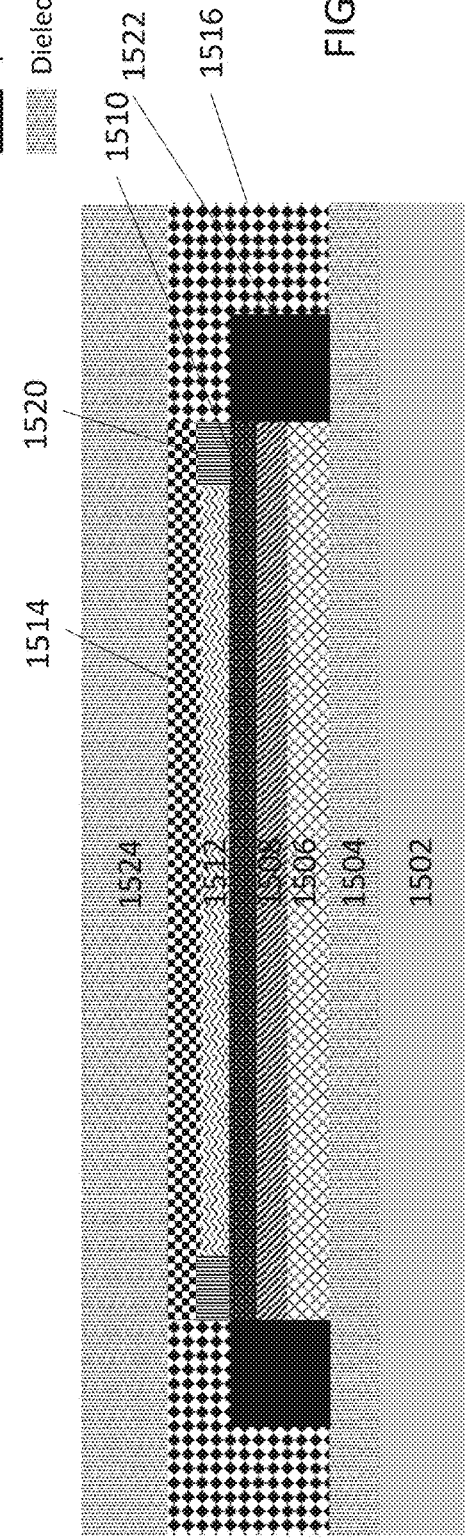
FIG. 24

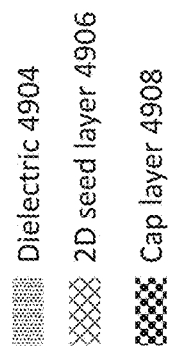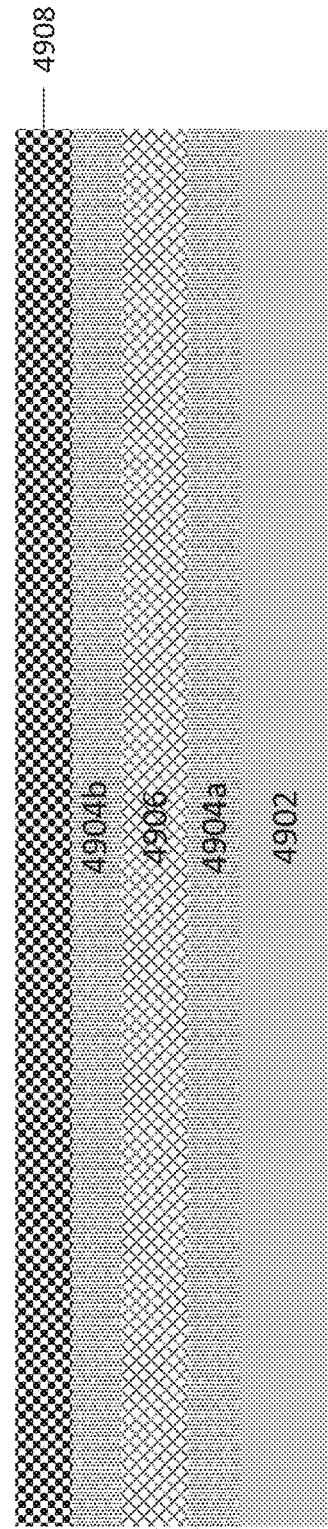
FIG. 49

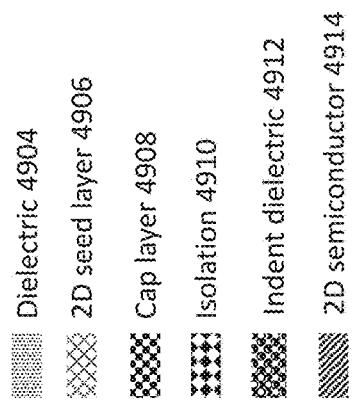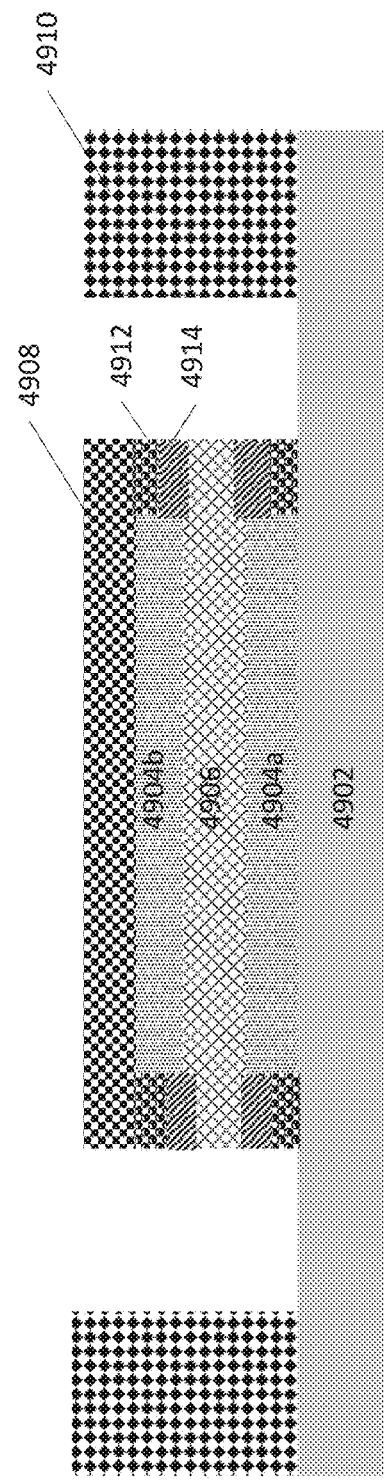
FIG. 53

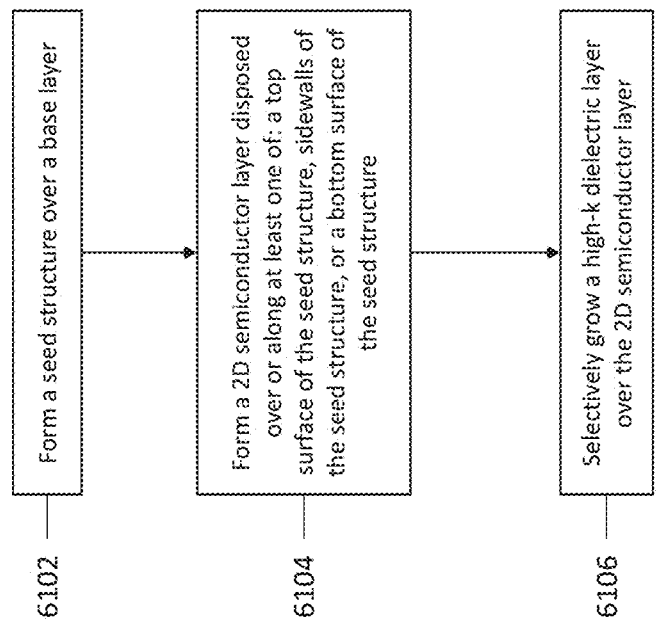

METHOD TO FORM SELECTIVE HIGH-K DEPOSITION ON 2D MATERIALS

TECHNICAL FIELD

The present invention relates generally to the field of manufacturing semiconductor devices.

BACKGROUND

In the manufacture of semiconductor devices, various fabrication processes are executed, such as film-forming depositions, etch mask creation, patterning, material etching and removal, and doping treatments. These processes may be performed to form semiconductor device components on a substrate. Some example fabrication techniques allow the manufacture of transistors on a single active device plane, while wiring or metallization is formed above the active device plane. Such devices are accordingly characterized as two-dimensional (2D) circuits, manufactured using 2D fabrication techniques. Although scaling efforts have greatly increased the number of transistors per unit area in 2D circuits, these 2D fabrication techniques are approaching physical atomic limitations with single digit nanometer semiconductor device fabrication nodes.

SUMMARY

As technology continues to advance and transistor features of planar devices approach theoretical limits, there is a growing desire to find new structures, materials, and/or processes that advance Moore's Law without compromising various aspects. An area of growing interest is using nanosheets with materials that are no thicker than several hundreds of nanometers down to 2D semiconductors having thicknesses one atomic layer. As one might expect, fabricating semiconductor devices, such as transistors and memories, using these types of materials pose great challenges for manufacturers. Accordingly, there is a desire to find different materials and structures that can be fabricated using reliable processes.

In the present disclosure, processes and structures for 2D semiconductor devices (e.g., transistors) to form (e.g., selectively grow or blanket deposit) high-k dielectric layers are disclosed. For example, a high-k gate dielectric on 2D materials with horizontal nanosheets are disclosed. Various embodiments utilize gate dielectrics (e.g., $HfO_2$, $ZrO_2$) that are selectively grown on 2D channel regions. Further, various transistor structures such as planar transistors, 3-dimensional (3D) transistors, and gate-all-around (GAA) transistors may be formed using this selective high-k growth process. Furthermore, the transistors (or other devices) may be stacked on top of one another using gate electrode stubs. Accordingly, the 2D semiconductor materials may be used to grow high-k gate dielectric layers.

In one embodiment, a method for manufacturing a semiconductor device can include forming a seed structure on a base layer, forming a two-dimensional (2D) semiconductor layer disposed on the seed structure, and forming a high-k dielectric layer on the 2D semiconductor layer. Forming the high-k dielectric layer may include selectively growing or applying a blanket film and then etching the high-k from surfaces on which the high-k dielectric layer is not needed.

The method may further includes forming source/drain metal structures extending along two of the sidewalls of the seed structure, respectively. The 2D semiconductor layer may be formed on the top surface of the seed structure and a top surface of each of the source/drain metal structures with the 2D semiconductor layer. The method may further include forming the high-k dielectric layer on the top surface of the seed structure and the top surface of each of the source/drain metal structures. The method may further include forming a gate structure on the high-k dielectric layer, wherein the gate structure extends to be at least partially above the source/drain metal structures.

The method may further include forming source/drain metal structures extending along two of the sidewalls of the seed structure, respectively, along two sidewalls of the 2D semiconductor layer, respectively, and along two sidewalls of the high-k dielectric layer, respectively. The method may further include forming a gate structure on the high-k dielectric layer, wherein the gate structure partially covers the high-k dielectric layer over the 2D semiconductor layer.

The step of forming a 2D semiconductor layer may further comprise: forming a first 2D semiconductor material on the top surface and the sidewalls of the seed structure and removing a portion of the first 2D semiconductor material on the top surface of the seed structure. The method may further include forming source/drain metal structures extending along two of the sidewalls of the seed structure, respectively, wherein the first 2D semiconductor material has a respective portion interposed between each of the source/drain metal structures and the seed structure. The step of forming a 2D semiconductor layer may further comprise forming a second 2D semiconductor material on the top surface of the seed structure and a top surface of each of the source/drain metal structures, thereby forming the 2D semiconductor layer. The method may further include forming a gate structure on the high-k dielectric layer, wherein the gate structure partially extends above the seed structure with the 2D semiconductor layer and the high-k dielectric layer interposed therebetween.

The step of forming a 2D semiconductor layer may further comprise: forming a first 2D semiconductor material on respective end portions of the top surface and the bottom surface of the seed structure, forming a second 2D semiconductor material on two of the sidewalls of the seed structure, exposing respective middle portions of the top surface and the bottom surface of the seed structure, and forming a third 2D semiconductor material around the exposed middle portion of the top surface of the seed structure, the exposed middle portion of the bottom surface of the seed structure, and other two of the sidewalls of the seed structure, thereby forming the 2D semiconductor layer. The method may further include forming a gate structure around the 2D semiconductor layer, wherein the high-k dielectric layer is interposed therebetween.

In another embodiment, a method for manufacturing a semiconductor device can include forming a seed structure over a base layer, forming a 2D semiconductor layer disposed at least over a top surface of the seed structure, forming (e.g., selectively growing or blanket depositing) a high-k dielectric layer disposed at least over the 2D semiconductor layer, and forming a gate structure disposed at least over the high-k dielectric layer.

Forming the 2D semiconductor layer may further comprise forming the 2D semiconductor layer on the top surface of the seed structure and a top surface of each of a pair of source/drain metal structures that respectively extend along two sidewalls of the seed structure.

The method may further include forming source/drain metal structures extending along two sidewalls of the seed structure, respectively. The source/drain metal structures further extend along two sidewalls of the 2D semiconductor layer, respectively, and along two sidewalls of the high-k dielectric layer, respectively. The source/drain metal structures are spaced from the gate structure with isolation structures, respectively.

Forming a 2D semiconductor layer may further comprise: forming a first 2D semiconductor material on the top surface of the seed structure and also sidewalls of the seed structure, removing a portion of the first 2D semiconductor material on the top surface of the seed structure, and forming a second 2D semiconductor material on the top surface of the seed structure and a top surface of each of a pair of source/drain metal structures that respectively extend along two of the sidewalls of the seed structure, thereby forming the 2D semiconductor layer.

Forming a 2D semiconductor layer may further comprise forming a second 2D semiconductor material on respective end portions of the top surface and the bottom surface of the seed structure, forming a second 2D semiconductor material on two of the sidewalls of the seed structure with, exposing respective middle portions of the top surface and the bottom surface of the seed structure, and forming a third 2D semiconductor material around the exposed middle portion of the top surface of the seed structure, the exposed middle portion of the bottom surface of the seed structure, and other two of the sidewalls of the seed structure, thereby forming the 2D semiconductor layer. The gate structure may be formed around the 2D semiconductor layer, wherein the high-k dielectric layer is interposed therebetween.

In yet another embodiment, a semiconductor device may include a seed structure, a 2D semiconductor layer disposed on the seed structure, a high-k dielectric layer disposed on the 2D semiconductor layer, a source/drain metal structure extending along one of the sidewalls of the seed structure and adjacent to the 2D semiconductor layer, and a gate structure disposed on the high-k dielectric layer.

The 2D semiconductor layer may include a material selected from a group consisting of: a semiconductive-behaving oxide, a graphene, and a hexagonal boron nitride.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the invention can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of simplicity, not every component may be labeled in every drawing. In the drawings:

FIGS. 2-13 show top and/or cross-sectional views of a semiconductor device being manufactured at different stages of the process of FIG. 1, in accordance with some embodiments.

FIGS. 15-32 show top and/or cross-sectional views of a semiconductor device being manufactured at different stages of the process of FIG. 14, in accordance with some embodiments.

FIGS. 49-60 show top and/or cross-sectional views of a semiconductor device being manufactured at different stages of the process of FIG. 48, in accordance with some embodiments.

FIG. 61 illustrates a flowchart of a process for forming an example semiconductor device, in accordance with some embodiments.

DETAILED DESCRIPTION

Reference will now be made to the figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although most of the figures show various layers in a planar and/or rectangular configuration, other shapes are also contemplated, and indeed the techniques described herein may be implemented in any shape or geometry. As an example, non-continuous contact shapes such as arcs or polygonal trenches, may be adjacent to, partially surround, or fully surround a central channel in addition to or as an alternative to the ring shapes illustrated. In addition, examples in which two transistors or devices are shown stacked on top of one another are shown for illustrative purposes only, and for the purposes of simplicity. Indeed, the techniques described herein may provide for one to any number N stacked devices. Further, although the devices fabricated using these techniques are shown as transistors, it should be understood that any type of electric electronic device may be manufactured using such techniques, including but not limited to transistors, variable resistors, resistors, and capacitors.

The disclosed technology generally relates to a process of forming transistors with high-k dielectric layers, such as selectively grown or blanket deposited layers. The high-k dielectric layers, which may be used as the gate dielectric, may be selectively grown from two-dimensional semiconductor materials. The process may be adapted for various transistor structures such as planar transistors, three-dimensional transistors, and gate-all-around transistors. Further, the process may also be used to create stacked transistors.

Figure 1:
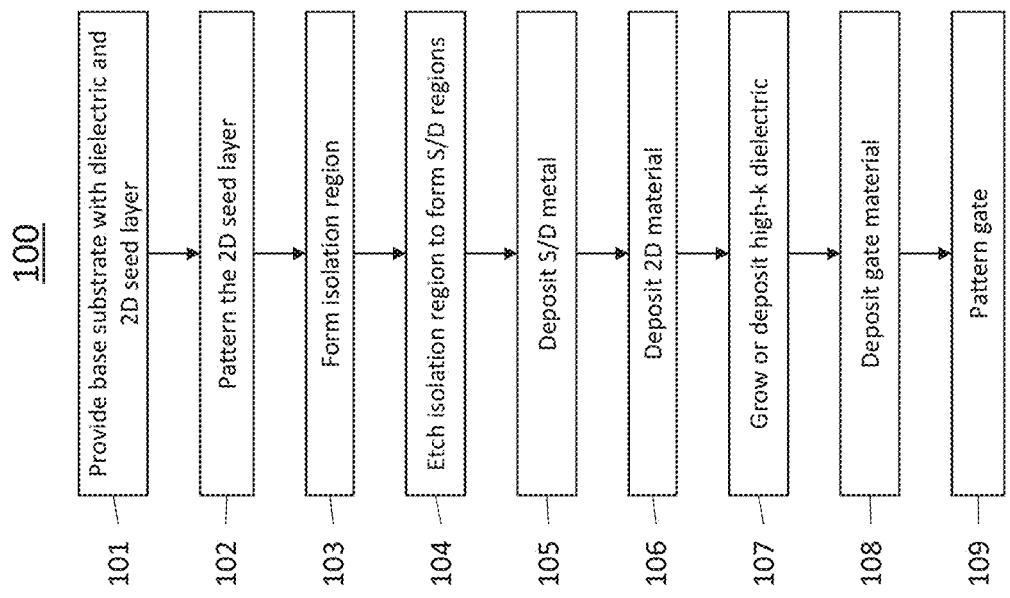
FIG. 1 illustrates a flowchart of a process for forming an example semiconductor device, in accordance with some embodiments.

FIG. 1 illustrates a flowchart of a process 100 for forming an example semiconductor device (e.g., transistor) 100, in accordance with some embodiments. It is noted that the process 100 is merely an example, and is not intended to limit the present disclosure. Accordingly, it is understood that additional operations may be provided before, during, and after the process 100 of FIG. 1, and that some other operations may only be briefly described herein. In some embodiments, operations of the process 100 may be associated with perspective and/or top views of an example semiconductor device at various fabrication stages as shown in FIGS. 2-11, respectively, which will be discussed in further detail below.

Corresponding to operation 101, FIG. 2 illustrates a resulting side view of the semiconductor device 200 after a 2D seed layer 120 is formed on a dielectric layer 115 which is formed on a base substrate 110. The base substrate 110 may be a dielectric substrate (e.g., silicon nitride). The base substrate 110 may be a semiconductor substrate, such as a bulk semiconductor, a semiconductor-on-insulator (SOI) substrate, or the like, which may be doped (e.g., with a p-type or an n-type dopant) or undoped. The base substrate 110 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, power rails may be formed on an opposing side of the base substrate 110.

A dielectric layer 115 may be formed on the base substrate 110. The dielectric layer 115 may be any type of dielectric material that is capable of being disposed, patterned, or otherwise provided on top of the base layer 115. Some examples of dielectric materials can include, but are not limited to, $SiO_2$ or $SiO_xN_y$, other oxide materials, SiN, and others. In some embodiments, the dielectric layer 115 may include isolation regions that are separated from one another (not shown).

In various embodiments, the dielectric layer 115 may be deposited on the substrate 110. For example, the dielectric layer 115 may be grown by a molecular beam epitaxy (MBE) process, a chemical vapor deposition (CVD) process such as a metal organic CVD (MOCVD) process, a furnace CVD process, and/or other suitable deposition processes. In other embodiments, the dielectric layer 115 may be grown using an atomic layer deposition (ALD) process. The dielectric layer 115 may insulate the substrate 110 from devices formed thereupon. Thus, active or passive devices may be formed in substrate 110 with additional devices formed above dielectric layer 115.

A 2D seed layer 120 may be deposited on the dielectric layer 120. The 2D seed layer 120 may include a material that may provide the ability to grow 2D material (e.g., 2D semiconductor or dielectric material) above the 2D seed layer 120. The 2D seed layer 120 may include $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, and other similar materials. In some embodiments, the 2D seed layer 120 may include a stack of 2D seed layers.

Figure 3:
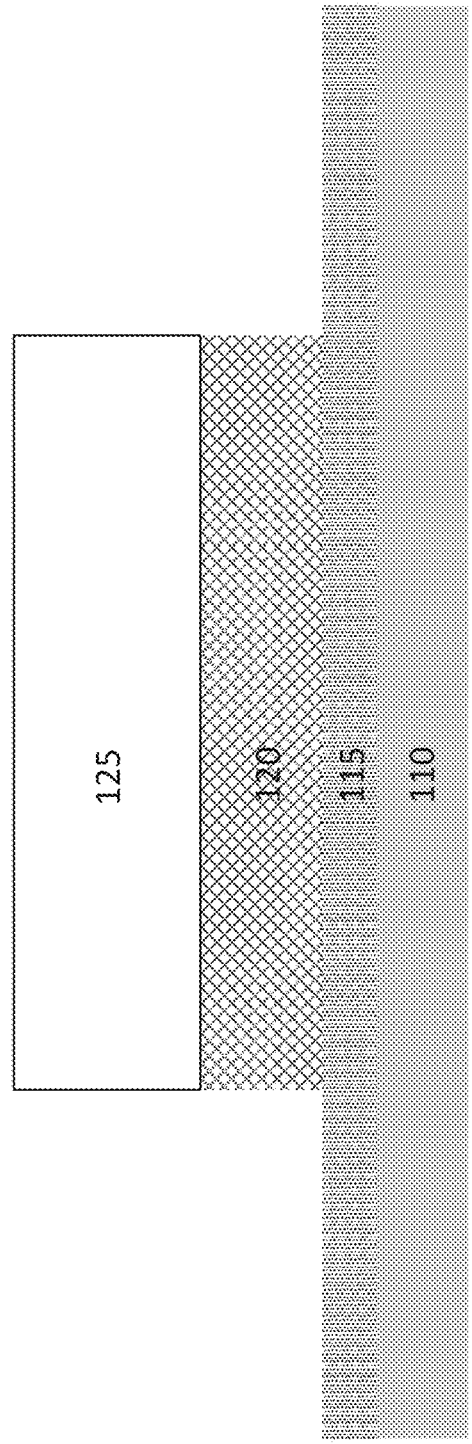

Corresponding to operation 102, FIG. 3 illustrates a resulting side view of the semiconductor device 200 after the 2D seed layer 120 is patterned and etched using a mask layer 125. In some embodiments, the mask layer 125 may include a photoresist (e.g., a positive photoresist or a negative photoresist), for example, a single layer or multiple layers of the same photoresist or different photoresists. In other embodiments, the mask layer 125 may include a hard mask layer, for example, a polysilicon mask layer, a metallic mask layer, or any other suitable mask layer. The mask layer 125 is patterned to etch portions of the mask layer 125 at axial ends of the mask layer 125 in the first direction (e.g., the X-direction), so as to reduce its axial width. The mask layer 125 may be patterned using photolithography techniques. Generally, photolithography techniques utilize a photoresist material that forms the mask layer 125 and that is deposited, irradiated (exposed), and developed to remove a portion of the photoresist material, in this instance, end portions of the mask layer 125. The remaining mask layer 125 protects the underlying material, such as the 2D seed layer 120 below the patterned mask layer 125, from subsequent processing steps, such as etching. In some embodiments, etching may be an anisotropic etch (e.g., a reactive ion etch (RIE), neutral beam etch (NBE), deep reactive ion etch (DRIE), and the like, or combinations thereof) which selectively etches the exposed portions of layers in the Z-direction.

Using photolithography steps as described above, a channel region may be defined. For example, a width and a length of the channel region that is formed for the semiconductor device 200 may be defined. Upon etching of the 2D seed layer 120, a top surface of the dielectric layer 115 may be exposed as shown in FIG. 3.

Corresponding to operation 103, FIG. 4 illustrates resulting top and side view of the semiconductor device 200 after forming an isolation region 130. As shown, the isolation region 130 may be formed to laterally surround the patterned 2D seed layer 120. The isolation region 130 may be formed by depositing isolation materials (e.g., SiO, $SiO_2$ or $SiO_xN_y$). After the isolation material is deposited, a top portion of the isolation region 130 and/or the 2D seed layer 120 may be polished by using, e.g., chemical-mechanical polishing (CMP) to flatten a top surface of the semiconductor device 115. The isolation region 130 may separate the semiconductor device 200 from other electronic components (e.g., other transistors, capacitors, resistors, inductors, etc.). Although not shown, a top portion of the 2D seed layer 120 may also be removed during the CMP process.

Figure 5:
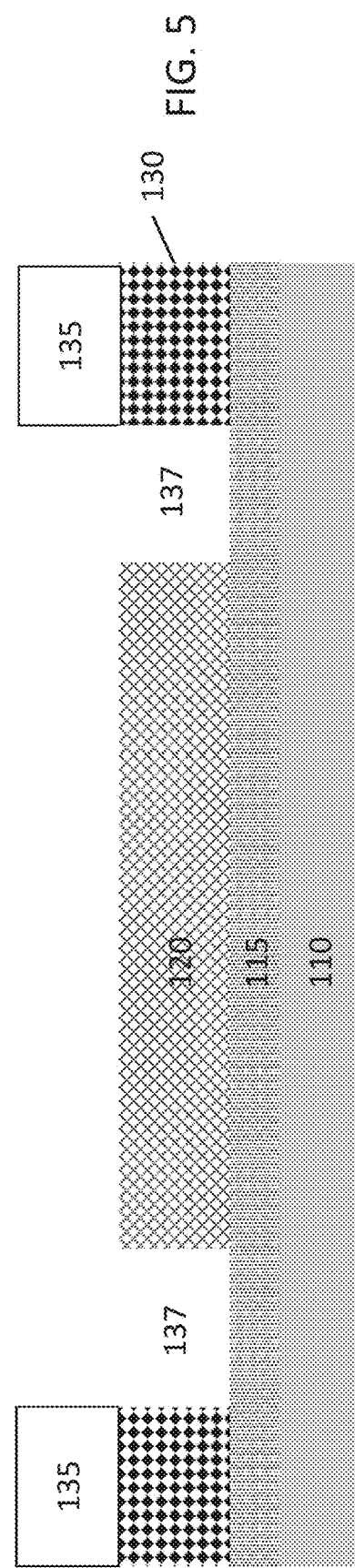

Corresponding to operation 104, FIG. 5 illustrates a resulting side view of the semiconductor device 200 after forming trenches 137 for the source/drain (S/D) regions using mask layer 135. The mask layer 135 may include a photoresist and partially cover the isolation region 130 such that areas where the trenches 137 will be formed are exposed. Further, a top surface of the 2D seed layer 120 may be exposed. Then a photolithography operation may be performed using the mask layer 135 as discussed above with respect to the mask layer 125 such that portions of the isolation region 130 that was in the trenches 137 may be etched. Accordingly, S/D regions may be defined to be formed between the isolation regions 130 and the 2D seed layer 120 on sidewalls of the source and drain, and the dielectric layer 115 contacting a top surface of the exposed dielectric layer 115.

Figure 6:
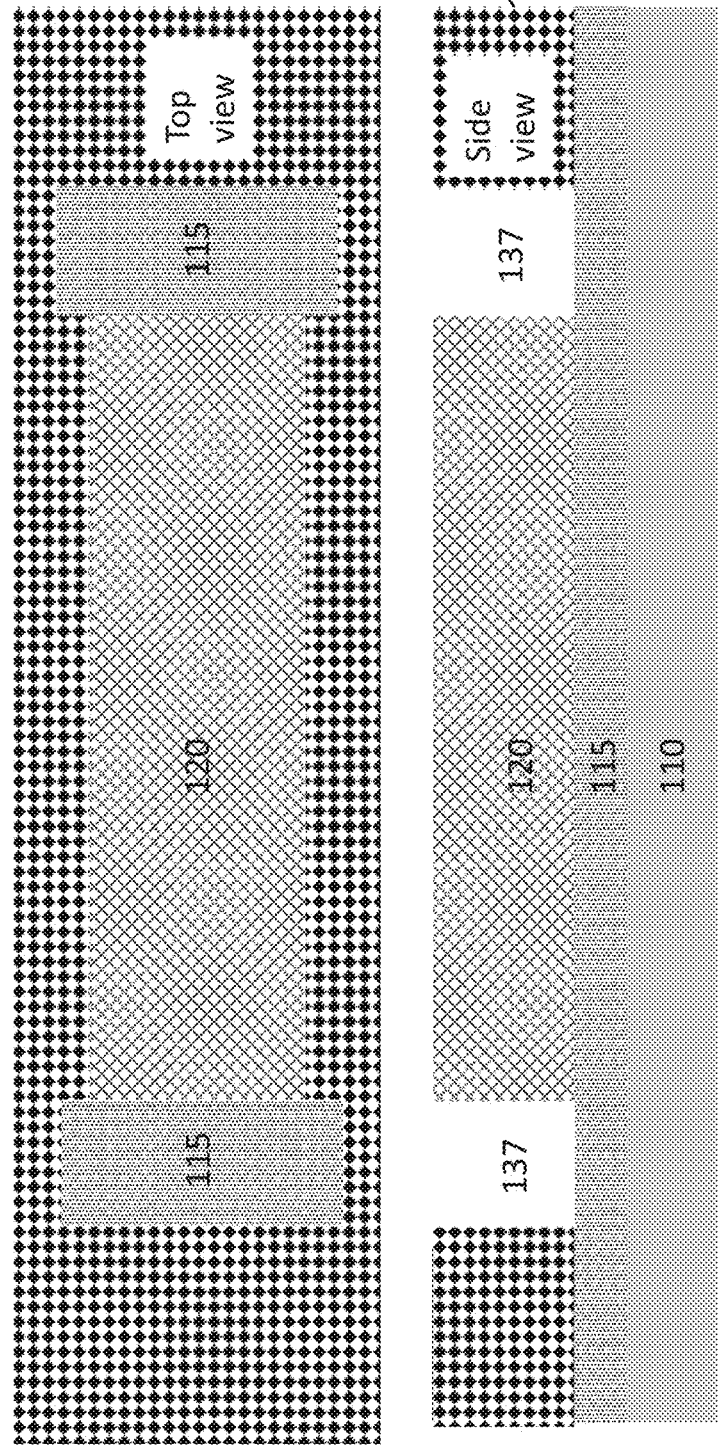

FIG. 6 illustrates top and side views of the semiconductor device 200 after the completion of operation 104. As shown in the top view, portions of a top surface of the dielectric layer 115 may be exposed by the trenches 137, which define S/D regions for the semiconductor device 200, respectively.

Figure 7:
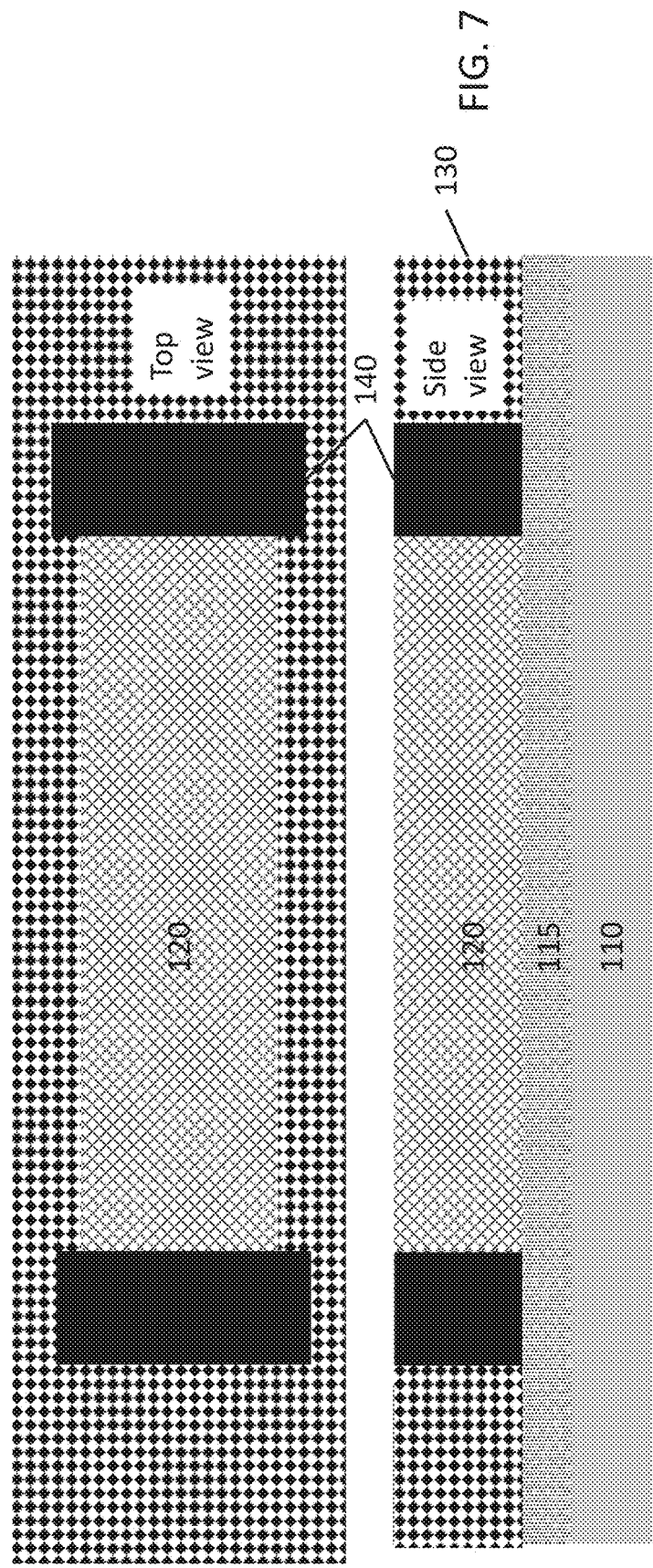

Corresponding to operation 105, FIG. 7 illustrates resulting top and side views of the semiconductor device 200 after forming an S/D metal structures 140 in the trenches 137 (of FIGS. 5-6). The S/D metal structures 140 may be any type of conductive metal suitable to form a source or drain electrode in the semiconductor device 200, including copper, gold, silver, platinum, nickel, tungsten, ruthenium, or other types of conductive metals or alloys. The deposition or addition of the S/D metal structures 140 may be performed using any type of material deposition technique, including but not limited to ALD, CVD, physical vapor deposition (PVD), evaporation, electrodeposition, and sputtering. After the depositing the S/D metal structures 140, a top portion of the resulting structure may be polished using, e.g., CMP. Accordingly, a top view of the semiconductor device 200 may expose the 2D seed layer 120 and the S/D metal structures 140 on opposing ends of the 2D seed layer 120.

Figure 8:
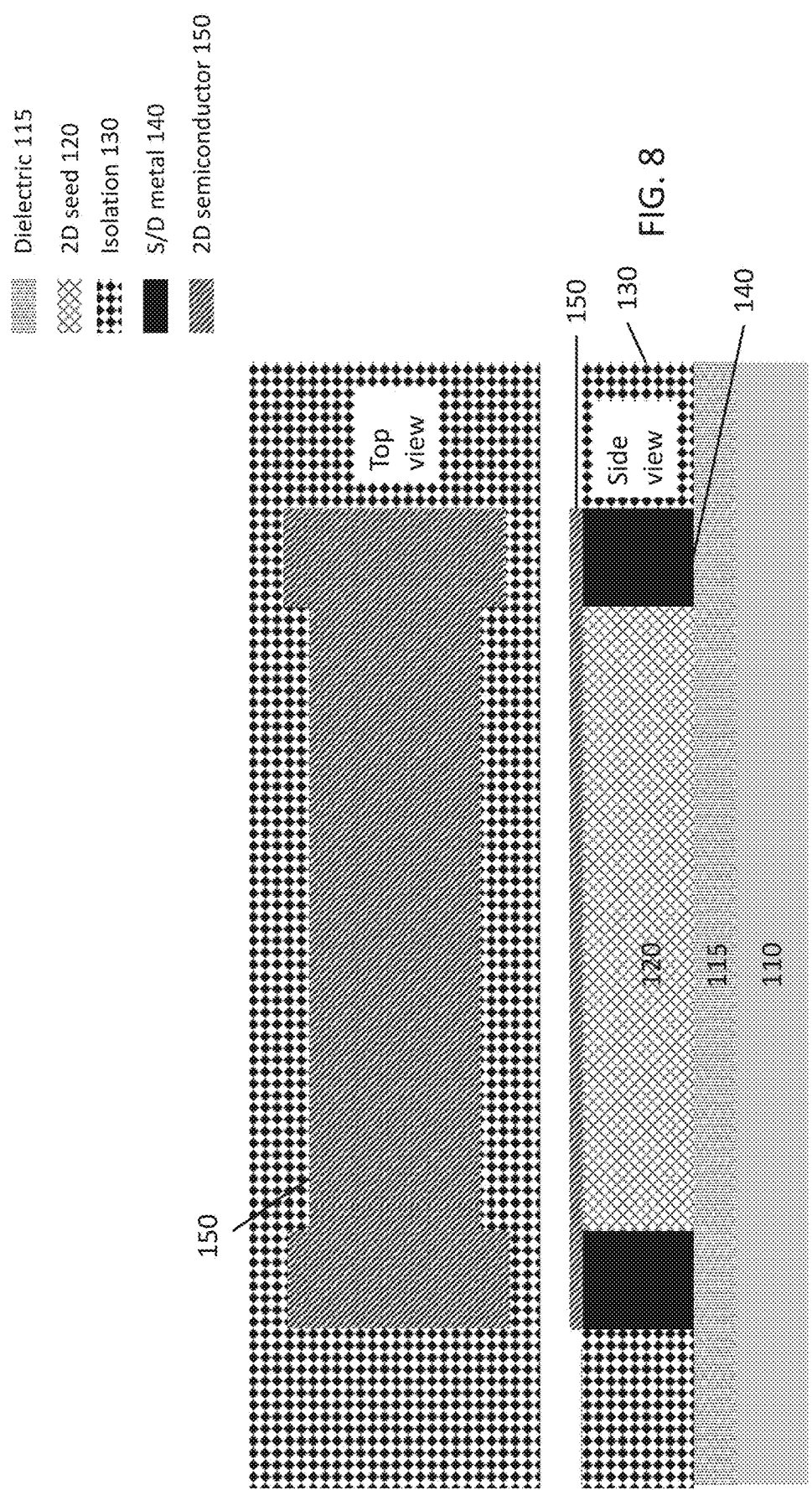

Corresponding to operation 106, FIG. 8 illustrates resulting top and side views of the semiconductor device 200 after forming a 2D semiconductor layer 150. The 2D semiconductor layer 150 may include a 2D semiconductor material and form a channel of the semiconductor device 200. Some example 2D semiconductor materials for use in forming the channel include, but are not limited to, $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, and other similar materials. The deposited 2D material may be, for example, about 5 to about 15 angstroms thick, the thinness lending to their name-2D material. The materials may be annealed during or after the device formation process to recrystallize or grow the crystals and thereby improve electrical characteristics. Additionally or alternatively, the techniques provided herein may utilize semiconductive behaving oxides (sometimes referred to herein as "conductive oxides"), which may have similar properties to semiconductor materials, to fabricate vertical 3D transistors. For example, certain materials, when combined with oxygen, may form new materials that exhibit semiconductor properties (e.g., can turn "off" with low off-state leakage current or can become highly conductive under certain circumstances). Some examples of N-type semiconductive behaving oxides include $In_2O_3$, $SnO_2$, InGaZnO, and ZnO. One example of a P-type conductive channel is SnO. For the sake of simplicity, the use of 2D semiconductor materials will be disclosed.

For the operation 106, the 2D semiconductor layer 150 may be formed by a selective deposition (e.g., selective ALD, CVD, PVD, evaporation, electrodeposition, sputtering, plasma-enhanced techniques, etc.) or through epitaxial growth using the seed material 120 and the S/D metal structures 140 as a seed. Any other known technique of performing the area-selective ALD may be performed to cover the 2D seed layer 120 and the S/D metal structures 140. Accordingly, a top view of the result of the operation 106 may show that the 2D semiconductor layer 150 is deposited on both the 2D seed layer 120 and the S/D metal structures 140. Alternatively stated, the 2D semiconductor layer 150 can inherit a footprint or profile collectively defined by the 2D seed layer 120 and the S/D metal structures 140.

Figure 9:
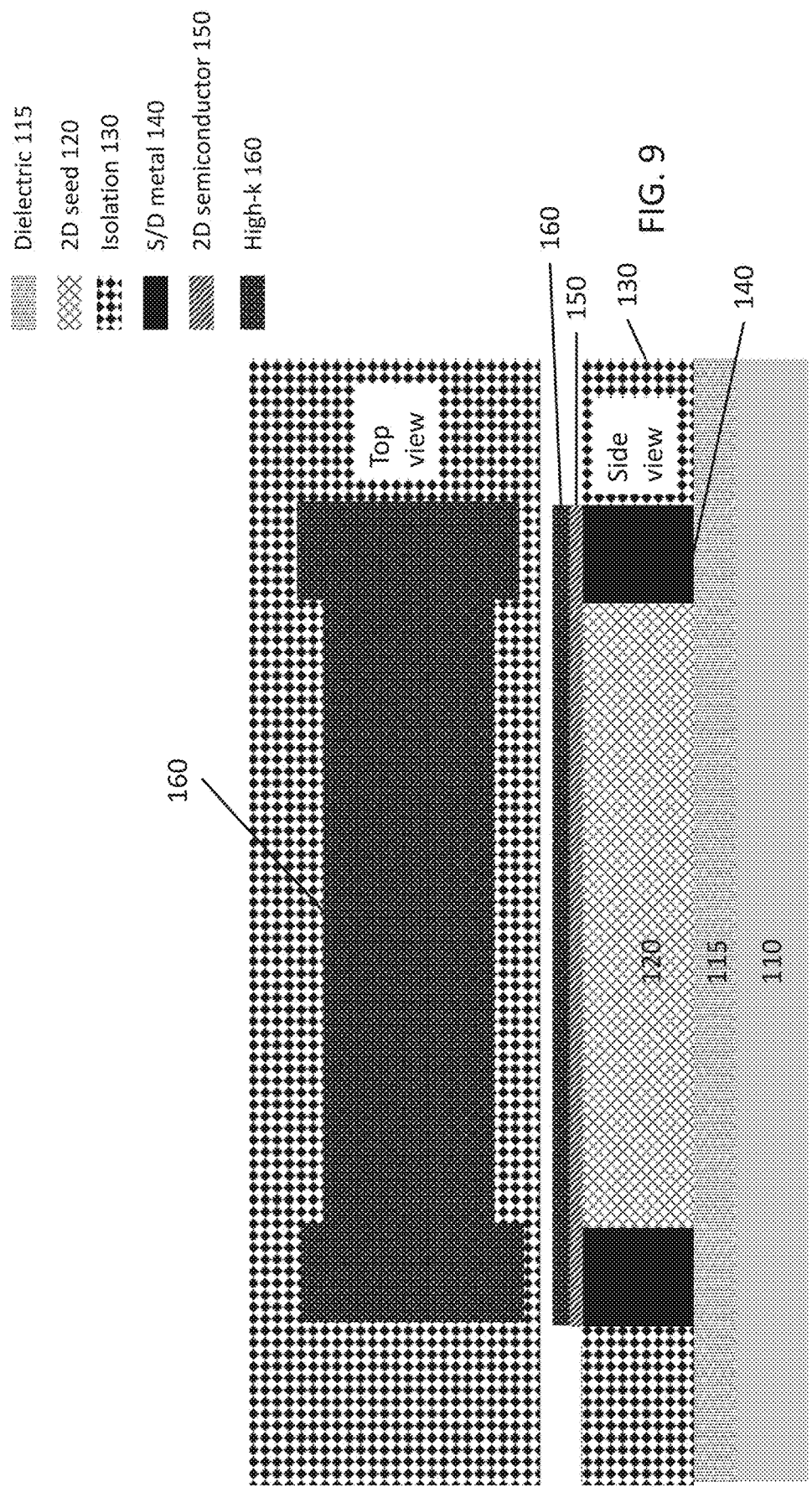

Corresponding to operation 107, FIG. 9 illustrates resulting top and side views of the semiconductor device 200 after depositing a high-k dielectric layer (or high-k dielectric material) 160. The high-k dielectric layer 160 can be any type of material that has a relatively large dielectric constant (e.g., having a dielectric constant greater than 3.9). The high-k dielectric layer 160 may be any high-k material formed on the 2D semiconductor layer 150. For example, the high-k dielectric layer 160 may include any oxide material that may be grown from the 2D semiconductor layer 150. Alternatively, the high-k material may be blanket deposited onto the 2D semiconductor layer 150 and thereafter etched from undesired surfaces. Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The high-k dielectric layer 160 may be used as a gate dielectric for the semiconductor device 200. The high-k dielectric layer 160 is further described herein as being grown, but may alternatively be blanket deposited (i.e., not selectively deposited) and thereafter etched from surfaced on which the high-k dielectric layer 160 is not desired.

The high-k dielectric 160 may be grown by thermal oxidization (e.g., annealing). For example, the semiconductor device 200 with the exposed 2D semiconductor layer 150 may be placed in a chamber and/or near a furnace and diffusing the semiconductor device 200 with a low temperature. Accordingly, the high-k dielectric layer 160 which functions as a gate dielectric for the semiconductor device 200 may be self-aligned with a channel structure of the semiconductor device 200.

Figure 10:
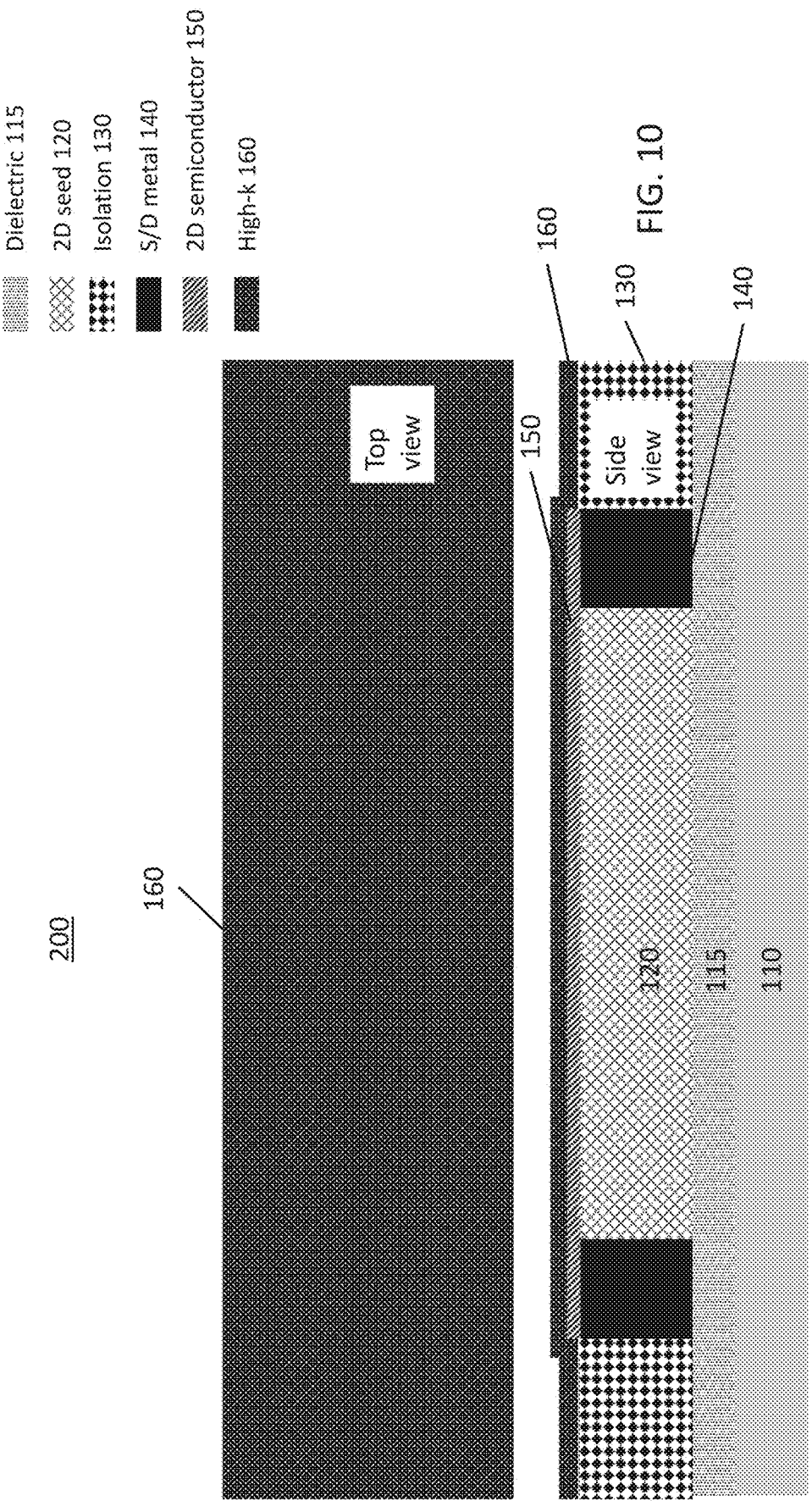

Referring to FIG. 10, in some embodiments, the high-k dielectric layer 160 may be deposited as a blanket layer on the semiconductor device 200, instead of selectively growing the high-k dielectric layer 160 as shown in FIG. 9. For example, as shown in FIG. 10, the high-k dielectric layer 160 may cover a top surface of the semiconductor device 200 including a top surface of the 2D semiconductor layer 150 and the isolation regions 130. The high-k dielectric layer 160 may be deposited as a blanket layer using any of the methods described above (e.g., ALD, CVD, PVD, evaporation, electrodeposition, sputtering, plasma-enhanced techniques, etc.). The remaining figures related to the process 100 of FIG. 1 will be described with reference to the high-k dielectric layer 160 being deposited as a blanket layer on the semiconductor device 200. However, similar descriptions may be applied to the manufacturing of the semiconductor device 200 with a selective high-k dielectric layer 160 deposited and/or grown on the 2D semiconductor layer 150.

Figure 11:
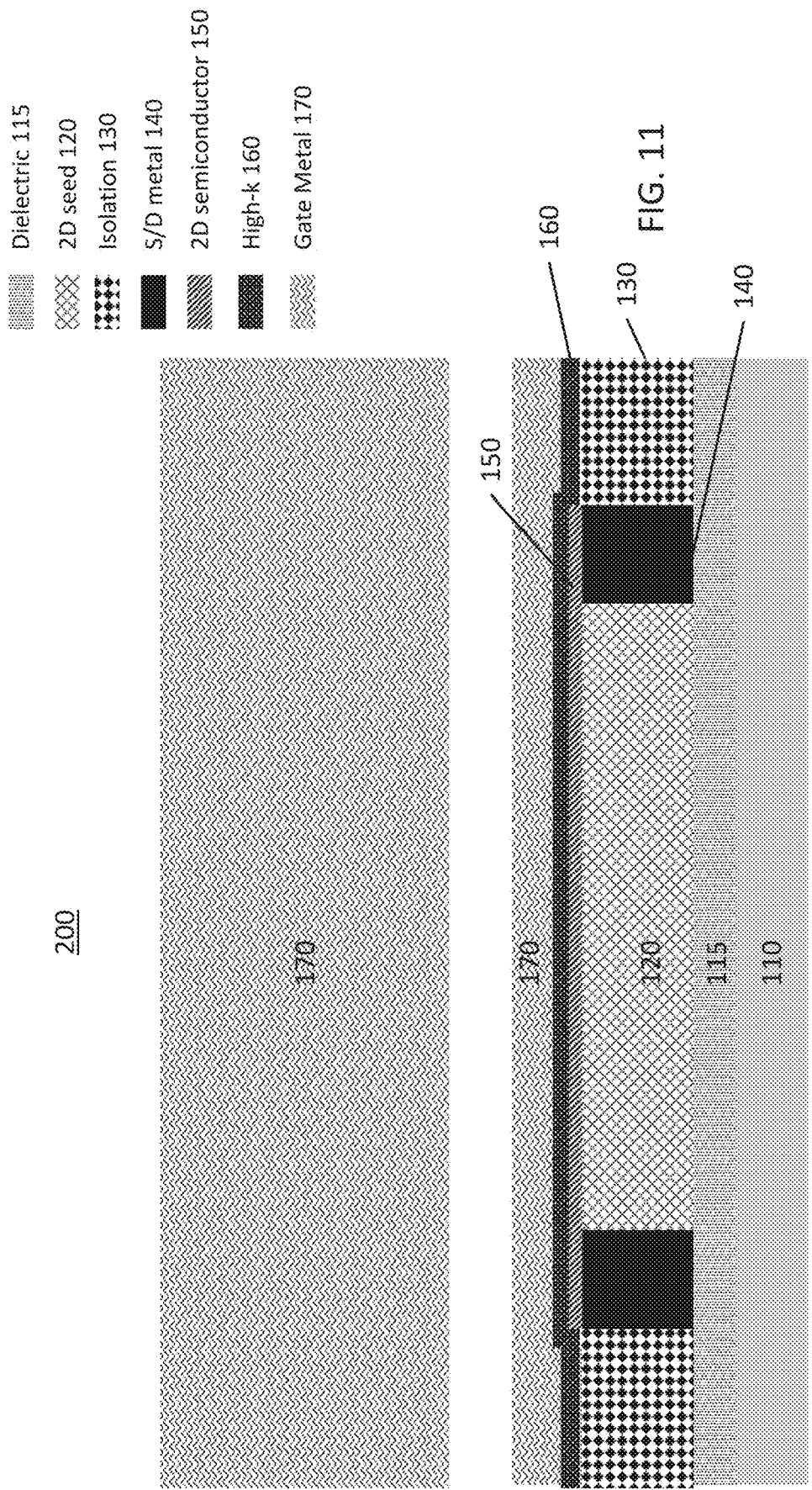

Corresponding to operation 108, FIG. 11 illustrates resulting top and side views of the semiconductor device 200 after depositing a gate metal 170. Moreover, a material for the gate metal 170 for a P-type device may be selected to be different from the gate layer of an N-type device. A non-exhaustive list of potential materials to use for the gate layer includes ruthenium (Ru), tantalum nitride (TaN), titanium nitride (TiN), and tungsten (W), tungsten nitride (WN), titanium carbide (TiC), gallium (Ga), gadolinium (Gd), titanium oxynitride (TiON), tantalum silicon nitride (TaSiN), titanium silicon nitride (TiSiN), molybdenum (Mo), aluminum (Al), copper (Cu) and combinations/stacks/alloys of these or similar materials.

Figure 12:
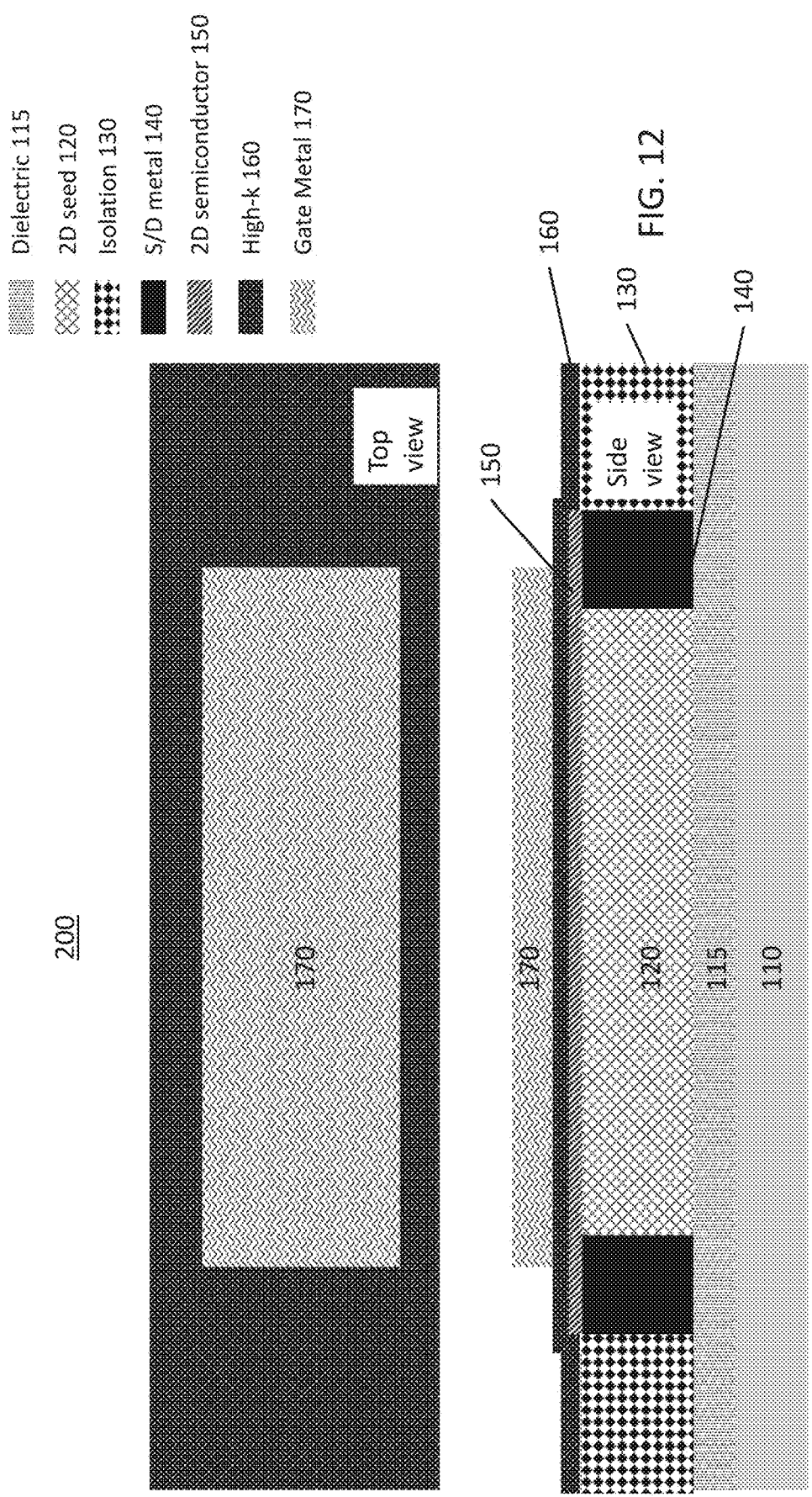

FIG. 12 illustrates resulting top and side views of the semiconductor device 200 after etching a portions of the gate metal 170. The gate metal 170 may be etched using a mask layer (not shown) as discussed above. The gate metal 170 may be etched such that the gate metal 170 has a substantially rectangular shape and is disposed on the high-k dielectric layer 160. The gate metal 170 may partially overlap the S/D regions metal 140 as shown in the side view. After the gate metal 170 is etched, a top surface of the high-k dielectric layer 160 may be exposed.

Figure 13:
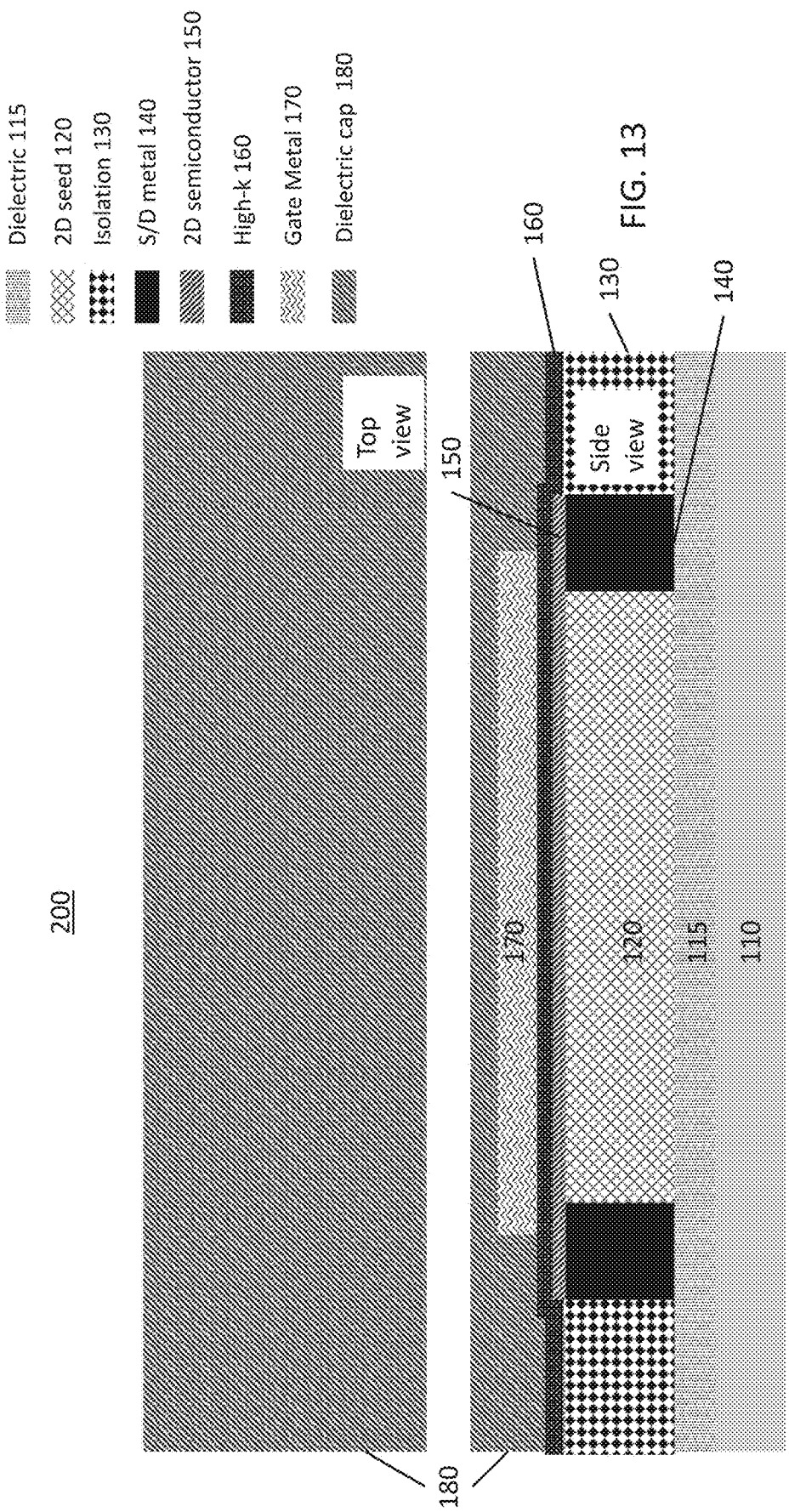

Corresponding to operation 109, FIG. 13 illustrates resulting top and side views of the semiconductor device 200 after depositing a dielectric cap layer 180. The dielectric cap layer 180 may include any of the dielectric materials discussed with respect to dielectric layer 115. After the dielectric cap layer 180 is formed, a top surface of the dielectric cap layer 180 may be polished using, e.g., CMP.

Although not shown, there may be additional steps before, during, and/or after the steps discussed with respect to FIGS. 1-13. For example, there may be interconnect structures formed that connect the gate metal 170 and/or the S/D metal structures 140 to other semiconductor devices, power rails, etc.

Accordingly, a semiconductor device 200 having a high-k gate dielectric formed on 2D semiconductor material may be selectively formed and/or grown on the 2D semiconductor layer 150.

Figure 14:
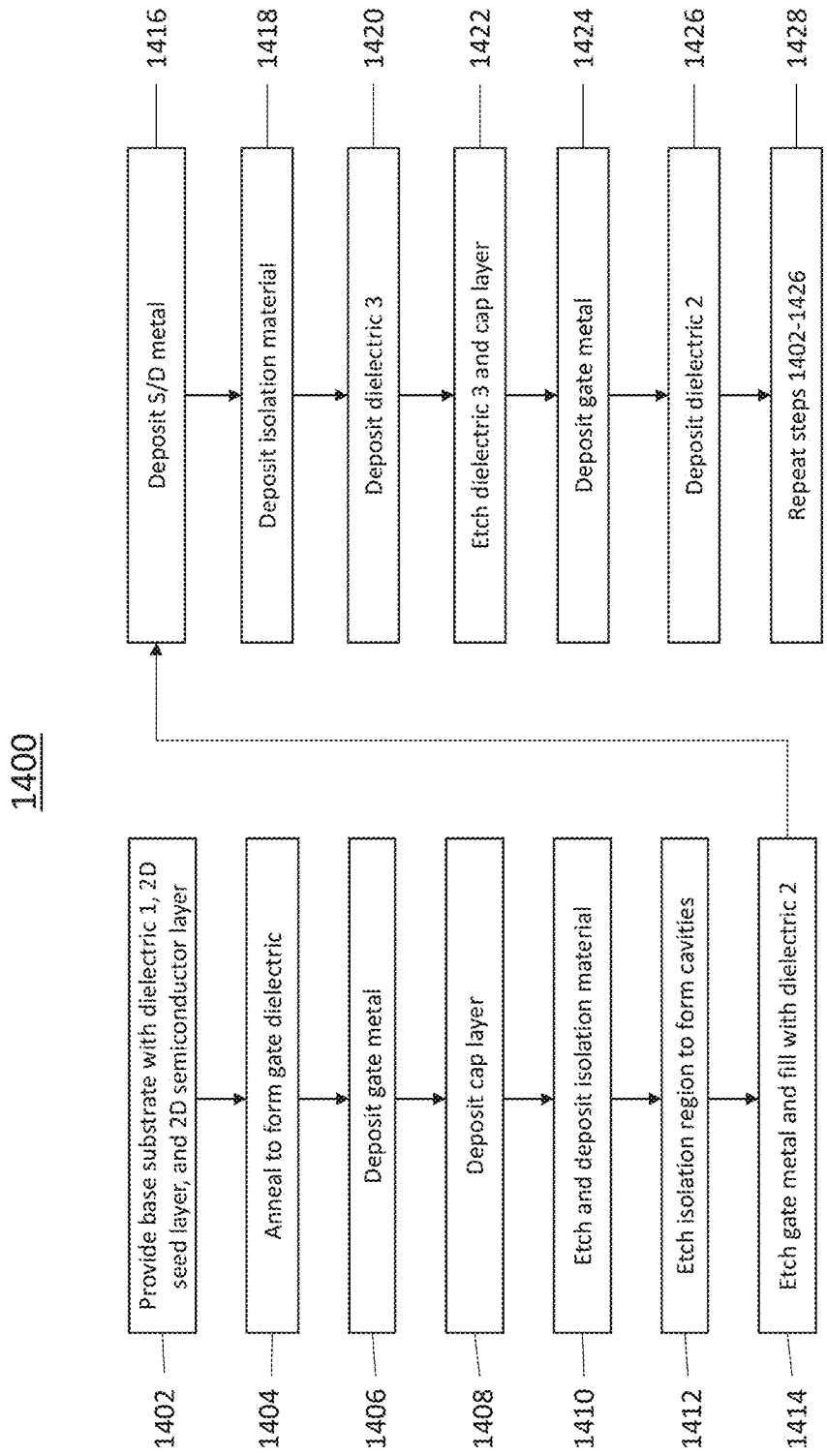
FIG. 14 illustrates a flowchart of a process for forming an example semiconductor device, in accordance with some embodiments.

FIG. 14 illustrates a flowchart of a process 1400 for forming an example semiconductor device (e.g., transistor) 1500, in accordance with some embodiments. It is noted that the process 1400 is merely an example, and is not intended to limit the present disclosure. Accordingly, it is understood that additional operations may be provided before, during, and after the process 1400 of FIG. 14, and that some other operations may only be briefly described herein. In some embodiments, operations of the process 1400 may be associated with perspective and/or top views of an example semiconductor device at various fabrication stages as shown in FIGS. 15-32, respectively, which will be discussed in further detail below.

Corresponding to operation 1402, FIG. 15 illustrates a resulting side view of the semiconductor device 1500 after a 2D semiconductor layer 1508 is formed on a 2D seed layer 1506, which is formed on a dielectric layer 1504 ("dielectric 1 1504" in the figures), which is formed on a base substrate 1502. The base substrate 1502 may be a dielectric substrate (e.g., silicon nitride). The base substrate 1502 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, power rails may be formed on an opposing side of the base substrate 1502. The dielectric layer 1504 may include one of $SiO_2$, $SiO_xN_y$, other oxide materials, SiN, and others. Both the 2D seed layer 1506 and the 2D semiconductor material may include $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, and other similar materials. The dielectric layer 1504, the seed layer 1506, and the 2D semiconductor layer 1508 may be deposited using similar methods as described with respect to semiconductor device 200 or through epitaxial growth using the seed material 2D seed layer 1506 as a seed. Alternatively stated, the 2D semiconductor layer 1508 can inherit a footprint or profile collectively defined by the 2D seed layer 1506. Accordingly, repeated descriptions are omitted for simplicity and clarity.

Corresponding to operation 1404, FIG. 16 illustrates a resulting side view of the semiconductor device 1500 after a high-k dielectric layer 1510 is formed. The high-k dielectric 1510 may be formed via annealing the semiconductor device 1500 in a process similar to the one described above with respect to the semiconductor device 200. For example, the high-k dielectric layer 1510 may be formed by annealing the semiconductor device 1500 such that a top surface of the 2D semiconductor layer 1508 is oxidized. The high-k dielectric 1510 can be any type of material that has a relatively large dielectric constant (e.g., having a dielectric constant greater than 3.9). The high-k dielectric 1510 may be any material that is grown from the 2D semiconductor layer 150. For example, the high-k dielectric 1510 may include any oxide material that may be grown from the 2D semiconductor layer 1508. Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The high-k dielectric 1510 may be used as a gate dielectric for the semiconductor device 1500.

Corresponding to operation 1406, FIG. 17 illustrates a resulting side view of the semiconductor device 1500 after a gate metal structure 1512 is formed. The gate metal structure 1512 may include material may be deposited using, e.g., ALD, CVD, PVD, evaporation, electrodeposition, sputtering, with plasma-enhanced techniques, etc. A non-exhaustive list of potential materials to use for the gate metal structure 1512 includes ruthenium (Ru), tantalum nitride (TaN), titanium nitride (TiN), and tungsten (W), tungsten nitride (WN), titanium carbide (TiC), gallium (Ga), gadolinium (Gd), titanium oxynitride (TiON), tantalum silicon nitride (TaSiN), titanium silicon nitride (TiSiN), molybdenum (Mo), aluminum (Al), copper (Cu) and combinations/stacks/alloys of these or similar materials.

Corresponding to operation 1408, FIG. 18 illustrates a resulting side view of the semiconductor device 1500 after a dielectric cap layer 1514 is formed. The dielectric cap layer 1514 may include any of the dielectric materials discussed with respect to dielectric layer 1504.

Figure 19:
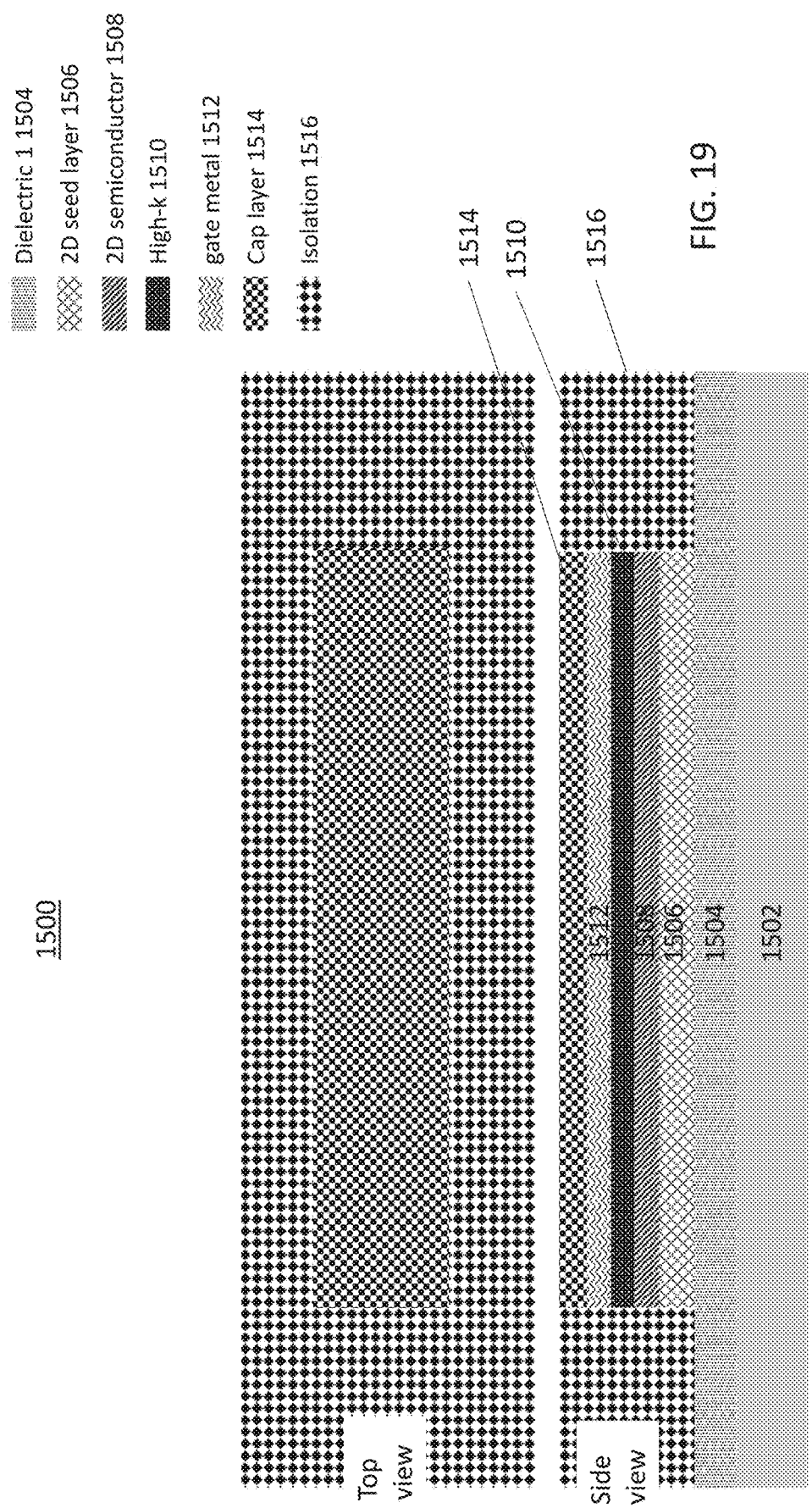

Corresponding to operation 1410, FIG. 19 illustrates a resulting top and side views of the semiconductor device 1500 after an isolation region 1516 is formed. As shown, the isolation region 1516 may be formed to laterally surround the patterned 2D seed layer 1506. Etching may be performed on the semiconductor device 1500 to etch the 2D seed layer 1506, the 2D semiconductor layer 1508, the high-k dielectric layer 1510, the gate metal structure 1512, and the cap layer dielectric 1514. The etch may performed on four sides around the layers such that a substantially rectangular shape is formed as shown in the top view. Accordingly, a channel region of the semiconductor device 1500 may be defined.

After the etching, isolation regions 1516 may be formed surrounding the channel region. The isolation regions 1516 may include any dielectric material discussed within this disclosure.

Corresponding to operation 1412, FIG. 20 illustrates a resulting side view of the semiconductor device 1500 after etching the isolation regions 1516 to form trenches 1517. The trenches 1517 may be formed to define S/D regions of the semiconductor device 1500 and form insulating regions around the gate metal structure 1512 so that the gate metal structure 1512 and the metal for the source and drain are not short-circuited.

Corresponding to operation 1414, FIG. 21 illustrates a resulting side view of the semiconductor device 1500 after forming dielectric material 1520 (labeled as "dielectric 2" in the figures). End portions of the gate metal structure 1512 may be etched such that sidewalls (or indents) of the gate metal structure 1512 are exposed toward the trenches 1517. The etched portions may then be filled with a dielectric material 1520 including any dielectric materials described within the disclosure by using, e.g., ALD, CVD, PVD, evaporation, electrodeposition, sputtering, with plasma-enhanced techniques. The dielectric material 1520 may be formed such that the dielectric material 1520 is self-aligned to a hard mask (not shown) used to etch the isolation regions 1516. In some embodiments, etching may be performed to remove remnants or portions of the dielectric material such that sidewalls of the trenches 1517 may have flushed surfaces facing along the X-direction.

Corresponding to operation 1416, FIG. 22 illustrates a resulting side view of the semiconductor device 1500 after forming S/D metal structures 1522. The S/D metal structures 1522 may be any type of conductive metal suitable to form a source or drain electrode in the semiconductor device 1500, including copper, gold, silver, platinum, nickel, tungsten, ruthenium, or other types of conductive metals or alloys. Once the S/D metal structures 1522 are deposited, a top surface of the semiconductor device 1500 may be polished using, e.g., CMP.

Corresponding to operation 1418, FIG. 23 illustrates a resulting side view of the semiconductor device 1500 after etching the S/D metal structures 1522 and filling the cavity with isolation material to form the isolation region 1516. The S/D metal structures 1522 may be etched such that a top surface of the S/D metal structures 1522 has a height substantially similar to the height of the high-k dielectric layer 1510. The cavity formed over the S/D metal structures 1522 may be filled via deposition with the same material as the isolation regions 1516. A top surface of the isolation regions 1516 may then be polished, e.g., via CMP.

Corresponding to operation 1420, FIG. 24 illustrates a resulting side view of the semiconductor device 1500 after depositing a dielectric layer 1524 (labeled as "dielectric 3" in the figures). The dielectric layer 1524 may include any dielectric material described within this disclosure. The dielectric layer 1524 may function as an insulating layer that electrically insulates stacked transistors from one another as will be described below. Furthermore, the dielectric layer 1524 may be used to create stub portions for the gate metal structure 1512 to connect to interconnect structures.

Figure 25:
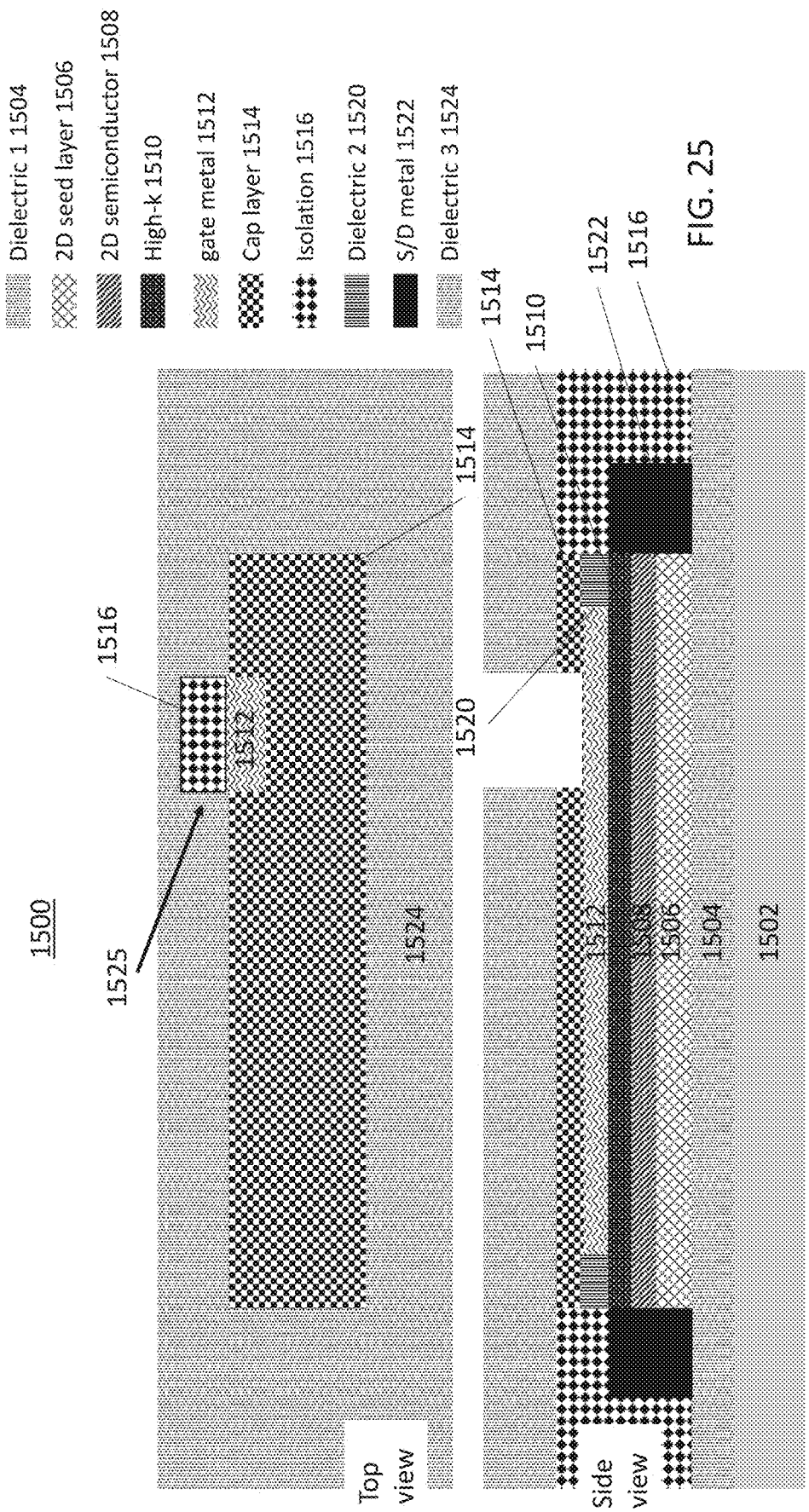

Corresponding to operation 1422, FIG. 25 illustrates a resulting top and side views of the semiconductor device 1500 after etching a portion of the cap layer 1514 and the dielectric layer 1524. The etching may be performed once for each layer (e.g., once for the cap layer 1514 and once for the dielectric layer 1524) or together at once such that the etching stops at the gate metal structure 1512. As shown in the top view, a portion of the gate metal structure 1512 may be exposed. The portion may overlap the channel region of the semiconductor device 1500.

A portion 1525 of the isolation region 1516 may be exposed after the etching of operation 1422. The mask (not shown) used for operation 1422 may include a pattern that exposes the portion 1525. The portion 1525 may later function as a stub to connect the gate metal structure 1512 (and the semiconductor structure 1500) to different devices on a chip that includes semiconductor device 1500.

Figure 26:
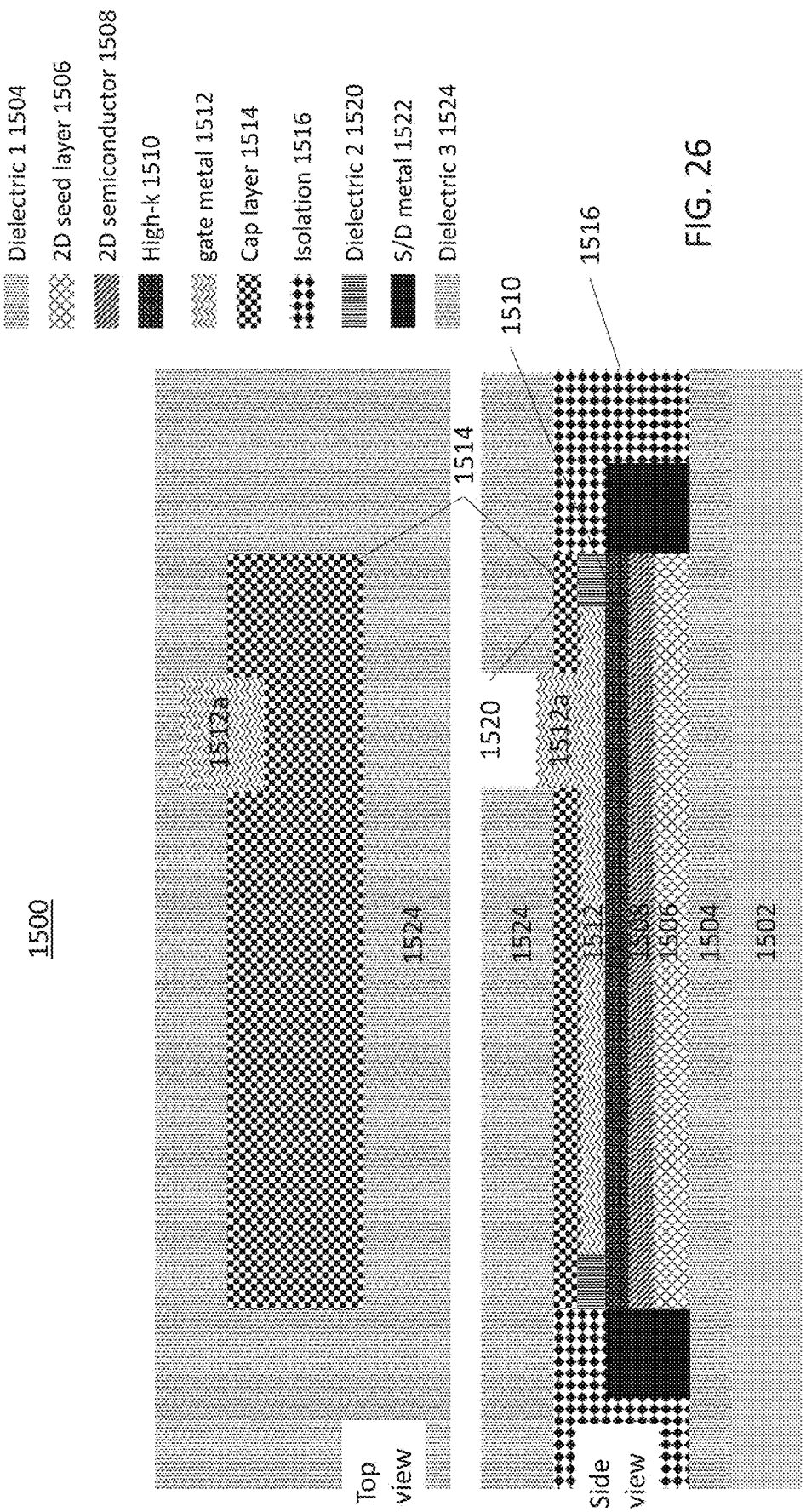

Corresponding to operation 1424, FIG. 26 illustrates a resulting top and side views of the semiconductor device 1500 after forming a gate metal stub structure 1512*a*. The same material used for forming the gate metal structure 1512 may be deposited on the exposed portion 1525 such that the gate metal structure 1512 is connected to the gate metal stub structure 1512*a*. As shown in the top and side views, the gate metal stub structure 1512*a* may be formed on the exposed portion 1525. Accordingly, the semiconductor device 1500 may be connected to other electrical devices by forming interconnect structures that connect to the gate stub structure 1512*a*. The gate metal stub structure 1512*a* may be formed by depositing a conductive material via, e.g., ALD, CVD, PVD, evaporation, electrodeposition, sputtering, plasma-enhanced techniques, etc. and then polishing down or etching down the material to form the gate metal stub structure 1512*a*.

Figure 27:
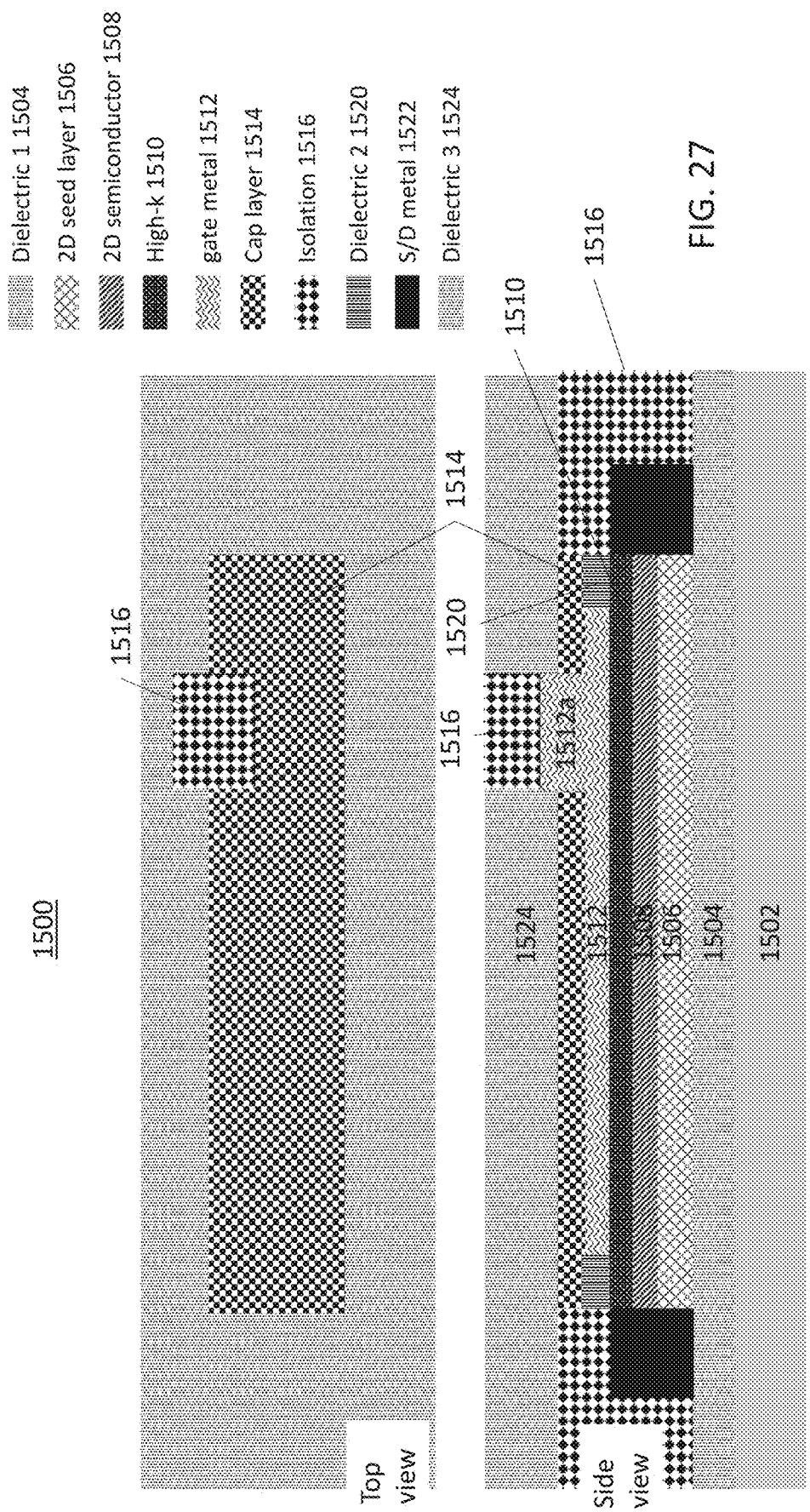

Corresponding to operation 1426, FIG. 27 illustrates a resulting top and side views of the semiconductor device 1500 after forming an additional isolation region 1516 on the gate metal stub structure 1512*a*. The dielectric material may be any dielectric material that has been discussed in this disclosure.

Figure 28:
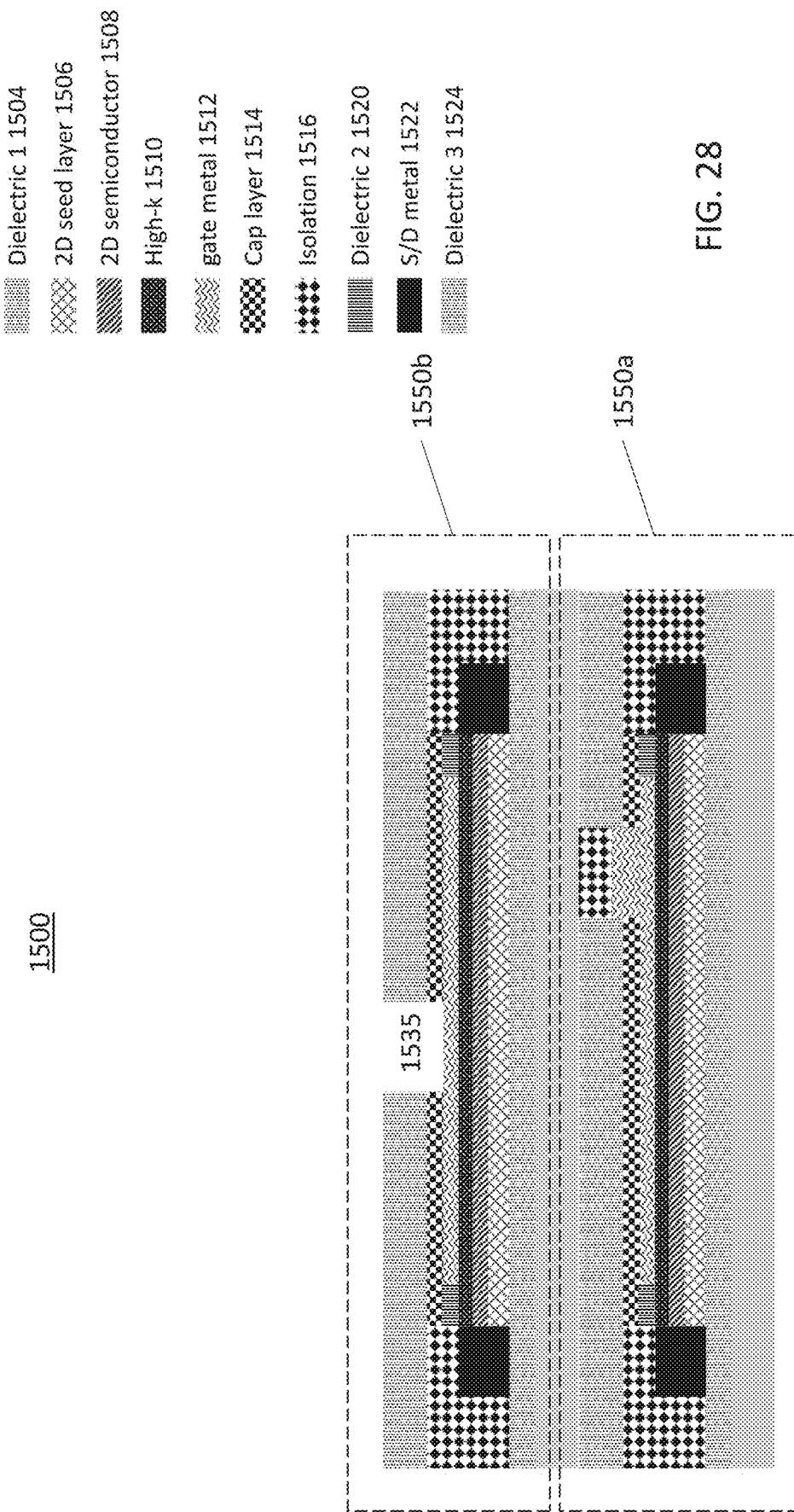

Corresponding to operation 1428, FIG. 28 illustrates a resulting top and side views of the semiconductor device 1500 after repeating operations 1402-1426. Accordingly, there may be multiple transistors that can be stacked on top of each other but electrically isolated from each other. For example, after forming a transistor 1550*a* by going through the operations of 1402-1426 one time, a second transistor 1550*b* may be formed by going through the operations of 1402-1426 a second time. However, when performing operations 1422-1426 for the second transistor 1550*b*, the etching may be performed such that the stub for the second transistor 1550*b* does not overlap the stub (e.g., gate metal stub structure 1512*a*) for the transistor 1550*a*. Accordingly, an exposed portion 1535 may be formed after operation 1422 that exposes a top portion of the gate metal structure 1512 of the second transistor 1550*b*. A cavity 1535 may be formed that corresponds to where the dielectric layer 1524 and the cap layer 1514 of the transistor 1550*b* was etched.

Figure 29:
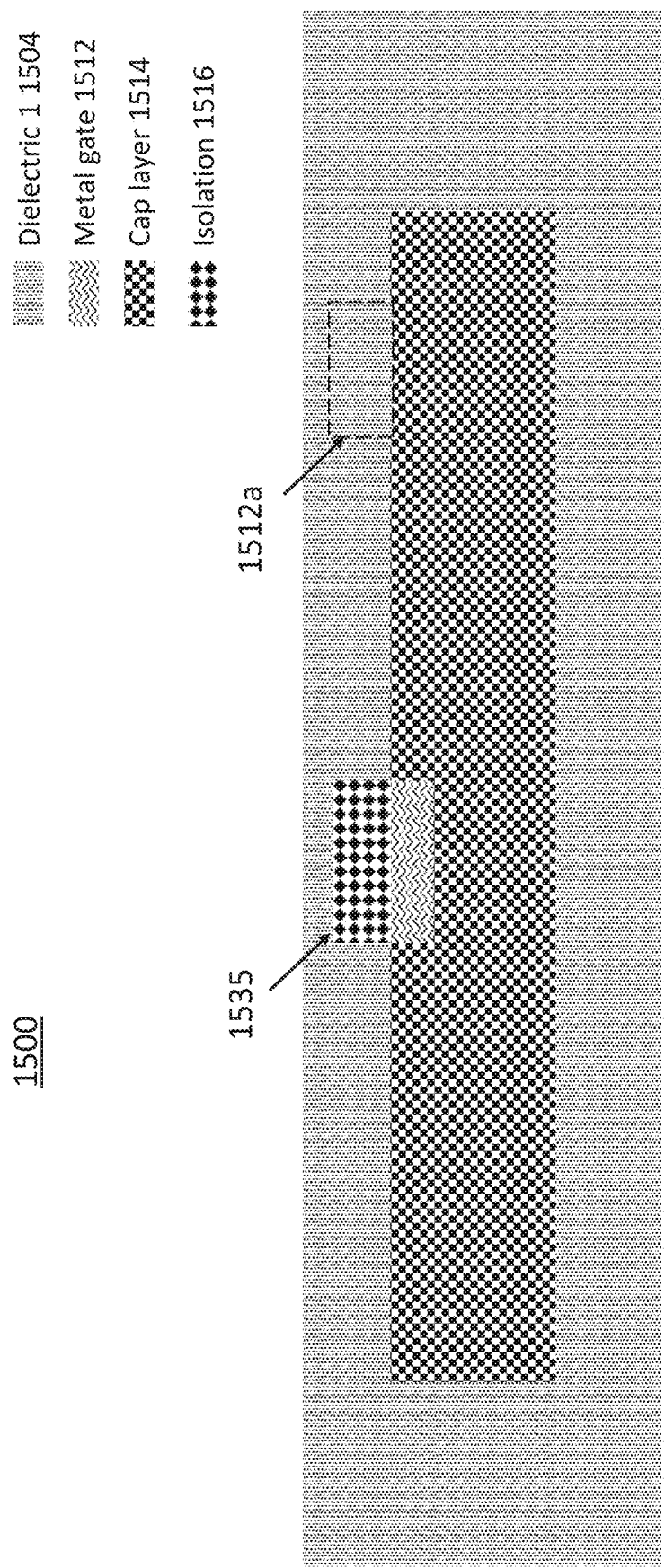

FIG. 29 illustrates a top view of the semiconductor device 1500 after the etching of operation 1422 is performed for the second transistor 1550*b*. The dashed box labeled "1512*a*" indicates where the gate metal stub structure 1512*a* is located in order to show a relative position of the gate metal stub structure 1512*a* compared to the cavity 1535. The cavity 1535 may expose a top surface of the metal gate structure 1512 and the isolation region 1516, similar to the exposed portions shown in FIG. 25.

Figure 30:
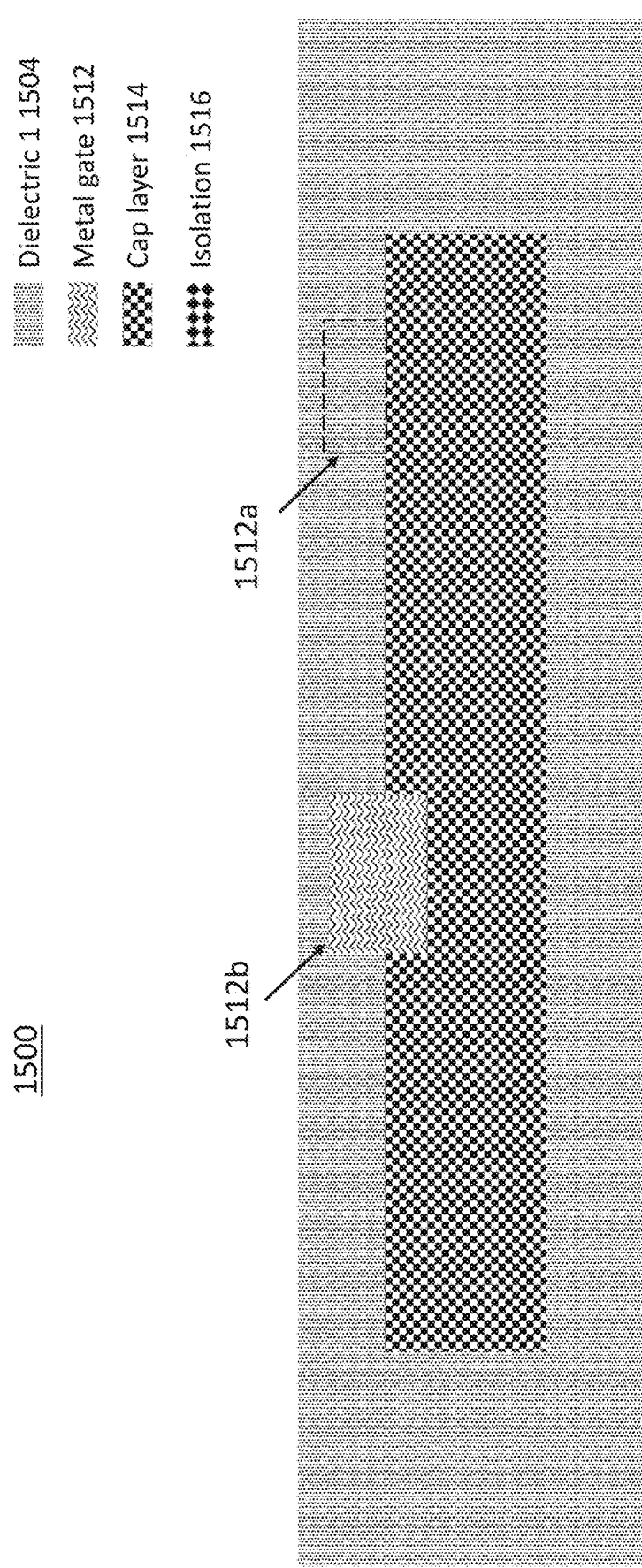
Figure 31:
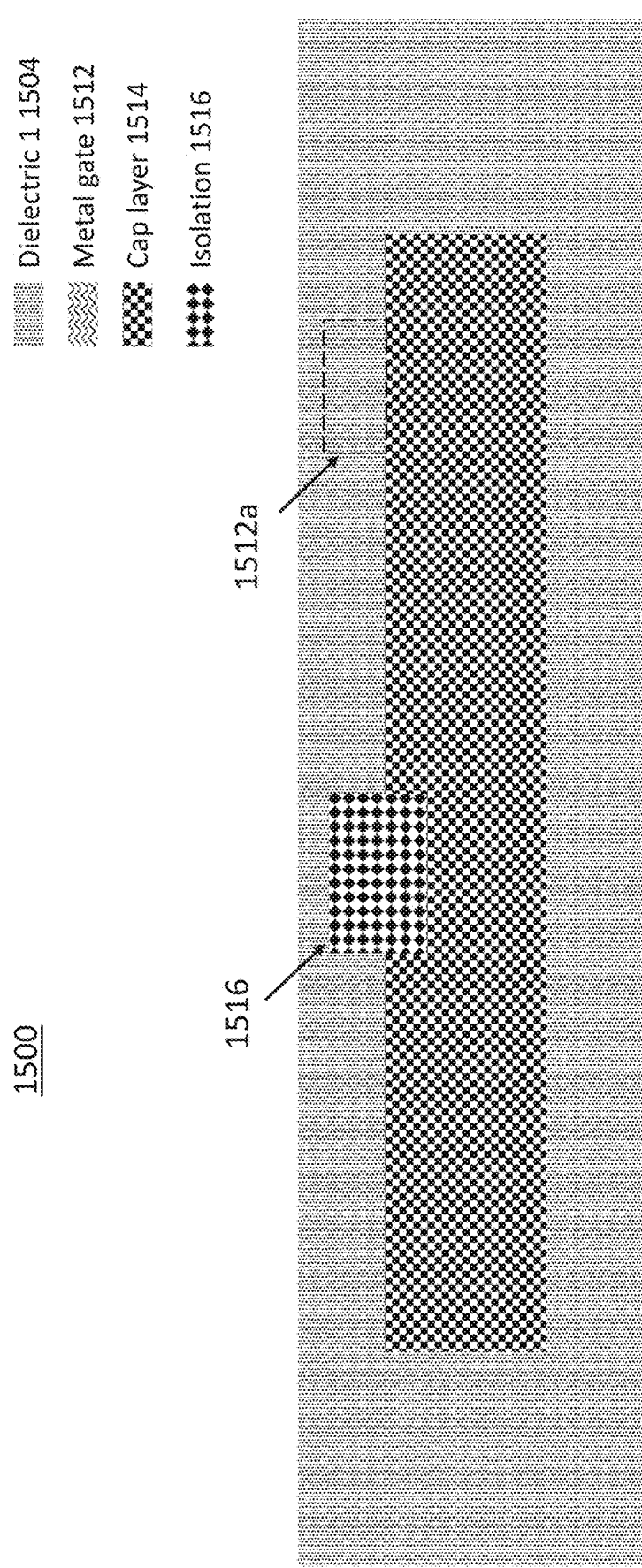

FIG. 30 illustrates a top view of the semiconductor device 1500 after depositing a conductive layer to form a gate metal stub structure 1512b, similar to the gate metal stub structure 1512a shown in FIG. 26. FIG. 31 illustrates a top view of the semiconductor device 1500 after depositing a dielectric layer to form the isolation region 1516.

Figure 32:
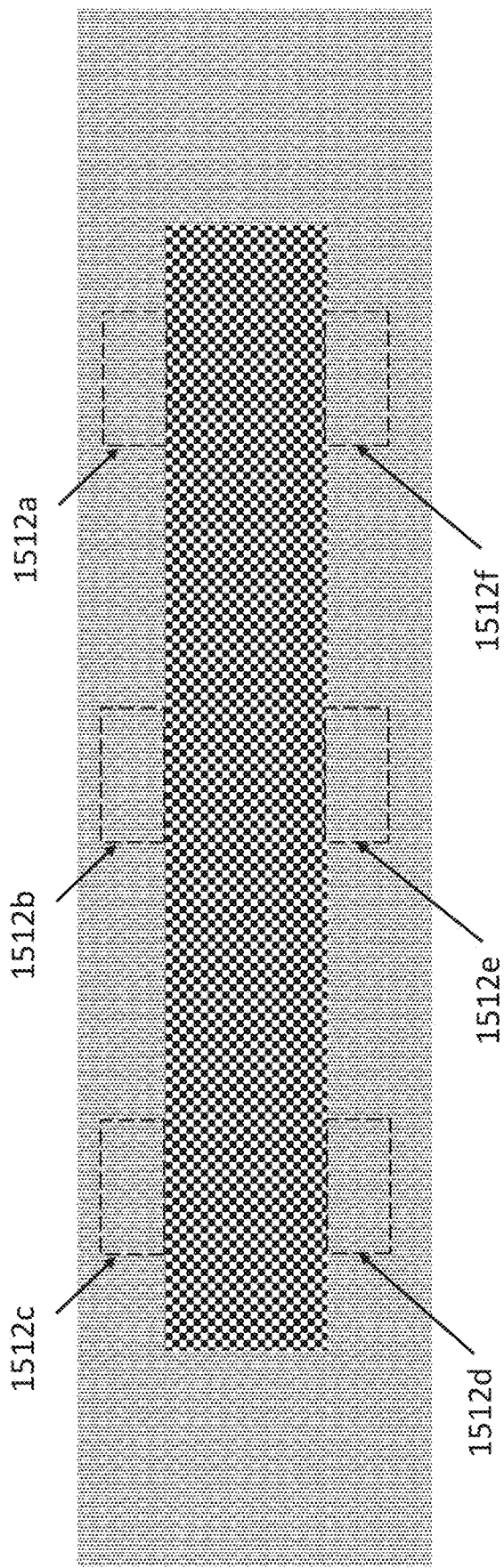

FIG. 32 illustrates a top view of the semiconductor device 1500 after operations 1402-1428 have been performed six times. At the end of the process, the semiconductor device 1500 may include six 2D transistors that are stacked on top of one another. A plurality of gate metal stub structures may be formed such that they do not overlap one another. For example, as shown in FIG. 32, three gate metal stub structures 1512a, 1512b, 1512c may be formed on one side of the cap layer 1514, and three gate metal stub structures 1512d, 1512e, 1512f may be formed on an opposing side of the cap layer 1514. The gate metal stub structure 1512a may be formed with the first transistor, the gate metal stub structure 1512b may be formed with the second transistor, the gate metal stub structure 1512c may be formed with the third transistor, the gate metal stub structure 1512d may be formed with the fourth transistor, the gate metal stub structure 1512e may be formed with the fifth transistor, and the gate metal stub structure 1512b may be formed with the second transistor. Accordingly, interconnect structures may be formed in metal layers to connect the gate metal structures of the first to sixth transistors.

Figure 33:
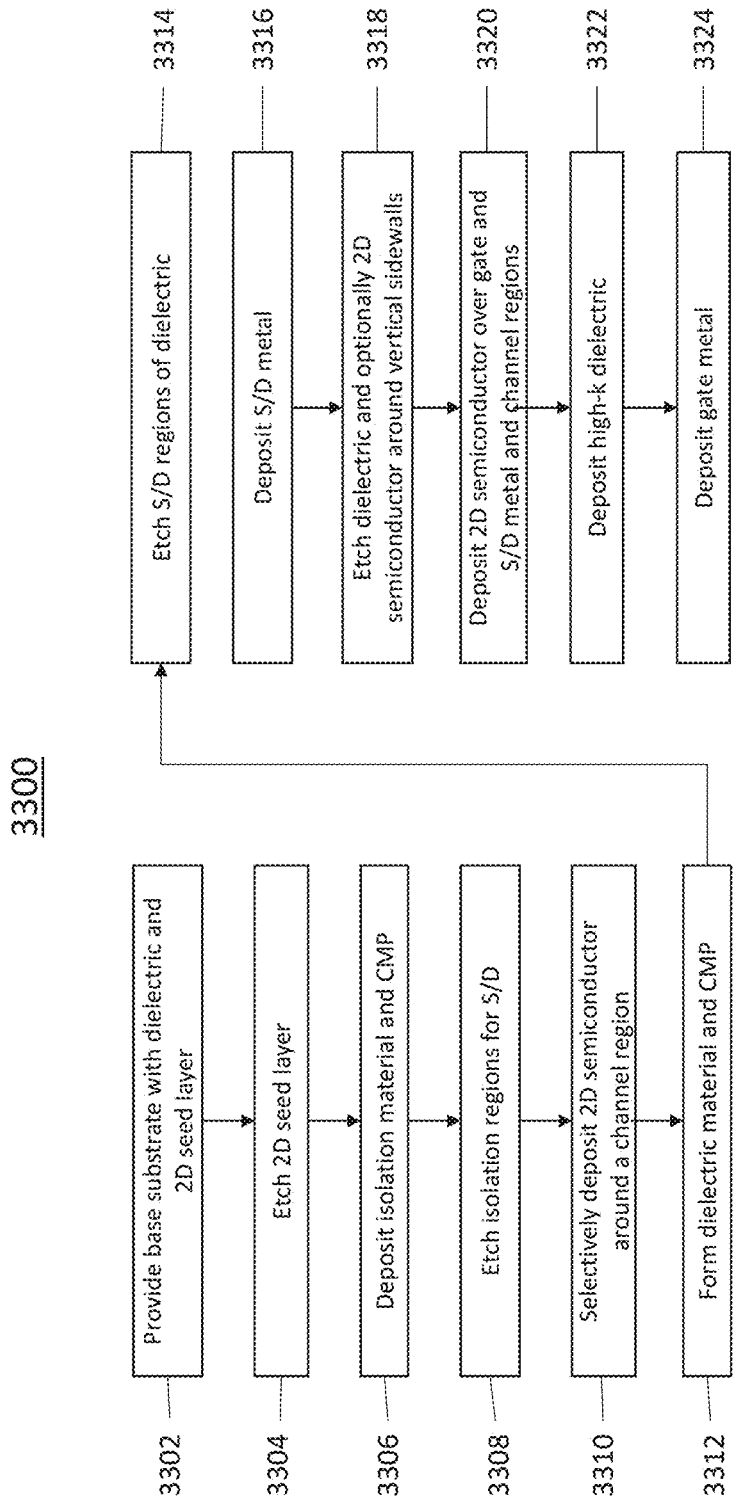
FIG. 33 illustrates a flowchart of a process for forming an example semiconductor device, in accordance with some embodiments.

FIG. 33 illustrates a flowchart of a process 3300 for forming an example semiconductor device (e.g., transistor) 3400, in accordance with some embodiments. The resulting semiconductor device 3400 may include a transistor with a gate metal around three sides (top and sides) of a semiconductor layer and gate dielectric. It is noted that the process 3300 is merely an example, and is not intended to limit the present disclosure. Accordingly, it is understood that additional operations may be provided before, during, and after the process 3300 of FIG. 33 and that some other operations may only be briefly described herein. In some embodiments, operations of the process 3300 may be associated with perspective and/or top views of an example semiconductor device at various fabrication stages as shown in FIGS. 34-47, respectively, which will be discussed in further detail below.

Figure 34:
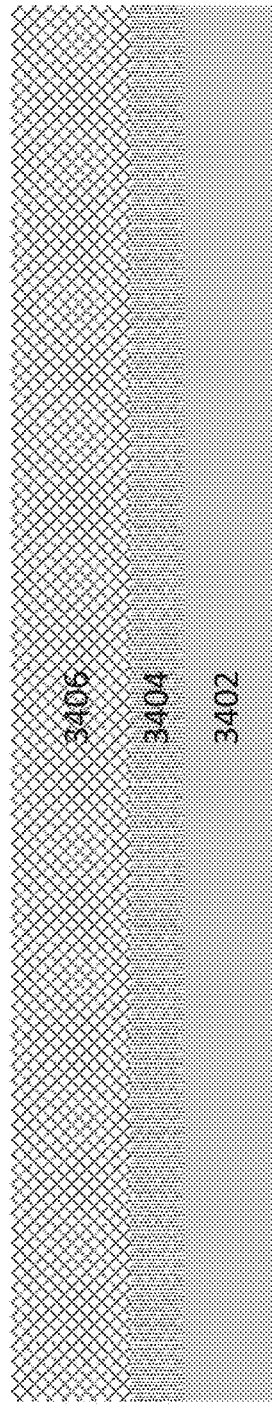
FIGS. 34-47 show top and/or cross-sectional views of a semiconductor device being manufactured at different stages of the process of FIG. 33, in accordance with some embodiments.

Corresponding to operation 3302, FIG. 34 illustrates a resulting side view of the semiconductor device 3400 after a 2D seed layer 3406 is formed on a dielectric layer 3404 ("dielectric 1 3404" in the figures), which is formed on a base substrate 3402. The base substrate 3402 may be a dielectric substrate (e.g., silicon nitride). The base substrate 3402 may be a semiconductor substrate, such as a bulk semiconductor, a semiconductor-on-insulator (SOI) substrate, or the like, which may be doped (e.g., with a p-type or an n-type dopant) or undoped. The base substrate 3402 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, power rails may be formed on an opposing side of the base substrate 3402. The dielectric layer 3404 may include one of $SiO_2$, $SiO_xN_y$, other oxide materials, SiN, and others. The 2D seed layer 3406 may include $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, and other similar materials. The dielectric layer 3404 and the seed layer 3406 may be deposited using similar methods as described with respect to semiconductor device 200. Accordingly, repeated descriptions are omitted for simplicity and clarity.

Figure 35:
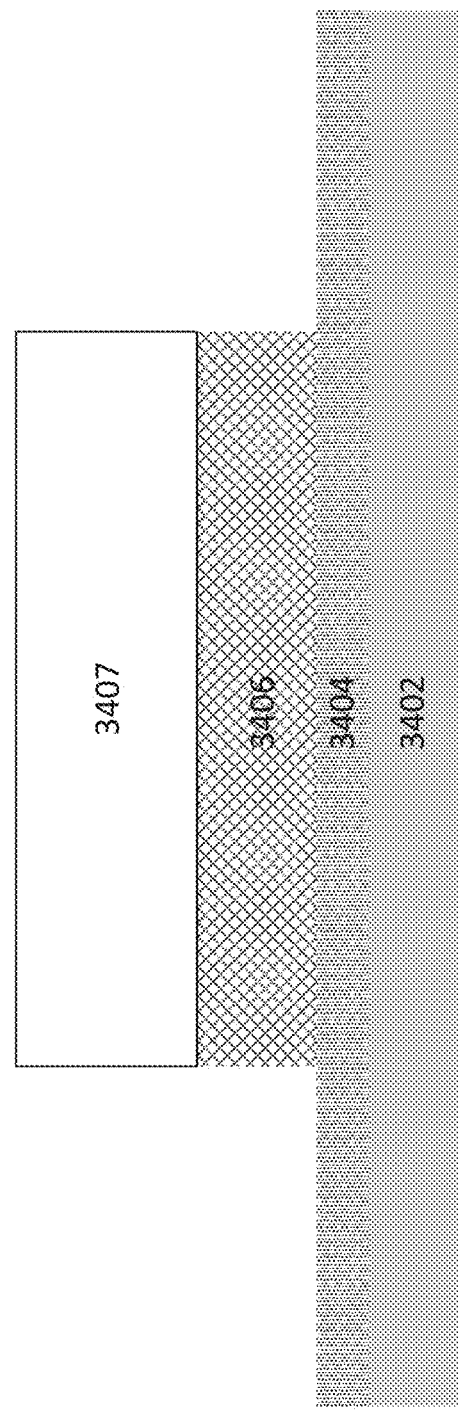

Corresponding to operation 3304, FIG. 35 illustrates a resulting side view of the semiconductor device 3400 after etching the 2D seed layer 3406. A patterned mask layer 3407 may be used to pattern various features for the semiconductor device 3400. The 2D seed layer 3406 may etch to a top surface of the dielectric layer 3404.

Figure 36:
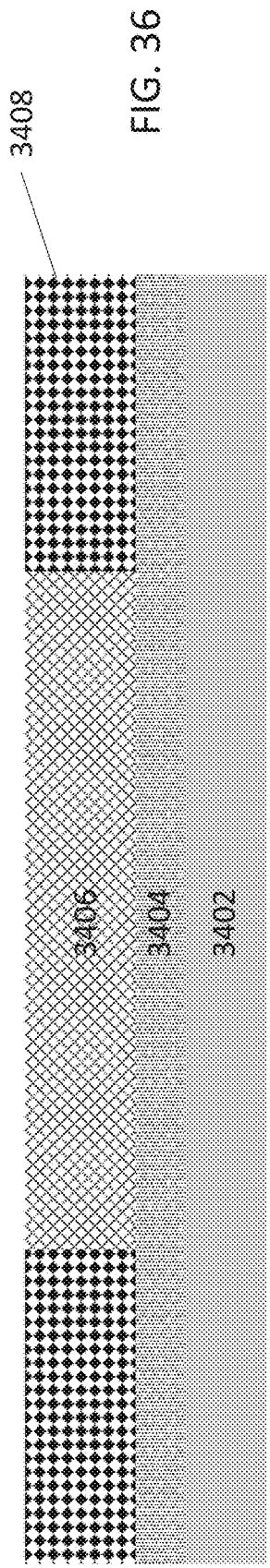

Corresponding to operation 3306, FIG. 36 illustrates a resulting side view of the semiconductor device 3400 after forming an isolation regions 3408. The isolation regions 3408 may include any dielectric material discussed within this disclosure. After depositing the isolation/dielectric material, a top surface may be polished via, e.g., CMP.

Figure 37:
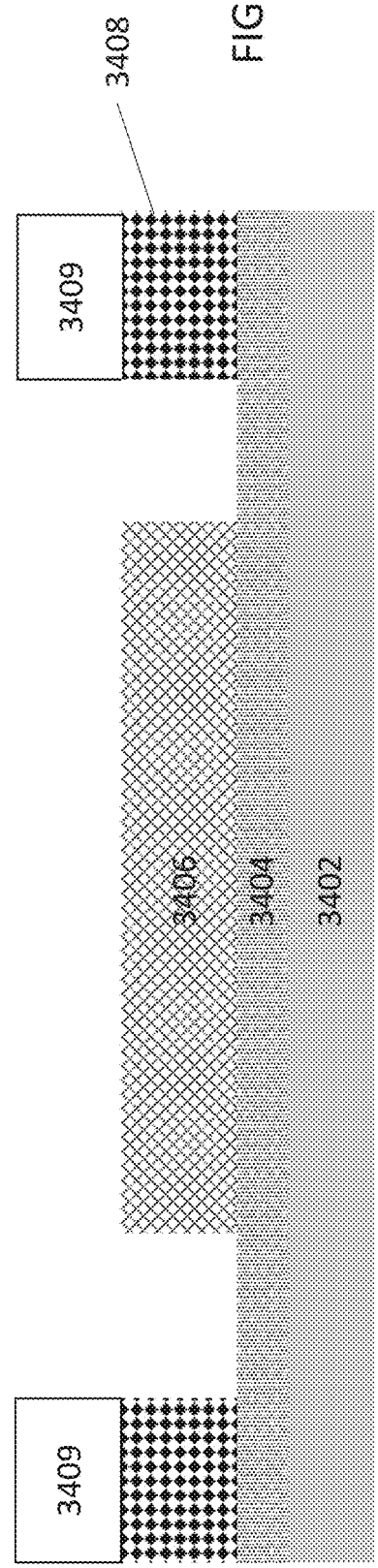

Corresponding to operation 3308, FIG. 37 illustrates a resulting side view of the semiconductor device 3400 after etching the isolation regions 3408. The isolation regions 3408 may be etched using a mask 3409 as a pattern so that cavities for the S/D may be formed. The isolation regions 3408 may be etched along all four sidewalls of the 2D seed layer 3408. Furthermore, a channel region may be formed between the S/D regions which are formed later.

Figure 38:
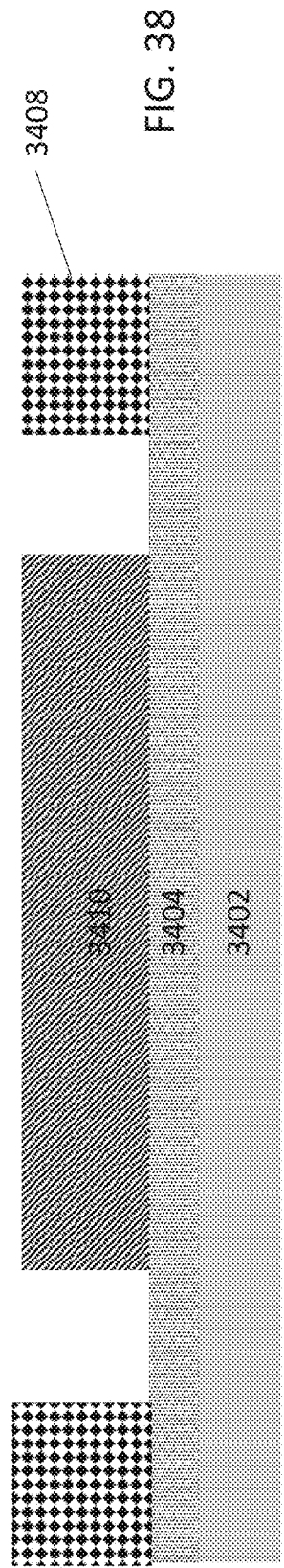

Corresponding to operation 3310, FIG. 38 illustrates a resulting side view of the semiconductor device 3400 after forming a 2D semiconductor layer 3410. The 2D semiconductor layer 3410 may be formed by a selective deposition (e.g., selective ALD, CVD, PVD, evaporation, electrodeposition, sputtering, plasma-enhanced techniques, etc.) or through epitaxial growth using the 2D seed layer 3406 as a seed. Alternatively stated, the 2D semiconductor layer 3410 can inherit a footprint or profile collectively defined by the 2D seed layer 3406. The 2D semiconductor layer 3410 may include material including $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, and other similar materials. Although not shown, the 2D semiconductor layer 3410 is formed on a top surface and along all of the sidewalls of the 2D seed layer 3406.

Figure 39:
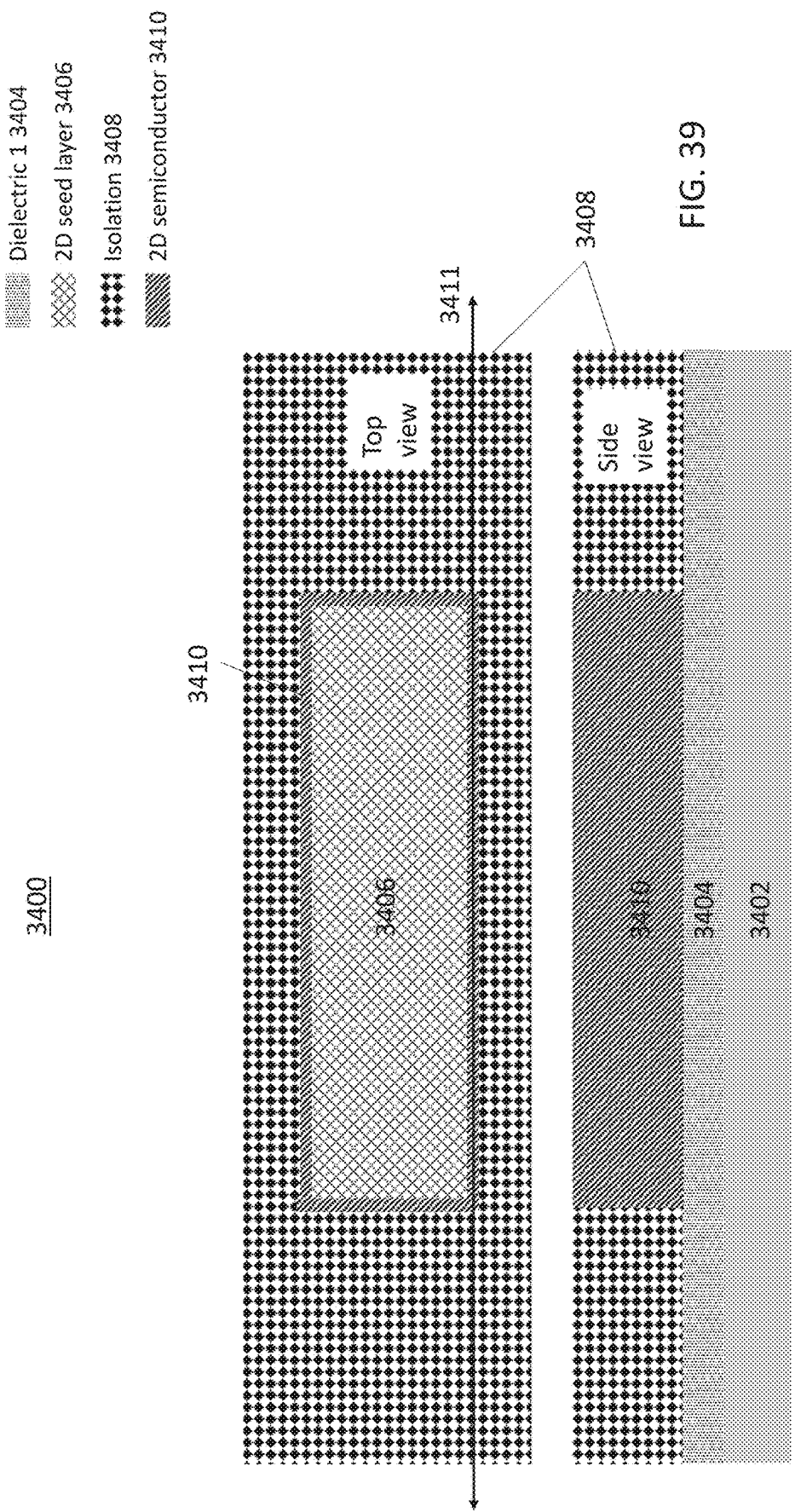

Corresponding to operation 3312, FIG. 39 illustrates resulting top and side views of the semiconductor device 3400 after forming additional isolation regions 3408 and then polishing a top surface of the isolation region 3408. Additional dielectric material may be deposited such that the dielectric material covers the 2D semiconductor layer 3410 on all four sidewalls and the top surface. Afterward, a top surface of the isolation region 3408 may be polished via, e.g., CMP, to a height such that a top surface of the 2D seed layer 3406 is exposed. In addition, top surfaces of the sidewalls of the 2D semiconductor layer 3410 may be exposed.

The side view shown in FIG. 39 illustrates a side view at a position shown by line 3411 of the top view. As shown in the side view, the side wall 2D semiconductor 3410 may be disposed between the 2D seed layer 3406 and the isolation region 3408. Accordingly, the 2D semiconductor layer 3410 may be disposed along all of the sidewalls of the 2D seed layer 3406.

Figure 40:
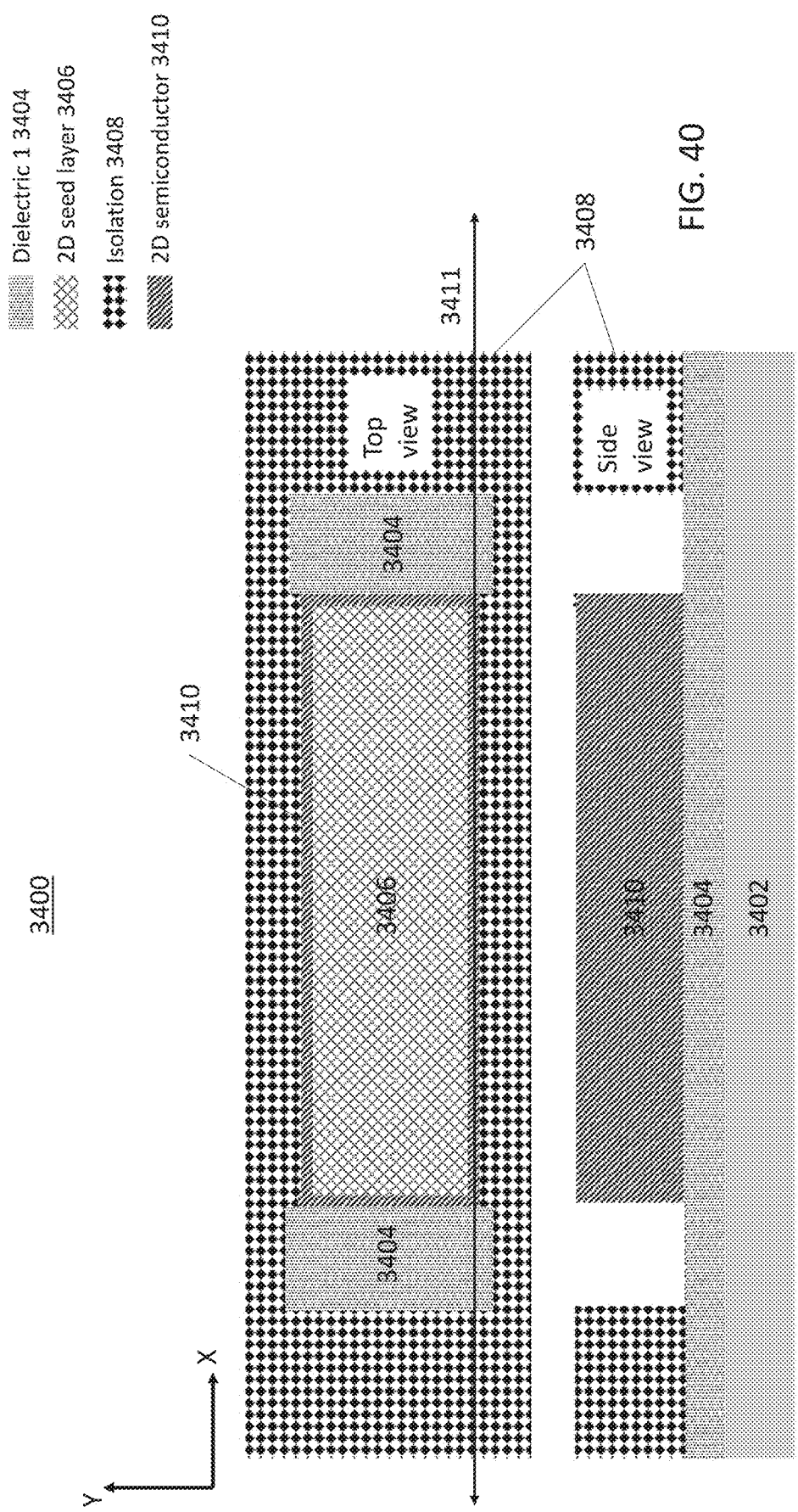

Corresponding to operation 3314, FIG. 40 illustrates resulting top and side views of the semiconductor device 3400 after etching the isolation regions 3408 to form cavities for the S/D metal. Referring to the top view, portions of the isolation region 3408 that oppose each other with reference to the 2D semiconductor layer 3410 in the X-direction may be etched. As shown in the top view, the opposing portions of the isolation regions 3408 may be etched down to the dielectric layer 3404. Accordingly, cavities to deposit S/D metal may be formed.

As shown in the side view, opposing ends of the sidewalls of the 2D semiconductor layer 3410 is exposed. Additionally, sidewalls of the isolation region 3408 and a top surface of the dielectric layer 3404 are also exposed.

Figure 41:
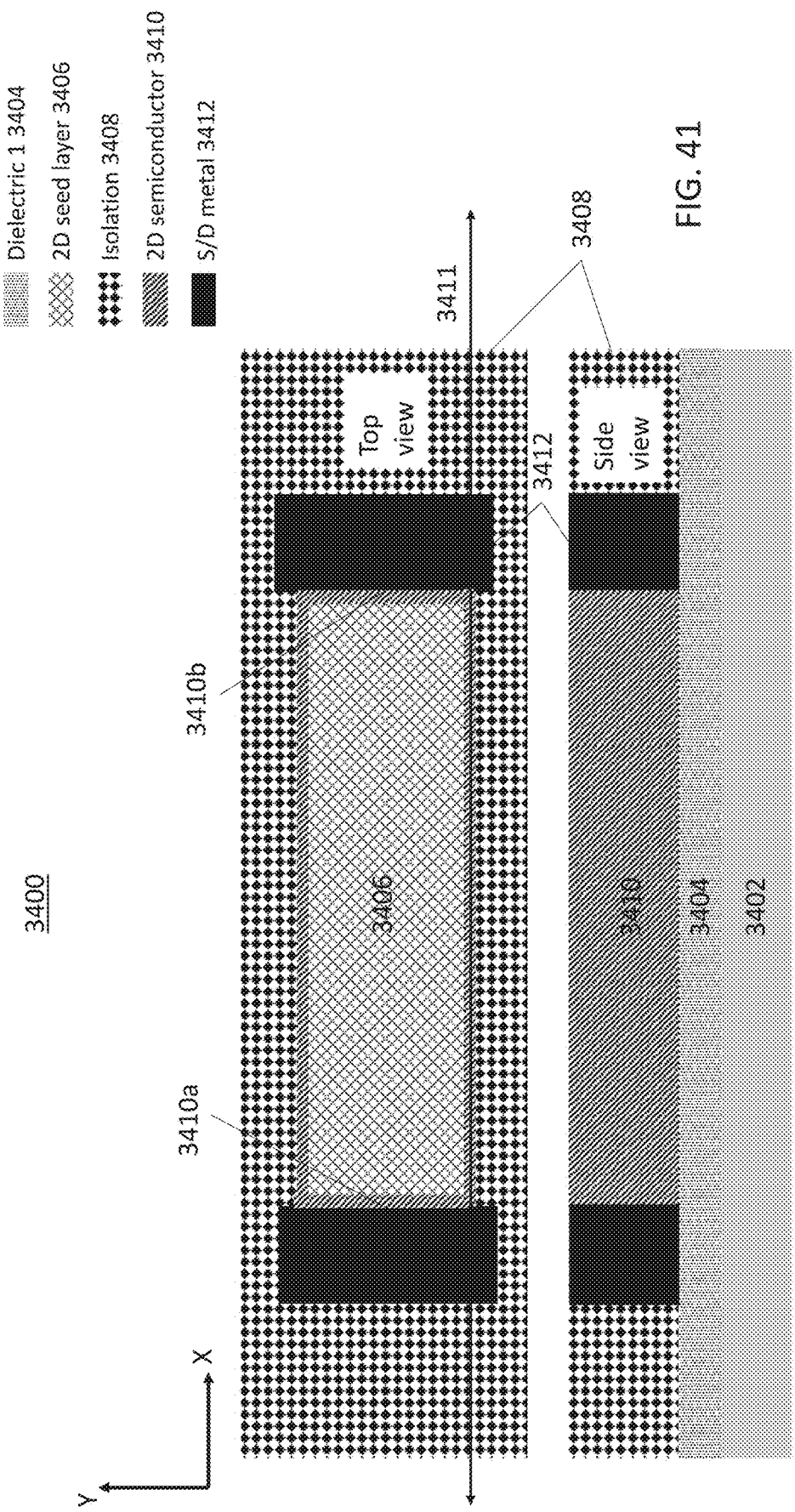

Corresponding to operation 3316, FIG. 41 illustrates resulting top and side views of the semiconductor device 3400 after forming the S/D metal structures 3412. The S/D metal structures 3412 may be any type of conductive metal suitable to form a source or drain electrode in the semiconductor device 3400, including copper, gold, silver, platinum, nickel, tungsten, ruthenium, or other types of conductive metals or alloys. Once the S/D metal structures 3412 are deposited, a top surface of the semiconductor device 3412 may be polished using, e.g., CMP. Accordingly, a top surface of the semiconductor 3400 at this point may be flat.

As shown in the top view, the S/D metal 3412 may contact the 2D semiconductor layer 3410. For example, the S/D metal structure 3412 may contact a sidewall 3410a and a sidewall 3410b of the 2D semiconductor layer 3410. As shown in the side view, exposed portions of the 2D semiconductor layer 3410, the isolation regions 3408, and the dielectric layer 3404 are covered by the S/D metal structures 3412.

Figure 42:
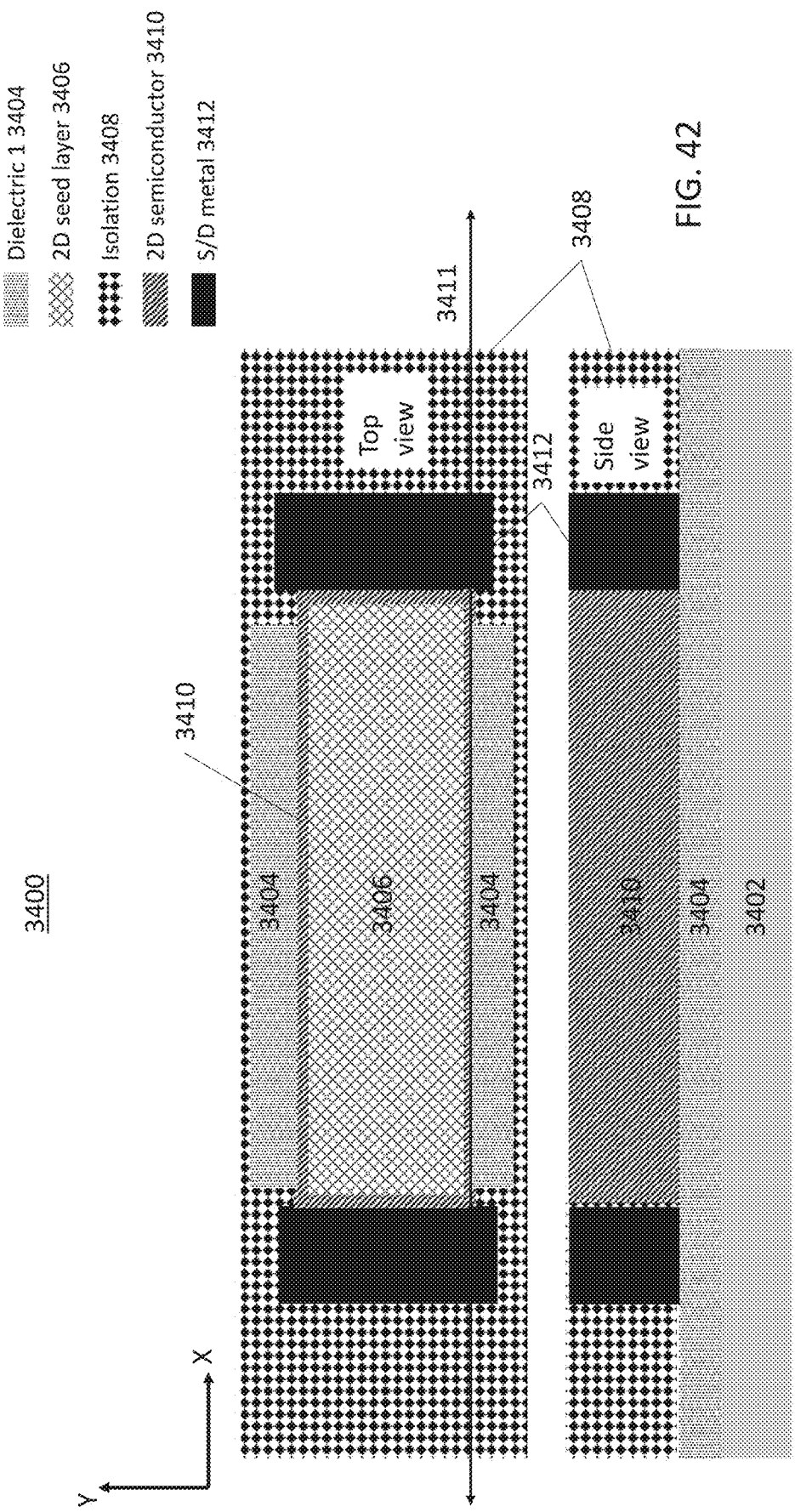

Corresponding to operation 3318, FIG. 42 illustrates resulting top and side views of the semiconductor device 3400 after etching the isolation region 3408. Referring to the top view, portions of the isolation region 3408 that oppose each other with reference to the 2D semiconductor layer 3410 in the Y-direction may be etched. Accordingly, top surfaces of the dielectric layer 3404 may be exposed as shown in the top view. Furthermore, opposing vertical sidewall of the 2D semiconductor layer 3410 may be exposed.

Figure 43:
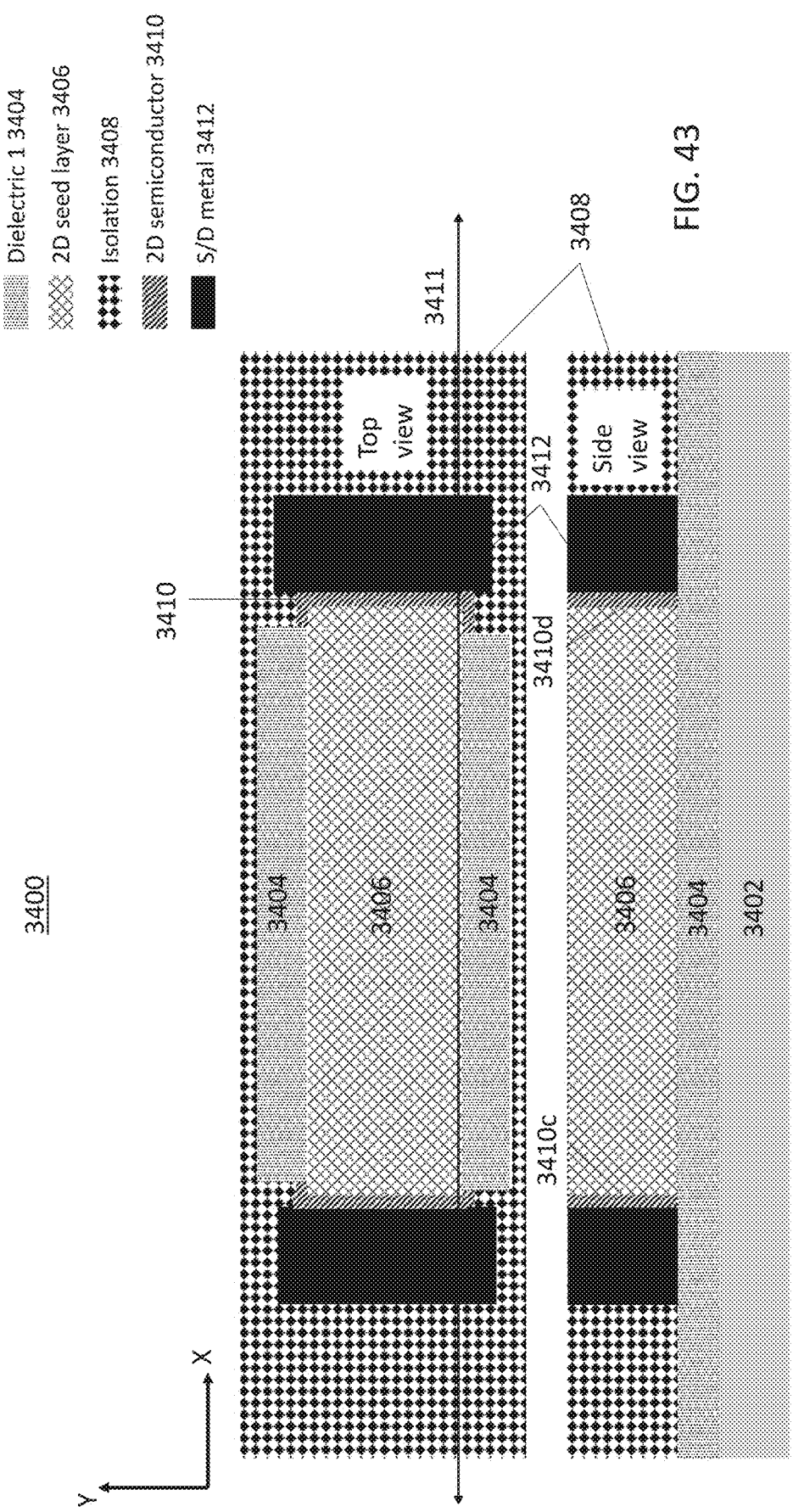

Corresponding still to operation 3318, FIG. 43 illustrates resulting top and side views of the semiconductor device 3400 after optionally etching the opposing sidewalls of the 2D semiconductor 3410. For example, in addition to etching the portions of the isolation regions 3408 that oppose each other in the Y-direction, the 2D semiconductor layer 3410 may also be etched such that sidewalls of the 2D seed layer 3406 is exposed. Accordingly, in the side view, a portion of the 2D seed layer 3406 is exposed, rather than the sidewalls of the 2D semiconductor layer 3410. Furthermore, portions 3410c and 3410d of the 2D semiconductor layer 3410 may also be exposed which correspond to the unetched portions of the 2D semiconductor layer 3410 which are disposed between the S/D metal structures and the 2D seed layer 3406.

Figure 44:
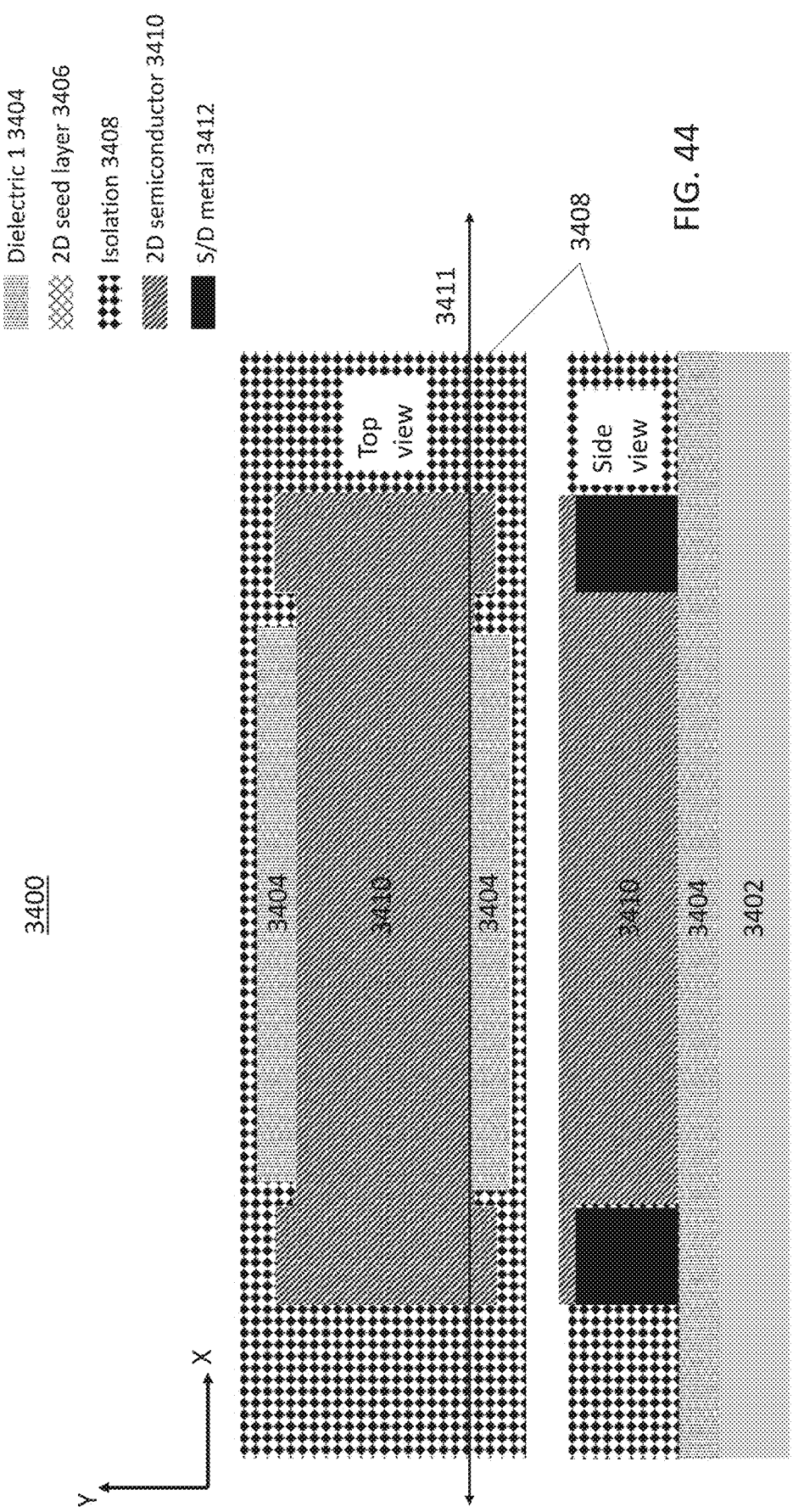

Corresponding to operation 3320, FIG. 44 illustrates resulting top and side views of the semiconductor device 3400 after forming a remainder of the 2D semiconductor layer 3410. The 2D semiconductor layer 3410 may be deposited using any of the methods described above. The 2D semiconductor material may be deposited on an entire top surface of the 2D seed layer, the S/D metal structures 3412, and the portions 3410c and 3410d. As shown in the side view, the 2D semiconductor device 3410 may be deposited along the sidewalls of the 2D seed layer 3406 such that the 2D semiconductor 3410 surrounds the 2D seed layer 3406.

Figure 45:
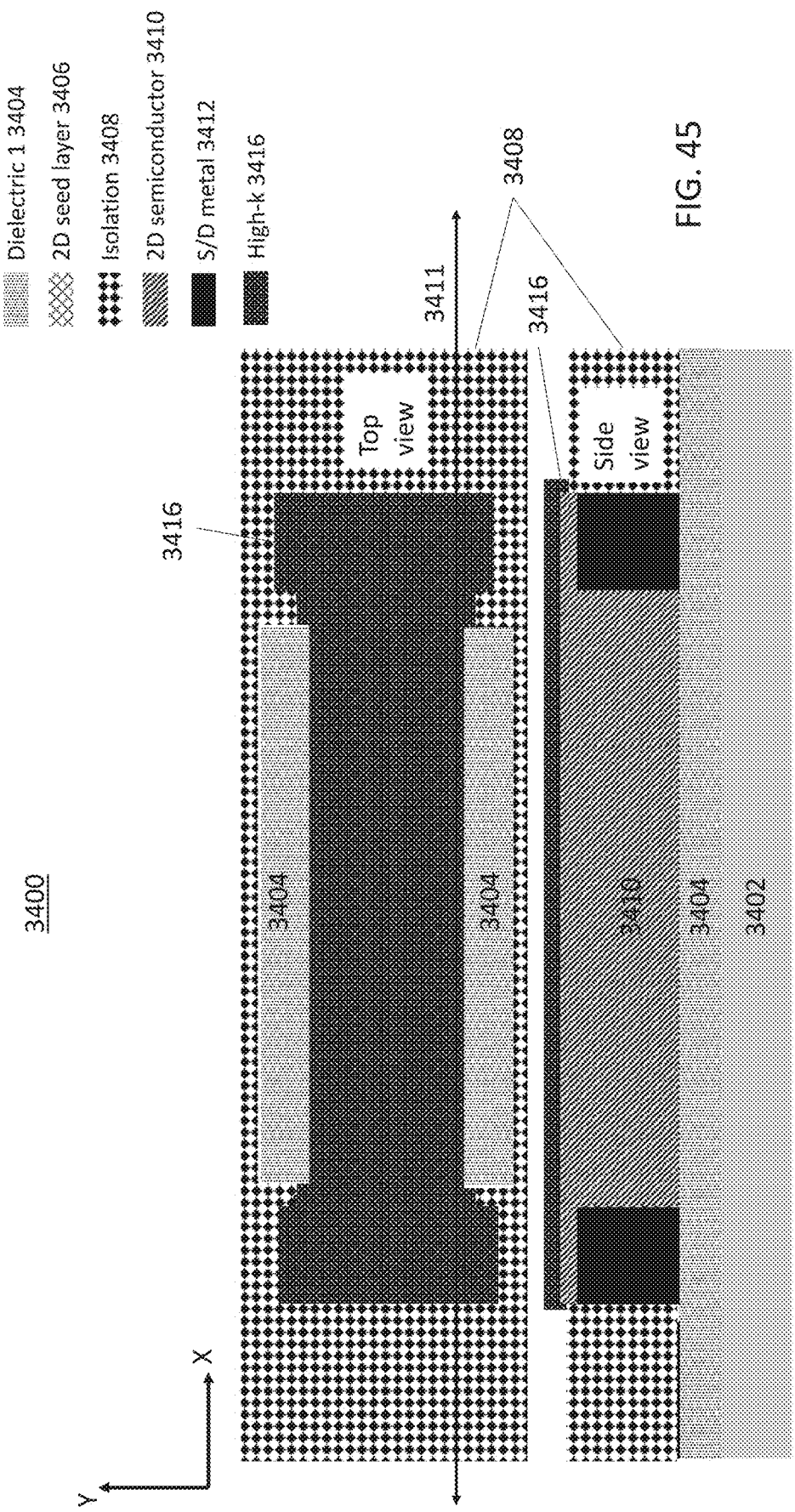

Corresponding to operation 3322, FIG. 45 illustrates resulting top and side views of the semiconductor device 3400 after forming the high-k dielectric layer 3416. For example, the high-k dielectric layer 3416 may include any oxide material that may be grown from the 2D semiconductor layer 3410. The high-k dielectric layer 3416 can be any type of material that has a relatively large dielectric constant (e.g., having a dielectric constant greater than 3.9). Additionally or alternatively, other gate dielectric materials may be utilized such as silicon oxynitride ($SiO_xN_y$), silicon nitride ($Si_3N_4$), alumina ($Al_2O_3$), lanthanum oxide ($La_2O_3$), zirconium oxide ($ZrO_2$), hafnium oxide ($HfO_2$), hafnium zirconium oxide (HfZrO), tantalum oxide ($Ta_2O_5$), hafnium silicon oxide ($HfSiO_4$), zirconium silicon oxide ($ZrSiO_4$), titanium oxide ($TiO_2$), strontium titanium oxide ($SrTiO_3$), hafnium silicon oxynitride ($HfSiO_xN_y$), zirconium silicon oxynitride ($ZrSiO_xN_y$), hafnium oxynitride ($HfO_xN_y$), zirconium oxynitride ($ZrO_xN_y$), other suitable materials and combinations thereof. The high-k dielectric layer 3416 may be used as a gate dielectric for the semiconductor device 3400.

As shown in FIG. 45, the high-k dielectric layer 3416 may be selectively grown from the 2D semiconductor layer 3410. The selective growth process may be performed by annealing as discussed above.

Figure 46:
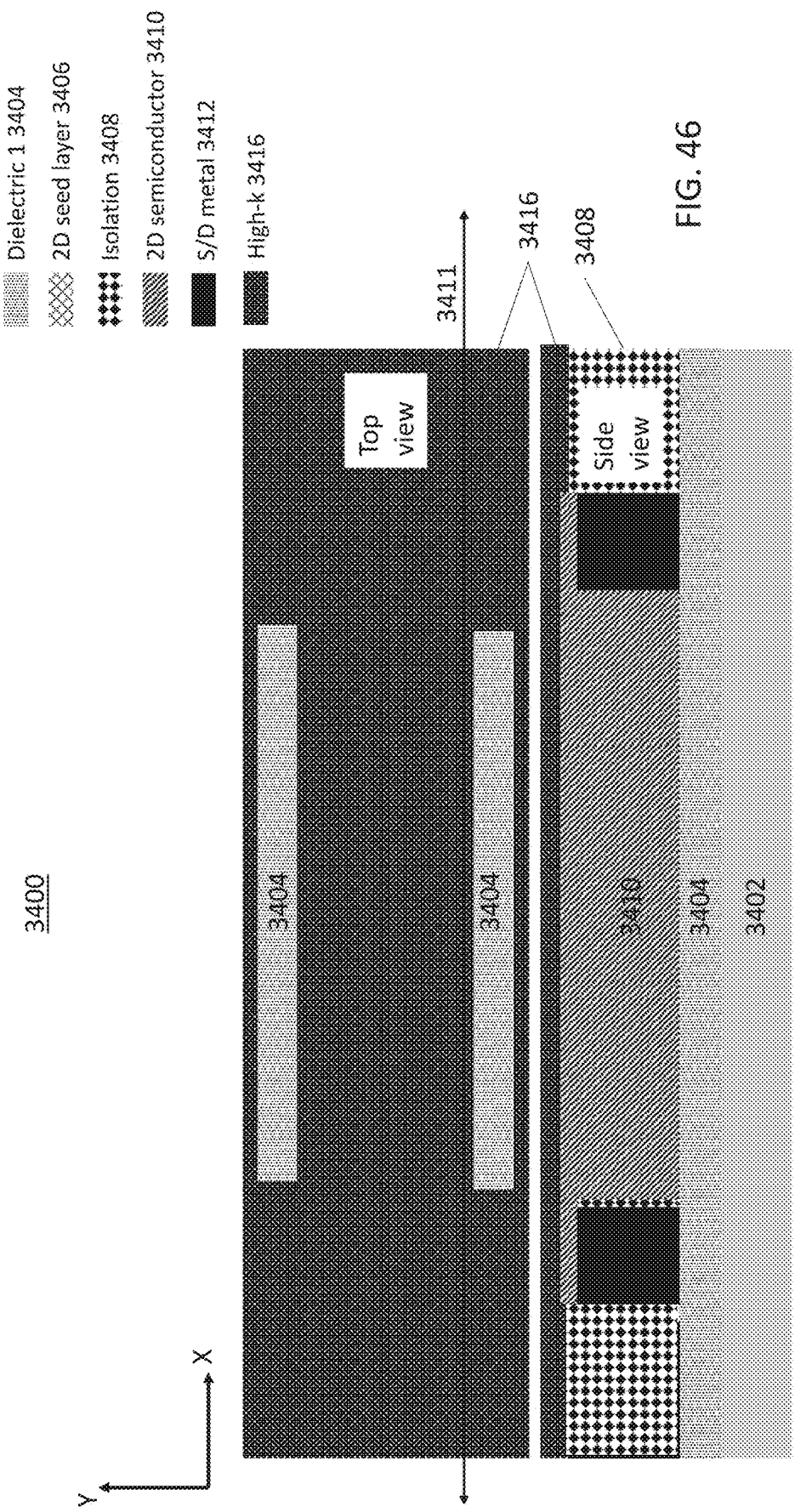

Alternatively, as shown in FIG. 46, the high-k dielectric layer 3416 may be deposited as a blanket layer except for the exposed portions of the dielectric layer 3404.

Figure 47:
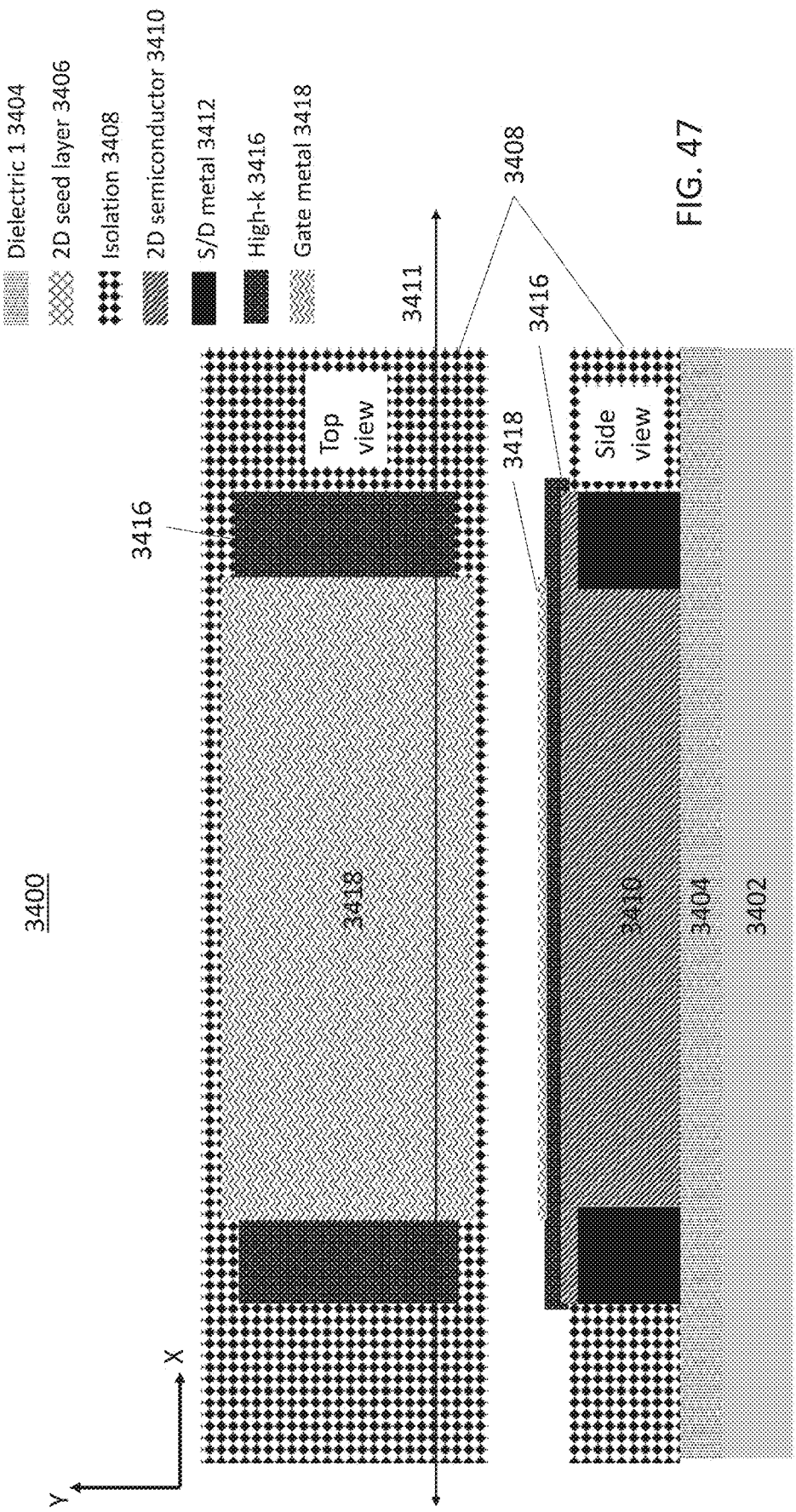

Corresponding to operation 3324, FIG. 47 illustrates resulting top and side views of the semiconductor device 3400 after forming a gate metal structure 3418. A non-exhaustive list of potential materials to use for the gate metal structure 3418 includes ruthenium (Ru), tantalum nitride (TaN), titanium nitride (TiN), and tungsten (W), tungsten nitride (WN), titanium carbide (TiC), gallium (Ga), gadolinium (Gd), titanium oxynitride (TION), tantalum silicon nitride (TaSiN), titanium silicon nitride (TiSiN), molybdenum (Mo), aluminum (Al), copper (Cu) and combinations/stacks/alloys of these or similar materials.

Although not shown in FIG. 47, the gate metal structure 3418 may be formed around the 2D semiconductor 3410 on a top portion and vertical sidewalls of the 2D semiconductor layer 3410. Accordingly the semiconductor device 3400 including a transistor may be formed.

Figure 48:
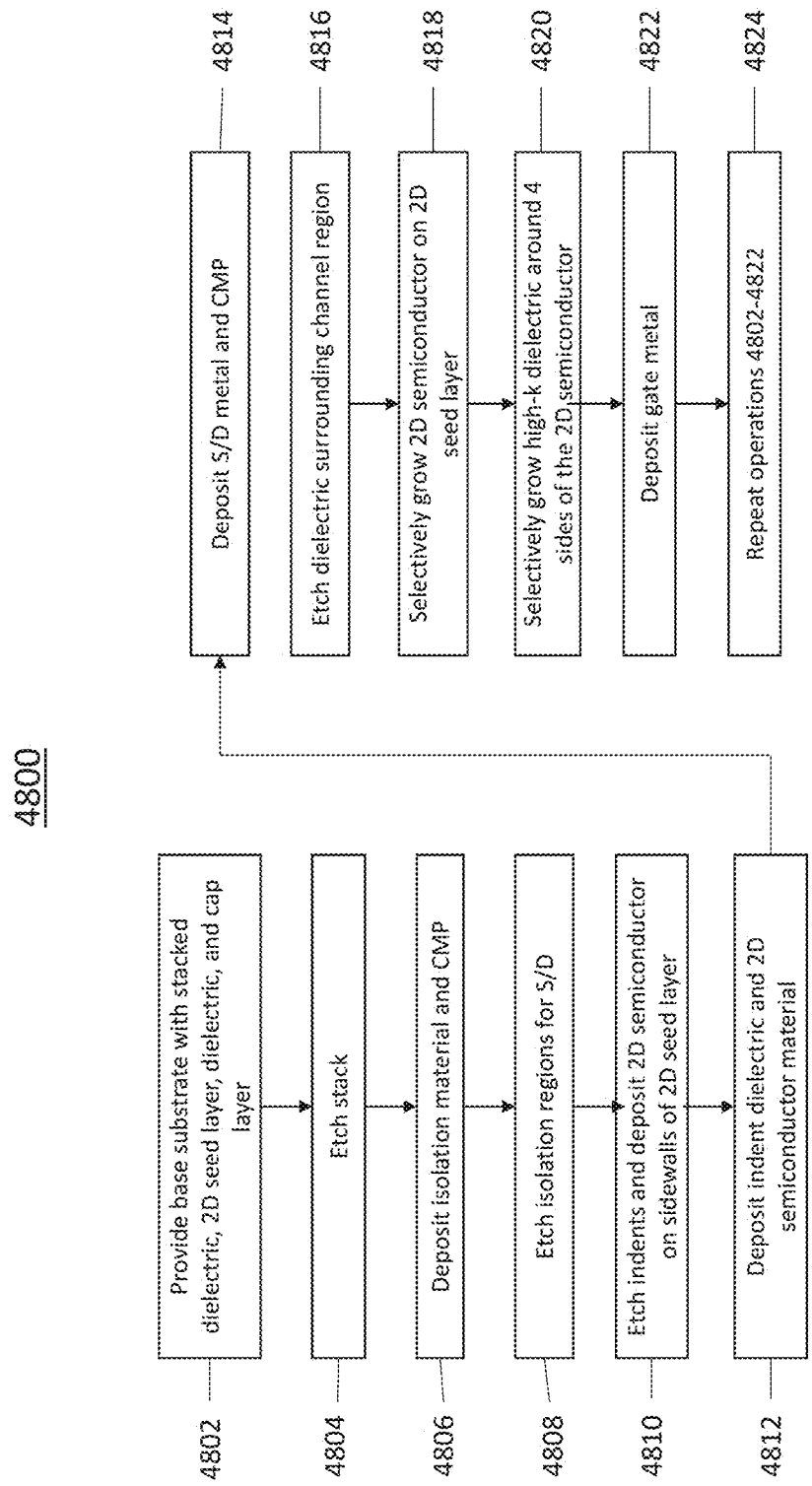
FIG. 48 illustrates a flowchart of a process for forming an example semiconductor device, in accordance with some embodiments.

FIG. 48 illustrates a flowchart of a process 4800 for forming an example semiconductor device (e.g., transistor) 4900, in accordance with some embodiments. The resulting semiconductor device 4900 may include a gate-all-around transistor that has a gate metal an all four sides around a semiconductor and gate dielectric. It is noted that the process 4800 is merely an example, and is not intended to limit the present disclosure. Accordingly, it is understood that additional operations may be provided before, during, and after the process 4800 of FIG. 48 and that some other operations may only be briefly described herein. In some embodiments, operations of the process 4800 may be associated with perspective and/or top views of an example semiconductor device at various fabrication stages as shown in FIGS. 49-60, respectively, which will be discussed in further detail below.

Corresponding to operation 4802, FIG. 49 illustrates a resulting side view of the semiconductor device 4900 after a stack of base substrate 4902, dielectric layer 4904a, 2D seed layer 4906, dielectric layer 4904b, and cap layer 4908 is formed. The base substrate 4902 may be a dielectric substrate (e.g., silicon nitride). The base substrate 4902 may be a semiconductor substrate, such as a bulk semiconductor, a semiconductor-on-insulator (SOI) substrate, or the like, which may be doped (e.g., with a p-type or an n-type dopant) or undoped. The base substrate 4902 may be a wafer, such as a silicon wafer. Generally, an SOI substrate which includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, power rails may be formed on an opposing side of the base substrate 4902.

The dielectric layer 4904a may include one of $SiO_2$, $SiO_xN_y$, other oxide materials, SiN, and others. The 2D seed layer 4906 may include $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, and other similar materials. The dielectric layer 4904b may be deposited on the 2D seed layer 4906. The dielectric layer 4904b may include a material that is substantially the same as the material of the dielectric layer 4904a. In some embodiments, the materials may be different. The cap layer 4908 may include any of the dielectric materials discussed with respect to dielectric layer 115. The dielectric layers 4904a and 4904b, the 2D seed layer 4906, and the cap layer 4908 may be deposited using similar methods as described with respect to semiconductor device 200. Accordingly, repeated descriptions are omitted for simplicity and clarity. After the cap layer 4908 is formed, a top surface of the dielectric cap layer 180 may be polished using, e.g., CMP.

Figure 50:
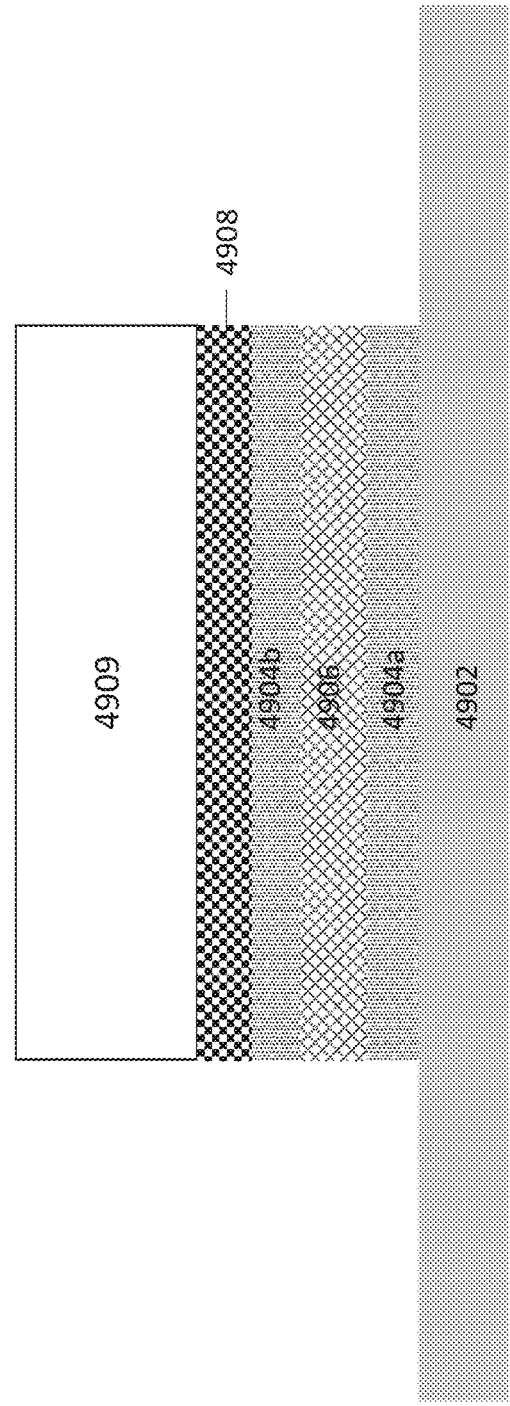

Corresponding to operation 4804, FIG. 50 illustrates a resulting side view of the semiconductor device 4900 after etching the dielectric layers 4904a and 4904b, the 2D seed layer 4906, and the cap layer 4908. The etching may be performed using a patterned mask layer 4909. The remaining portions may define a channel region for a transistor.

Figure 51:
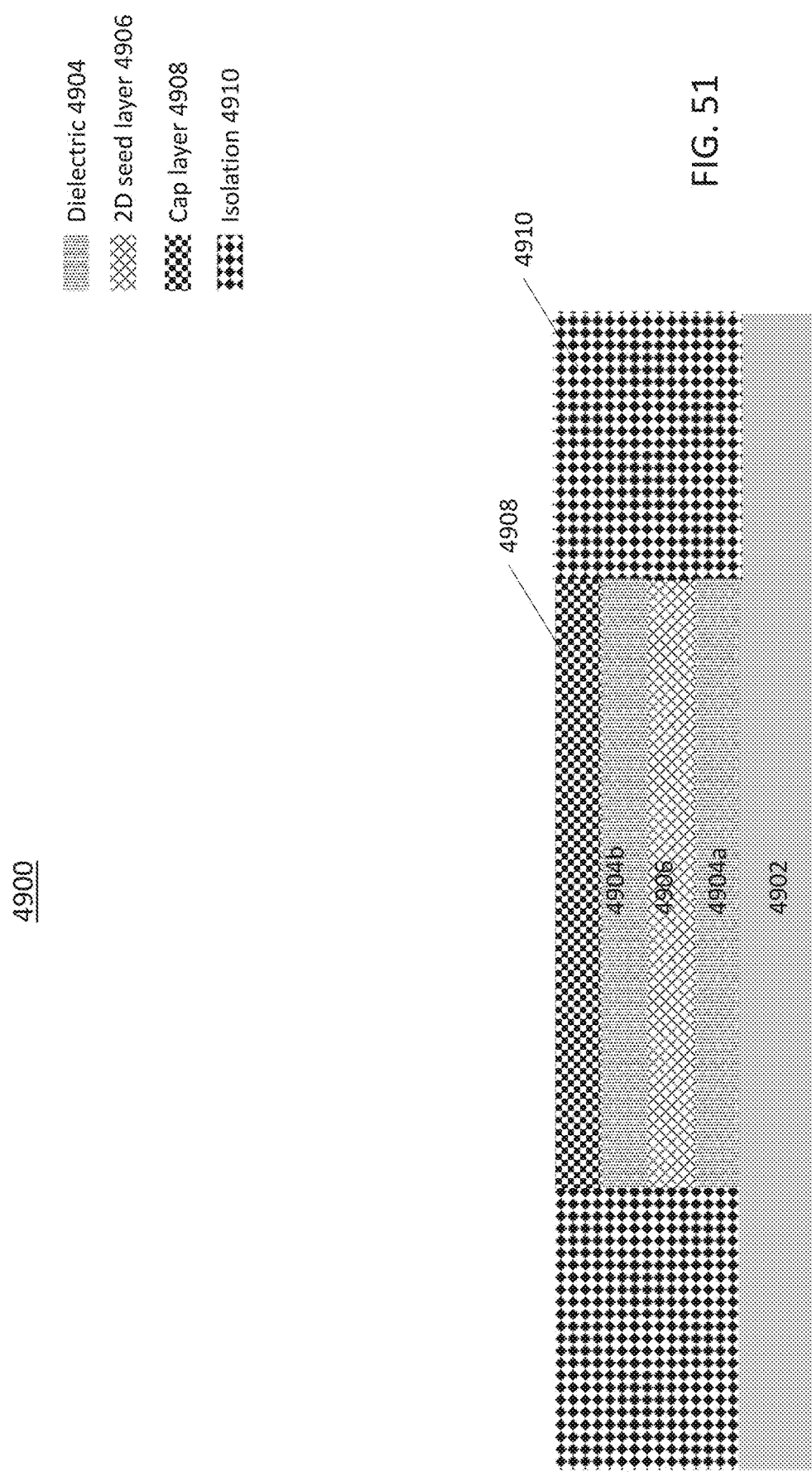

Corresponding to operation 4806, FIG. 51 illustrates a resulting side view of the semiconductor device 4900 after forming an isolation region 4910. The isolation region 4910 may separate the transistor from other electronic devices formed in the semiconductor device 4900. The isolation region 4910 include any of the dielectric materials described in this disclosure. The resulting structure may be polished via, e.g., CMP.

Figure 52:
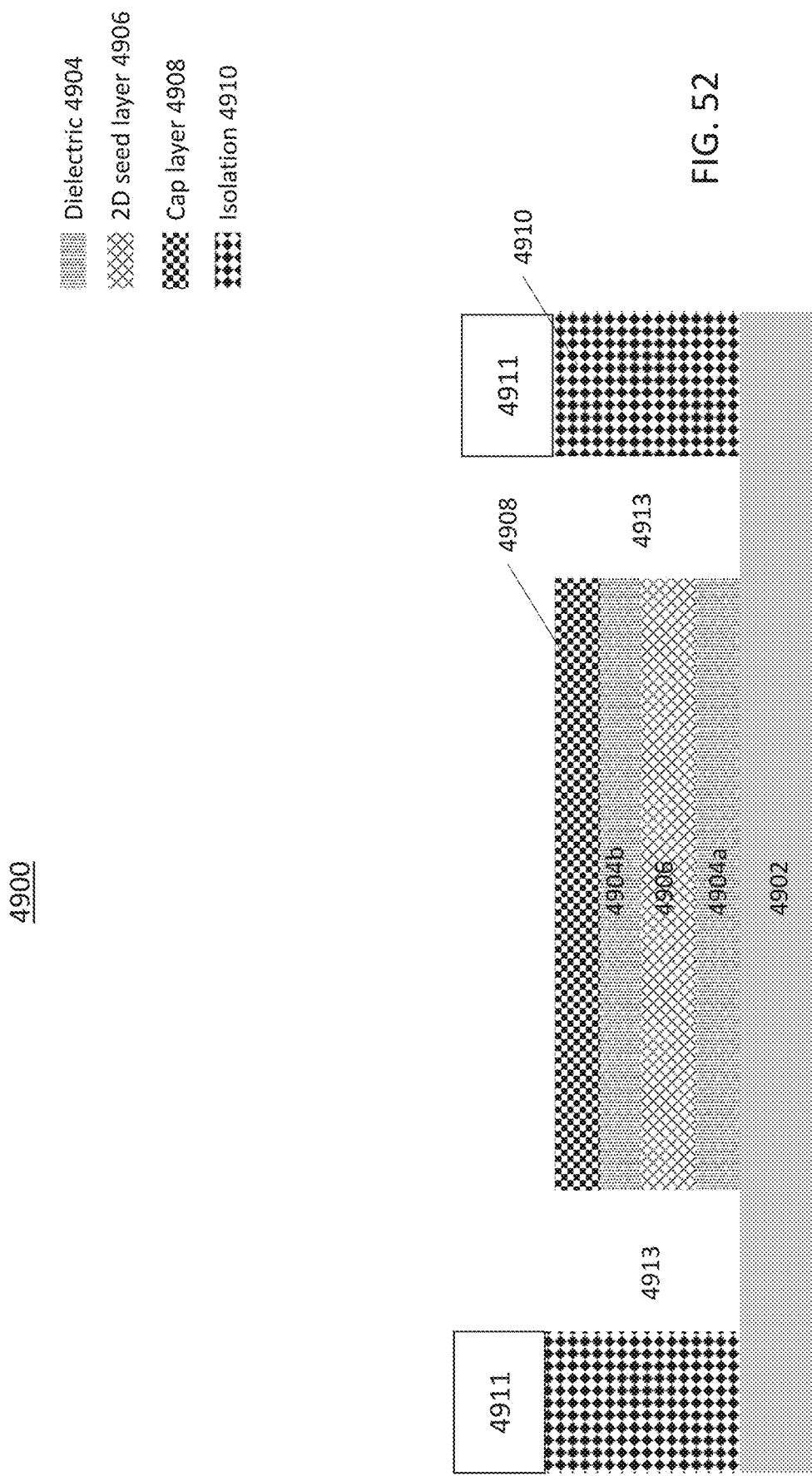

Corresponding to operation 4808, FIG. 52 illustrates a resulting side view of the semiconductor device 4900 after etching a portion of the isolation region 4910. A patterned mask layer 4911 may be used to etch the layers and create trenches (or cavities) 4913. Edges or sidewalls of the dielectric layers 4904a and 4904b, 2D seed layer 4906, and the cap layer 4908 may be exposed on one end of the trenches 4913 and the isolation region 4910 may be exposed on another end of the trenches 4913. The trenches 4913 may be used to define S/D regions of the transistor.

Corresponding to operation 4810, FIG. 53 illustrates a resulting side view of the semiconductor device 4900 after forming a 2D semiconductor layer 4914 on portions of the 2D seed layer 4906. Several steps may be included in operation 4810. 2D semiconductor layer 4914 may include, but is not limited to, $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, and other similar materials. For example, end portions of the dielectric layers 4904a and 4904b may be etched such that indents are formed. The resulting indents may expose several surfaces of the 2D seed layer 4906. For example, by etching the dielectric layers 4904a and 4904b, portions of top and bottom surfaces on both ends of the 2D seed layer 4906 may be exposed. For the etched dielectric layer 4904a, portions of the bottom surface of the cap layer 4908 and portions of the top surface of the 2D seed layer 4906 may be exposed. For the etched dielectric layer 4904b, portions of the bottom surface of the 2D seed layer 4906 and portions of the top surface of the base layer 4902 may be exposed. Following the formation of the indents, the 2D semiconductor layer 4914 may be formed by a selective deposition (e.g., selective ALD, CVD, PVD, evaporation, electrodeposition, sputtering, plasma-enhanced techniques, etc.) or through epitaxial growth using the 2D seed layer 4906 as a seed. Alternatively stated, the 2D semiconductor layer 4914 can inherit a footprint or profile collectively defined by the 2D seed layer 4906.

Figure 54:
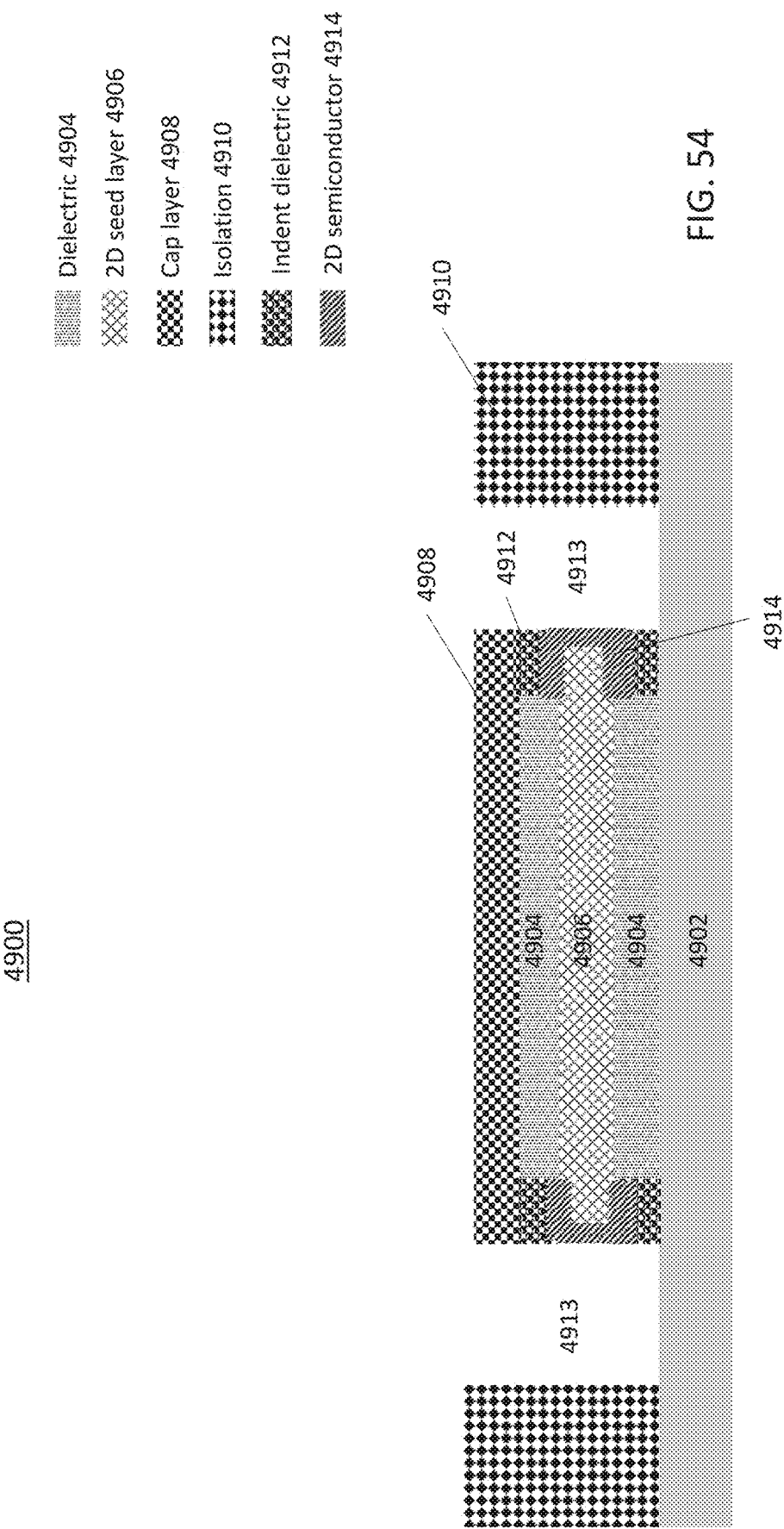

Corresponding to operation 4812, FIG. 54 illustrates a resulting side view of the semiconductor device 4900 after forming a 2D semiconductor layer 4914 on portions of the 2D seed layer 4906. An indent dielectric 4912 may be deposited on the exposed bottom surfaces of the cap layer 4908 and the exposed top surfaces of the base layer 4902. The indent dielectric 4912 may include any material used for dielectrics within this disclosure. After depositing the indent dielectric layer 4912, the semiconductor device 4900 may be etched again so that the indent dielectric layer 4912 is flush against ends of the seed layer 4906 and the cap layer 4908. Following the formation of the indent dielectric layer 4912, the 2D semiconductor layer 4914 may be grown or deposited on side surfaces of the 2D seed layer 4906. Accordingly, the 2D semiconductor layer 4914 may be formed to have a "C" shape around the exposed surfaces of the 2D seed layer. Another etch may be performed to cause the 2D semiconductor layer 4914 to be flush with ends of the cap layer 4908 and the indent dielectric 4912.

Figure 55:
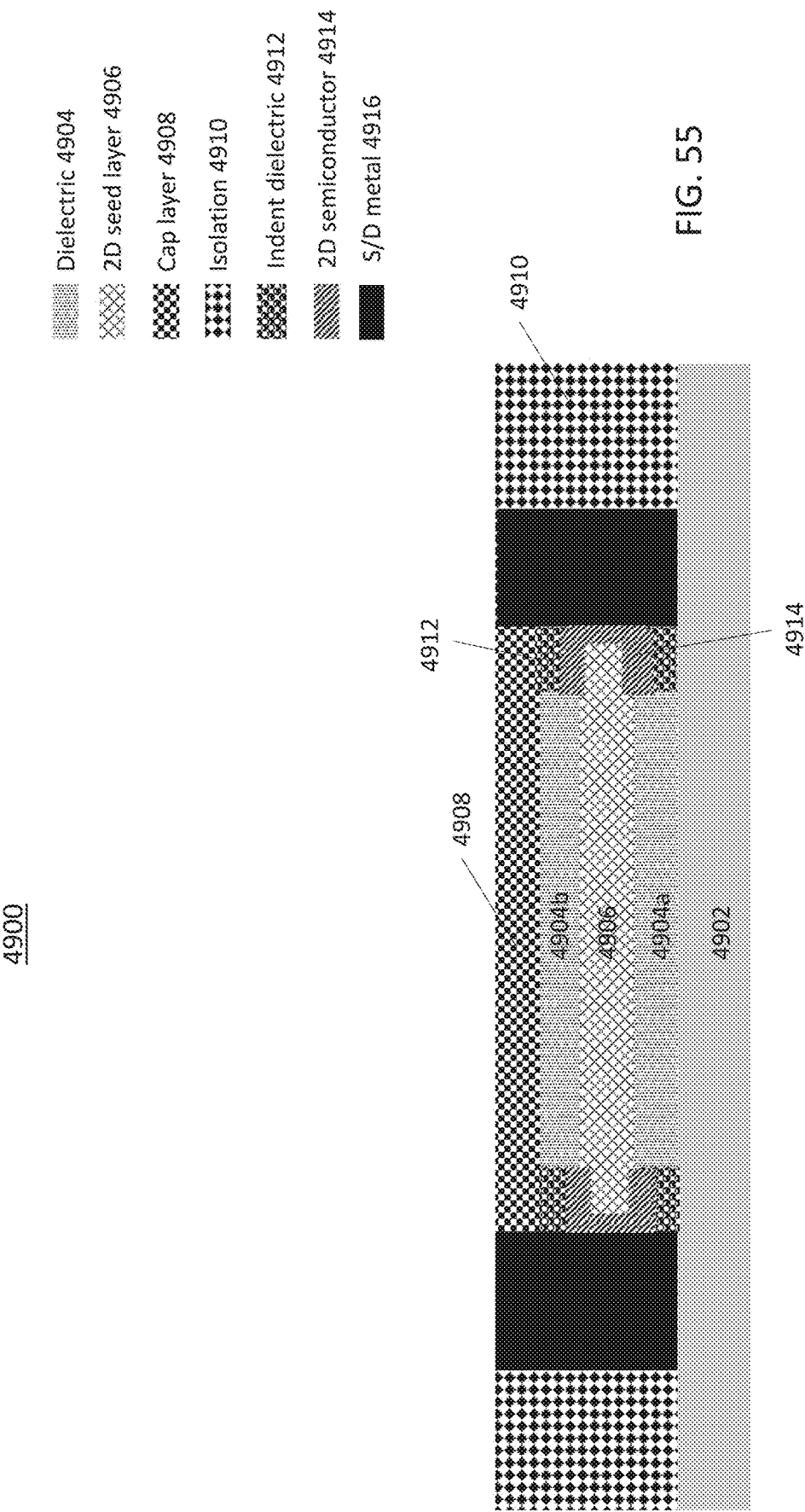

Corresponding to operation 4814, FIG. 55 illustrates a resulting side view of the semiconductor device 4900 after S/D metal structures 4916 are formed. The S/D metal structures 4916 may be any type of conductive metal suitable to form a source or drain electrode in the semiconductor device 4900, including copper, gold, silver, platinum, nickel, tungsten, ruthenium, or other types of conductive metals or alloys. After the conductive material is deposited, a top surface may be polished via, e.g., CMP. The S/D metal structures 4916 may function as a source and/or drain of the transistor.

Figure 56:
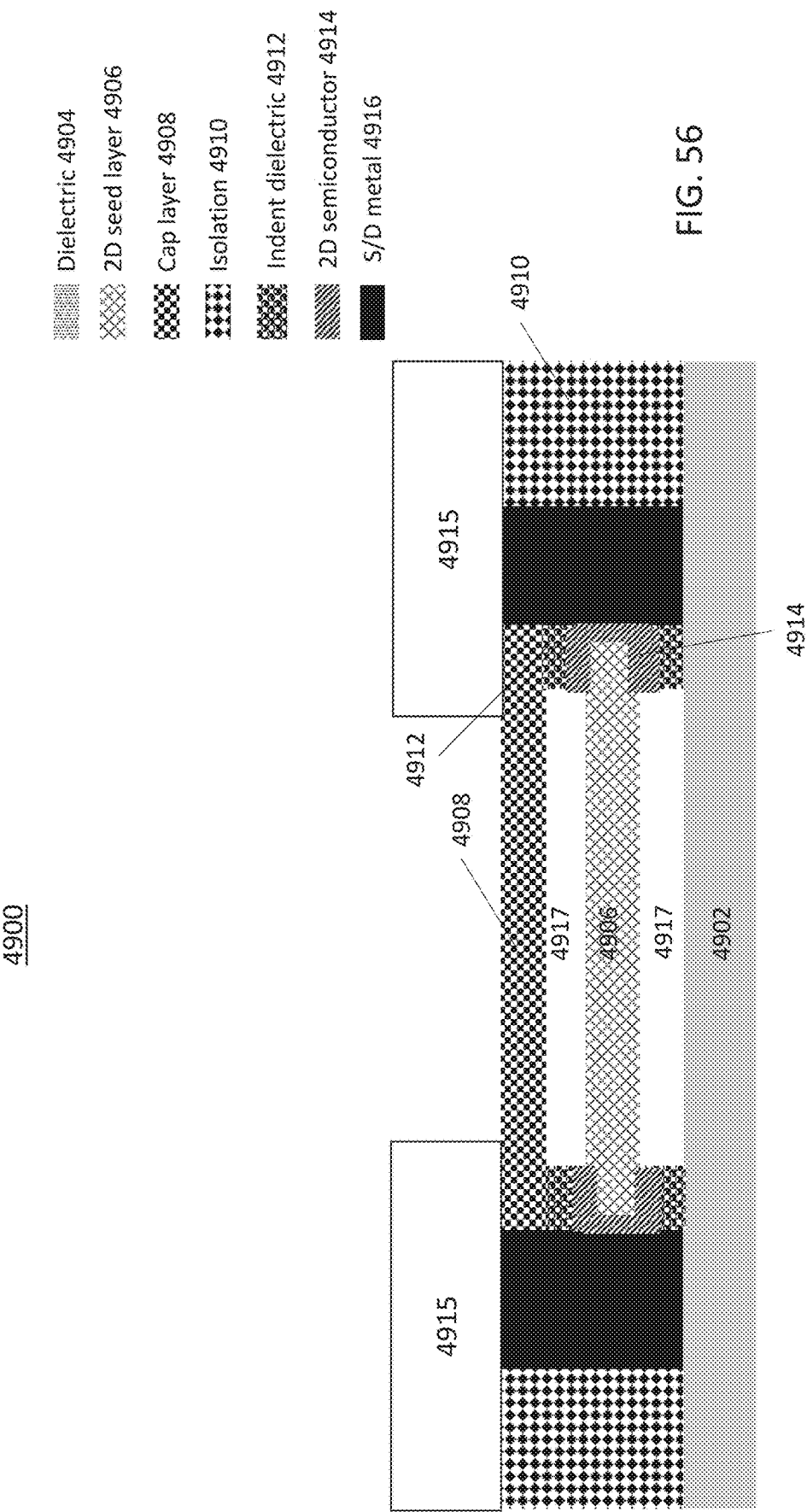

Corresponding to operation 4816, FIG. 56 illustrates a resulting side view of the semiconductor device 4900 after creating cavities 4917 above and below exposed portions of the 2D seed layer 4906. The cavities 4917 may be later filled with a semiconductor layer, a gate dielectric around the semiconductor layer and a gate metal around the gate dielectric. An insulating layer may additionally be formed on the gate metal. Accordingly, a GAA transistor may be formed.

Figure 57:
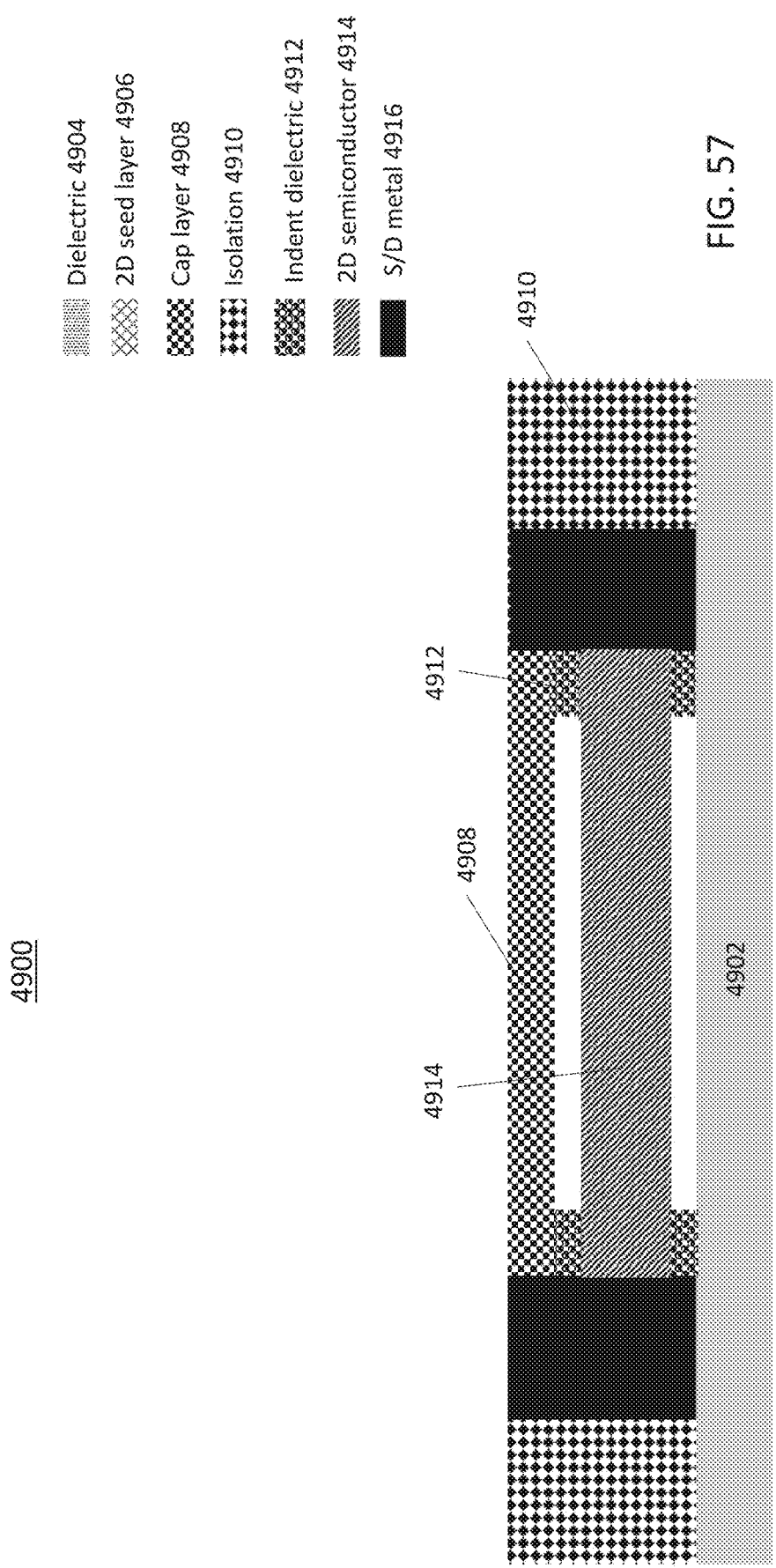

Corresponding to operation 4818, FIG. 57 illustrates a resulting side view of the semiconductor device 4900 after 2D semiconductor layer 4914 is formed. The 2D semiconductor layer 4914 may be formed around the 2D seed layer 4906 via deposition or growth as discussed in this disclosure. Some example 2D semiconductor materials for use in forming the channel include, but are not limited to, $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, and other similar materials. The 2D semiconductor layer 4914 may function as a channel for the transistor.

Figure 58:
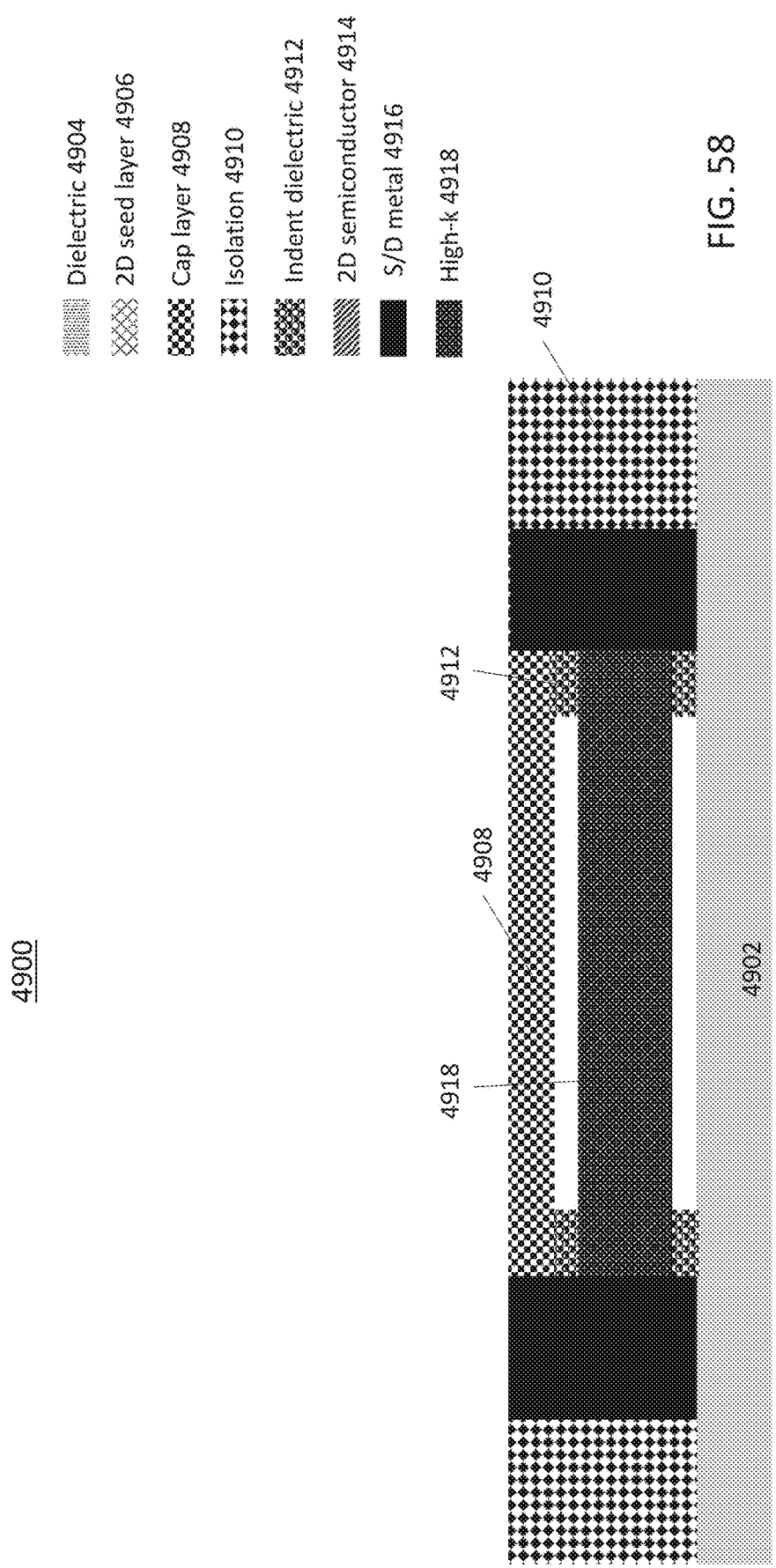

Corresponding to operation 4820, FIG. 58 illustrates a resulting side view of the semiconductor device 4900 after a high-k dielectric layer 4918 is formed. The high-k dielectric layer 4918 may be formed by annealing the semiconductor device 4900 at low temperatures to create an oxide around the 2D semiconductor layer 4914, as discussed within this disclosure. The high-k dielectric layer 4918 can be any type of material that has a relatively large dielectric constant (e.g., having a dielectric constant greater than 3.9). Accordingly, the high-k dielectric may function as a gate dielectric for the transistor.

Figure 59:
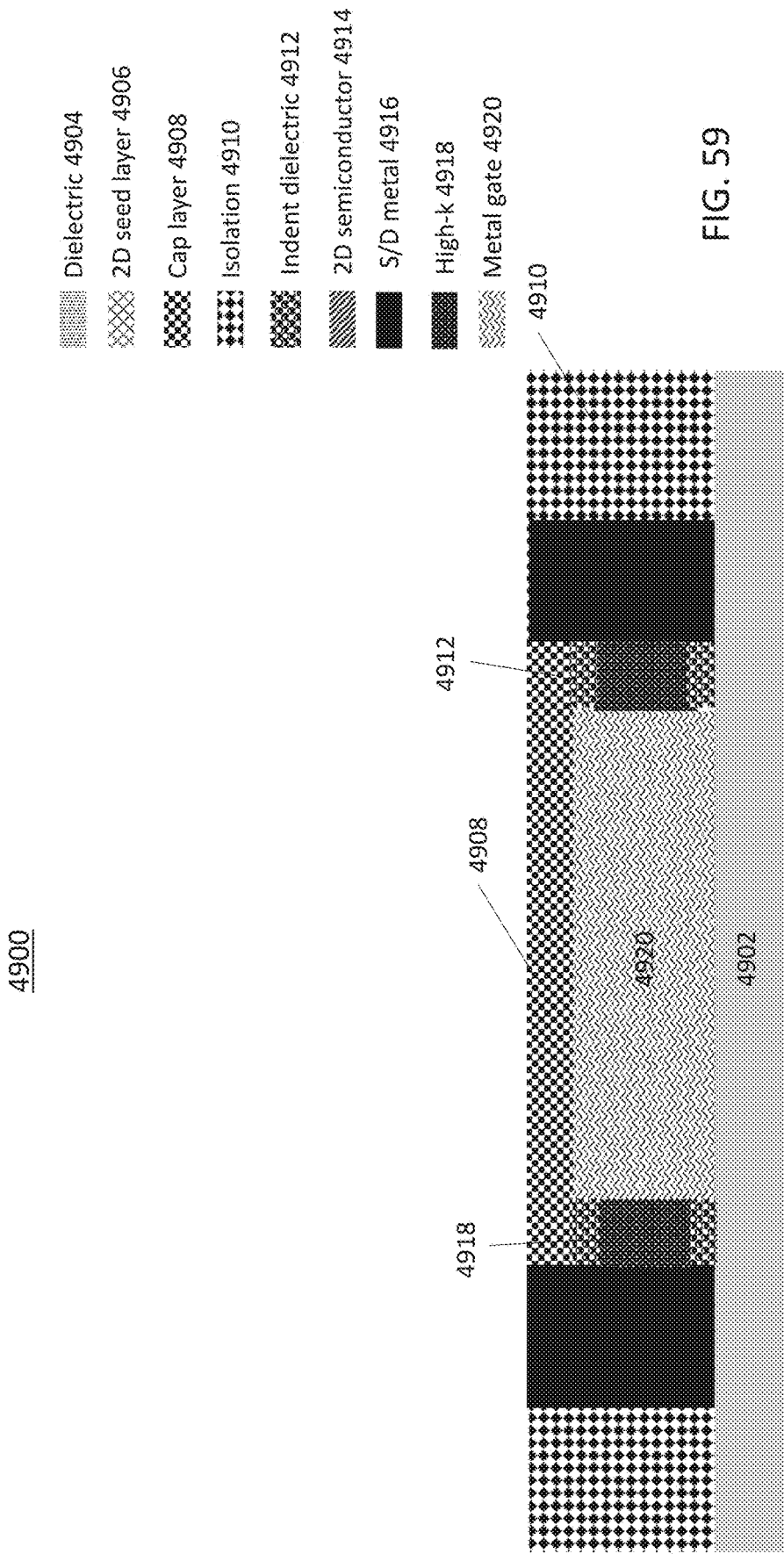

Corresponding to operation 4822, FIG. 59 illustrates a resulting side view of the semiconductor device 4900 after a gate metal structure 4920 is formed. The gate metal structure 4920 may be deposited using one of the methods discussed in this disclosure. The gate metal structure 4920 may function as a gate for the transistor.

Figure 60:
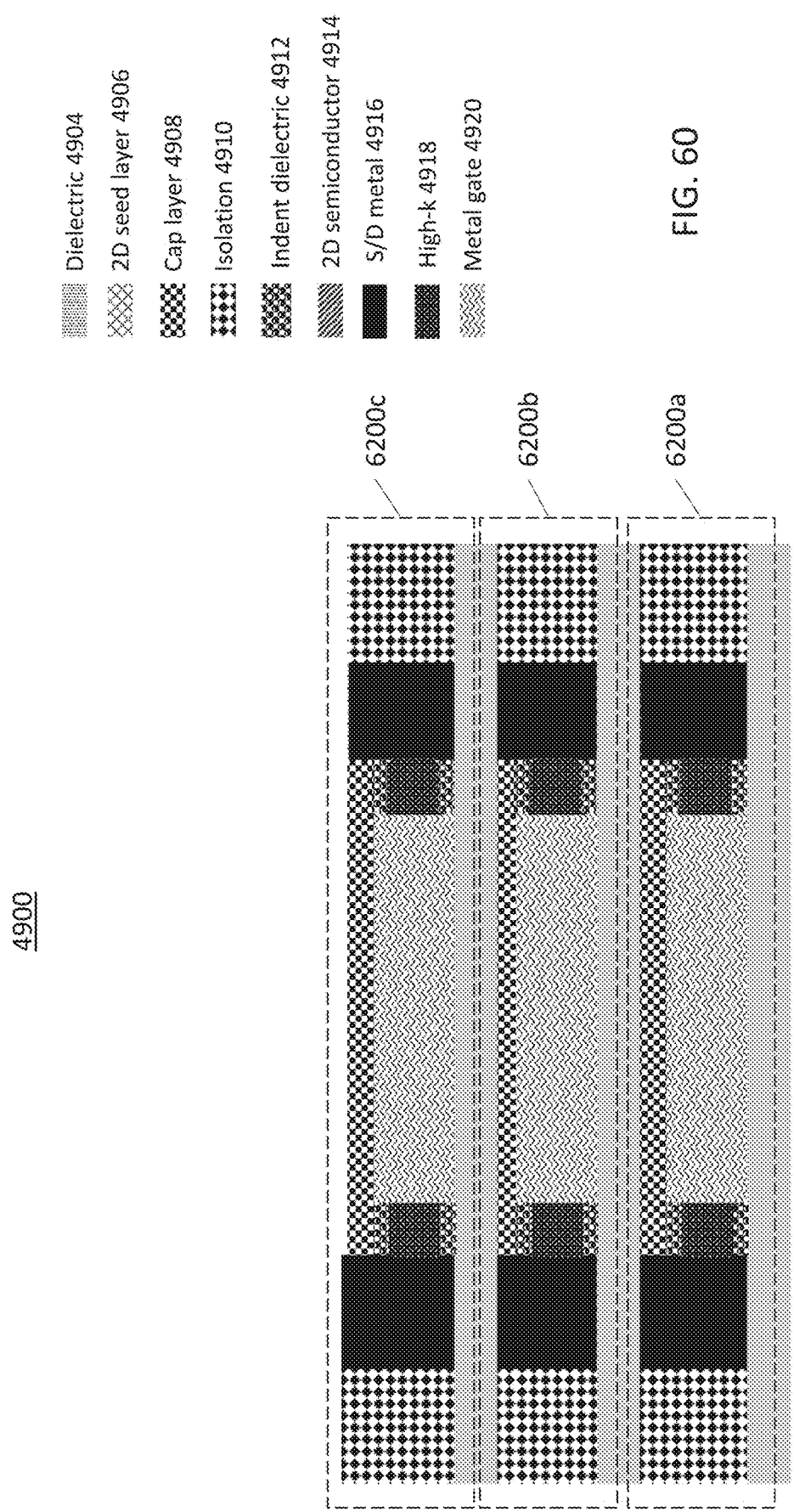

Corresponding to operation 4824, FIG. 60 illustrates a resulting side view of the semiconductor device 4900 after repeating operations 4802-4822 to form a stack of transistors. As a result three GAA transistors may be formed stacked on top of one another. For example, a first transistor 6200*a* may be formed by performing operations 4802-4822 once, a second transistor 6200*b* may be formed by performing operations 4802-4822 a second time, and a third transistor 6200*c* may be formed by performing operations 4802-4822 a third time. Accordingly, a stack of GAA transistors may be formed.

FIG. 61 illustrates a flowchart of a process 6100 for forming an example semiconductor device (e.g., transistor), in accordance with some embodiments. The process 6100 includes operation 6102 of forming a seed structure (e.g., 2D seed layers 120, 1506, 3406, or 4906) on a base layer (e.g., base layer 110, 1502, 3402, or 4902). The process 6100 includes operation 6104 of forming a 2D semiconductor layer (e.g., 2D semiconductor layer 150, 1508, 3410, or 4914) disposed e seed structure (e.g., as in processes 100 or 1400), sidewalls of the seed structure (e.g., as in process 3300), or a bottom surface of the seed structure (e.g., as in process 4800). The process 6100 includes operation 6106 of selectively growing a high-k dielectric layer (e.g., high-k dielectric layers 160, 1510, 3416, or 4918) on the 2D semiconductor layer.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated.

The various aspects and embodiments disclosed are for purposes of illustration and are not intended to be limiting, with the true scope and spirit being indicated by the following claims.

What is claimed is:

1. A method for manufacturing a semiconductor device, comprising:
    forming a seed structure on a base layer;
    depositing an isolation material over the base layer to laterally surround the seed structure;
    polishing the seed structure and the isolation material;
    etching a portion of the isolation material to expose sidewalls of the seed structure;
    forming source/drain metal structures extending along the sidewalls of the seed structure, respectively;
    forming a two-dimensional (2D) semiconductor layer from at least the seed structure, wherein the 2D semiconductor layer is formed on a top surface of the seed structure and a top surface of each of the source/drain metal structures; and
    forming a high-k dielectric layer on the 2D semiconductor layer.

2. The method of claim 1, wherein the high-k dielectric layer is selectively grown on the top surface of the seed structure and the top surface of each of the source/drain metal structures.

3. The method of claim 2, further comprising forming a gate structure on the high-k dielectric layer, wherein the gate structure extends to be at least partially above the source/drain metal structures.

4. The method of claim 1, prior to forming the seed structure, further comprising:
    forming a dielectric layer over the base layer; and
    forming a layer over the dielectric layer, wherein the layer includes at least one of: $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $HfSe_2$, $ZrSe_2$, or $HfZrSe_2$.

5. The method of claim 4, further comprising:
    patterning the layer to form the seed structure that extends away from the dielectric layer.

6. The method of claim 4, wherein the layer includes a stack of 2D seed layers.

7. The method of claim 1, wherein, after exposing the sidewalls of the seed structure, a remaining portion of the isolation material remains laterally surrounding the seed structure.

8. The method of claim 1, wherein the source/drain metal structures are formed by depositing a metal material into trenches that expose the sidewalls of the seed structure, respectively.

9. The method of claim 8, wherein the metal material includes at least one of: copper, gold, silver, platinum, nickel, tungsten, ruthenium, or other types of conductive metals or alloys.

10. A method for manufacturing a semiconductor device, comprising:
    forming a seed structure over a base layer;
    depositing an isolation material over the base layer to laterally surround the seed structure;
    polishing the seed structure and the isolation material;
    etching a portion of the isolation material to expose sidewalls of the seed structure;
    forming a two-dimensional (2D) semiconductor layer from at least the seed structure;
    forming a high-k dielectric layer disposed at least over the 2D semiconductor layer; and
    forming a gate structure disposed at least over the high-k dielectric layer.

11. The method of claim 10, wherein forming the 2D semiconductor layer further comprises forming the 2D semiconductor layer on a top surface of the seed structure and a top surface of each of a pair of source/drain metal structures that respectively extend along the exposed sidewalls of the seed structure.

12. The method of claim 10, prior to forming the seed structure, further comprising:
    forming a dielectric layer over the base layer; and
    forming a layer over the dielectric layer, wherein the layer includes at least one of: $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $HfSe_2$, $ZrSe_2$, or $HfZrSe_2$.

13. The method of claim 12, further comprising:
    patterning the layer to form the seed structure that extends away from the dielectric layer.

14. The method of claim 12, wherein the layer includes a stack of 2D seed layers.

15. A method for manufacturing a semiconductor device, comprising:
    forming a dielectric layer over a base layer;
    forming a seed structure over the dielectric layer;
    depositing an isolation material over the dielectric layer to laterally surround the seed structure;
    polishing the seed structure and the isolation material;
    exposing sidewalls of the seed structure by etching a portion of the isolation material;
    forming source/drain metal structures extending along the sidewalls of the seed structure, respectively;
    forming a two-dimensional (2D) semiconductor layer from the seed structure and the source/drain metal structures;
    forming a high-k dielectric layer disposed at least over the 2D semiconductor layer; and
    forming a gate structure disposed at least over the high-k dielectric layer.

16. The method of claim 15, wherein the high-k dielectric layer is self-aligned with the 2D semiconductor layer.

17. The method of claim 15, wherein the source/drain metal structures are formed of a metal material, and wherein the metal material includes at least one of: copper, gold, silver, platinum, nickel, tungsten, ruthenium, or other types of conductive metals or alloys.

* * * * *